United States Patent
Toh et al.

(10) Patent No.: US 11,094,696 B2
(45) Date of Patent: Aug. 17, 2021

(54) METHODS OF FORMING A THYRISTOR-BASED RANDOM ACCESS MEMORY USING FIN STRUCTURES AND ELEVATED LAYERS

(71) Applicant: GLOBALFOUNDRIES Singapore Pte. Ltd., Singapore (SG)

(72) Inventors: Eng Huat Toh, Singapore (SG); Shyue Seng Tan, Singapore (SG); Elgin Kiok Boone Quek, Singapore (SG); Danny Pak-Chum Shum, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 54 days.

(21) Appl. No.: 16/217,064

(22) Filed: Dec. 12, 2018

(65) Prior Publication Data

US 2019/0115350 A1    Apr. 18, 2019

Related U.S. Application Data

(62) Division of application No. 14/277,068, filed on May 14, 2014, now abandoned.

(51) Int. Cl.
| | |
|---|---|
| *H01L 29/74* | (2006.01) |
| *H01L 27/102* | (2006.01) |
| *G11C 11/39* | (2006.01) |
| *H01L 29/66* | (2006.01) |

(52) U.S. Cl.
CPC .......... *H01L 27/1027* (2013.01); *G11C 11/39* (2013.01); *H01L 29/66363* (2013.01); *H01L 29/74* (2013.01)

(58) Field of Classification Search
CPC .......... H01L 27/1027; H01L 29/66363; H01L 27/66363; H01L 27/74
See application file for complete search history.

(56) References Cited

U.S. PATENT DOCUMENTS

| | | | |
|---|---|---|---|
| 4,462,040 | A | 7/1984 | Ho et al. |
| 5,574,299 | A | 11/1996 | Kim |
| 5,879,971 | A | 3/1999 | Witek |
| 6,229,161 | B1 | 5/2001 | Nemati et al. |
| 6,492,662 | B2 | 12/2002 | Hsu et al. |
| 6,534,352 | B1 | 3/2003 | Kim |
| 6,627,924 | B2 | 9/2003 | Hsu et al. |
| 6,815,734 | B1 | 11/2004 | Horch et al. |
| 7,026,691 | B1 | 4/2006 | Sander et al. |

(Continued)

OTHER PUBLICATIONS

R. Gupta et al., "32nm high-density high-speed T-RAM embedded memory technology," 2010 International Electron Devices Meeting, San Francisco, CA, 2010, pp. 12.1.1-12.1.4.

*Primary Examiner* — Anh D Mai
(74) *Attorney, Agent, or Firm* — Thompson Hine LLP

(57) ABSTRACT

Devices and methods for forming a device are presented. The device includes a substrate having a well of a first polarity type and a thyristor-based memory cell. The thyristor-based memory cell includes at least a first region of a second polarity type adjacent to the well, a gate which serves as a second word line disposed on the substrate, at least a first layer of the first polarity type disposed adjacent to the first region of the second polarity type and adjacent to the gate, and at least a heavily doped first layer of the second polarity type disposed on the first layer of the first polarity type and adjacent to the gate. At least the heavily doped first layer of the second polarity type is self-aligned with side of the gate.

11 Claims, 34 Drawing Sheets

(56) References Cited

U.S. PATENT DOCUMENTS

| | | |
|---|---|---|
| 7,456,439 B1 | 11/2008 | Horch |
| 8,748,934 B2 | 6/2014 | Pan et al. |
| 9,287,269 B2 | 3/2016 | Toh et al. |
| 9,691,465 B2 | 6/2017 | Nemati et al. |
| 2001/0024841 A1 | 9/2001 | Noble, Jr. et al. |
| 2001/0033000 A1 | 10/2001 | Mistry |
| 2002/0151130 A1 | 10/2002 | Hsu et al. |
| 2010/0151669 A1 | 6/2010 | Lindert et al. |
| 2013/0140601 A1 | 6/2013 | Mouli |

METHODS OF FORMING A THYRISTOR-BASED RANDOM ACCESS MEMORY USING FIN STRUCTURES AND ELEVATED LAYERS

CROSS-REFERENCE TO RELATED APPLICATIONS

This application is a divisional application of U.S. application Ser. No. 14/277,068, filed May 14, 2014 (now abandoned), which is herein incorporated by reference in its entirety for all purposes.

BACKGROUND

Volatile memory systems, such as random-access memory (RAM), are widely used as a form of primary data storage in computer memories. Volatile memory devices perform read and write operations quickly, allowing fast access to transiently stored data when the memory devices are powered. The stored data is lost when the devices are not powered. Presently, volatile memory devices are utilized in a wide range of applications including, for example, mobile phones, digital cameras, personal computers, and other applications where permanent data storage is not required or when fast data manipulation is desired. Typical volatile memory devices include, for example, Static RAM (SRAM) and Dynamic RAM (DRAM). Volatile memory devices are widely implemented in the form of embedded memory.

In recent years, various types of memory cells, storage mediums and program-and-read technologies have been developed. For instance, thyristor random access memory (T-RAM) is a new type of DRAM memory, combining the strengths of DRAM and SRAM to achieve high density and high speed. This technology, which exploits the electrical property known as negative differential resistance and is called thin capacitively-coupled thyristor, is used to create memory cells capable of very high packing densities. Other benefits of T-RAM include, but not limited to, manufacturing process compatible with existing logic process, low operating voltage (e.g., approximately 1.5V), high $I_{on}/I_{off}$ ratio (e.g., in the order of $10^8$), fast read/write speed (e.g., approximately 1 ns) and good retention rate (e.g., approximately 10 ms or greater than 256 ms).

On the other hand, there are issues and drawbacks associated with existing designs of T-RAM and existing manufacturing methods thereof. For example, in existing designs, the n-type base, silicide block and heavily doped p-type base are not self-aligned. Ion implantation is performed after silicide block formation. The cost of forming silicon-on-insulator (SOI) substrate is high. Besides, there remains a need for lower operating voltage, longer refresh time and smaller cell size.

Accordingly, there remains a need for a new design of T-RAM based memory devices, and a manufacturing method thereof, to address the aforementioned issues.

SUMMARY

Embodiments generally relate to memory devices and manufacturing methods thereof. In one embodiment, a device is disclosed. The device includes a substrate having a well of a first polarity type and a thyristor-based memory cell. The thyristor-based memory cell includes at least a first region of a second polarity type adjacent to the well, a gate which serves as a second word line disposed on the substrate, at least a first layer of the first polarity type disposed adjacent to the first region of the second polarity type and adjacent to the gate, and at least a heavily doped first layer of the second polarity type disposed on the first layer of the first polarity type and adjacent to the gate. At least the heavily doped first layer of the second polarity type is self-aligned with side of the gate.

In another embodiment, a method of forming a device is disclosed. A substrate having a well of a first polarity type is provided. The method includes forming a thyristor-based memory cell. The thyristor-based memory cell is formed by forming at least a first region of a second polarity type adjacent to the well, forming a gate on the substrate, forming at least a first layer of the first polarity type adjacent to the first region of the second polarity type and adjacent to the gate, and forming at least a heavily doped first layer of the second polarity type on the first layer of the first polarity type and adjacent to the gate. The gate serves as a second word line and at least the heavily doped first layer of the second polarity type is self-aligned with side of the gate.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the present disclosure. In the following description, various embodiments of the present disclosure are described with reference to the following drawings, in which.

DETAILED DESCRIPTION

Embodiments generally relate to memory devices and manufacturing methods thereof. A memory device according to the present disclosure includes a T-RAM having a thyristor structure built on or integrated with complementary metal oxide semiconductor (CMOS) processing, with at least self-aligned first polarity type base and self-aligned elevated heavily doped second polarity type emitter layer of the anode portion of the thyristor structure. For illustration purpose, the first polarity type, for example, may be referred to as n-type while the second polarity type, for example, may be referred to as p-type. However, it is understood that modifications may be made such that the first polarity type, for example, may be referred to as p-type while the second polarity type, for example, may be referred to as n-type. The memory device according to the present disclosure offers a number of novel features vis-à-vis existing designs of memory devices. Firstly, a memory device according to the present disclosure is compact in size. Secondly, several features of a memory device according to the present disclosure are self-aligned. Thirdly, a memory device according to the present disclosure achieves better performance in terms of lower operating voltage, faster read/write operation, and better retention. Fourthly, a symmetrical two-bits-per-cell structure may be achieved. Moreover, the process of manufacturing the memory device according to the present disclosure is compatible with logic technology.

Figure 1A:
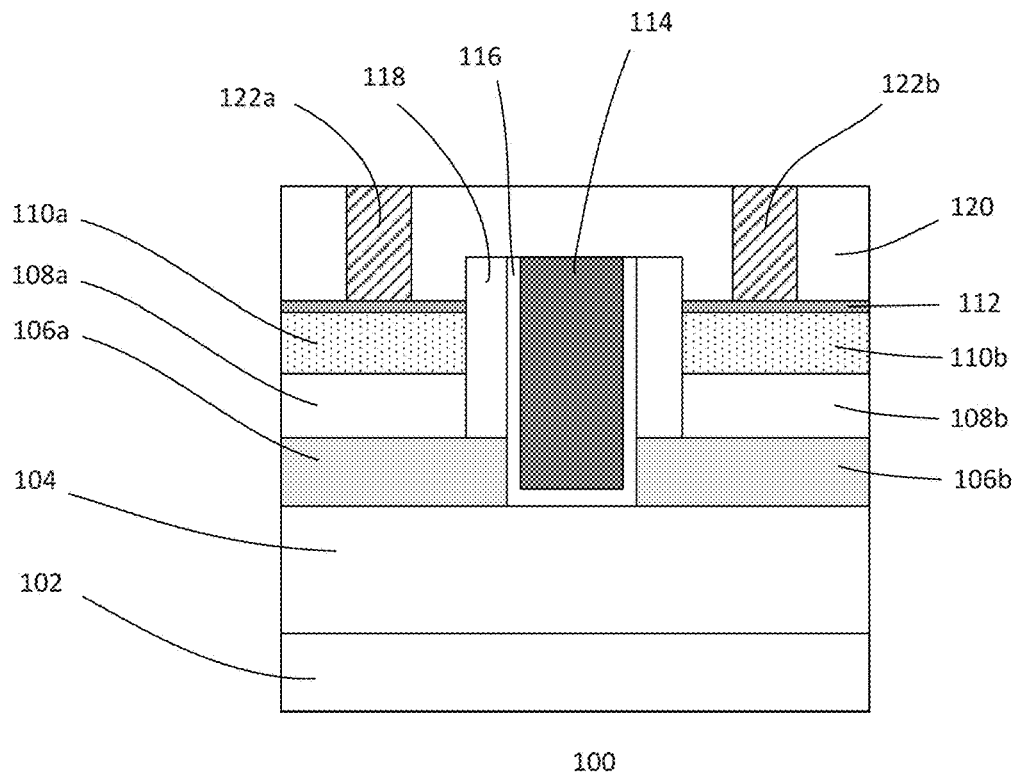
FIGS. 1a-1b show cross-sectional views of various embodiments of a device.

FIG. 1a shows a cross-sectional view of a device 100 in accordance with one embodiment of the present disclosure. The device 100, in one embodiment, includes a 2 T-RAM structure or two-bits-per-cell structure. The device 100 includes first and second thyristor structures built on or integrated with features formed by CMOS processing. The device 100 includes a substrate 102. The substrate, for example, is a semiconductor substrate, such as a silicon substrate. In one embodiment, the substrate is a p-type doped substrate. For example, the p-type doped substrate is a lightly doped p-type substrate. Other types of semiconductor substrates may also be useful. For example, semiconductor substrates such as silicon germanium, gallium or gallium arsenide may also be useful.

The substrate includes a device region. The device region, for example, is surrounded by an isolation region (not shown). The isolation region may be used to separate the device region from other device regions on the substrate (not shown). The isolation region, for example, is a shallow trench isolation (STI) region. Other types of isolation regions may also be employed.

A well 104 of a first polarity type is disposed in the substrate 102. The dopant concentration of the well 104 may be about, for example, $10^{16}$ cm$^{-3}$ to $10^{18}$ cm$^{-3}$. Other suitable dopant concentrations may also be useful. In one embodiment, the first polarity type is n-type and the second polarity type is p-type. In such case, the well 104 is an n-type well or a deep n-type well (DNW), and the substrate 102 is a p-type substrate. The device includes a first region 106a of the second polarity type formed in the substrate 102 and over the well 104, a second region 106b of the second polarity type formed in the substrate 102 and over the well 104, and a gate of disposed on the substrate 102 and disposed between the first and second regions of the second polarity type 106a/106b. The dopant concentration of the first and second regions of the second polarity type 106a/106b may be about, for example, $10^{16}$ cm$^{-3}$ to $10^{18}$ cm$^{-3}$. Other suitable dopant concentrations may also be useful.

In one embodiment, the first and second regions of the second polarity type 106a/106b include band-engineered (BE) regions. In one embodiment, either or both of the first and second regions of the second polarity type 106a/106b include silicon germanium (SiGe), Si:C or Ge BE regions. Other suitable types of BE materials may also be useful. The BE region, in one embodiment, is an epitaxial BE layer.

The gate includes a gate electrode 114 and a gate dielectric 116. Spacers 118 are disposed on first and second sides of the gate. For illustration purpose, the gate is a high-k metal gate. For example, the gate electrode 114 may be a metal gate electrode, such as TaN or TiN. As for the gate dielectric layer 116, it may be a high-k gate dielectric, such as HfSiON, SiON or HfO$_2$. Other suitable types of gate electrode and gate dielectric materials may also be useful. For example, the gate electrode 114 may include polysilicon while the gate dielectric may include SiO$_2$. In some embodiments, the gate dielectric may further include a work function tuning layer. For example, La$_2$O$_3$ may be provided for an n-type device while TiN/Al/TiN may be provided for a p-type device in addition to HfSiON and/or HfO$_2$. Other suitable configurations of gates may also be useful.

As described earlier, the device is a 2 T-RAM or two-bits-per-cell structure having thyristor structures built on or integrated with CMOS processing. In one embodiment, the device includes a first thyristor structure having a first layer of the first polarity type 108a disposed on the first region of the second polarity type 106a and adjacent a first side of the gate. The first thyristor structure also includes a heavily doped first layer of the second polarity type 110a disposed on the first layer of the first polarity type 108a and adjacent the first side of the gate. The device, in one embodiment, includes a second thyristor structure having a second layer of the first polarity type 108b disposed on the second region of the second polarity type 106b and adjacent a second side of the gate which is opposite the first side of the gate. The second thyristor structure also includes a heavily doped second layer of the second polarity type 110b disposed on the second layer of the first polarity type 108b adjacent to the second side of the gate. The dopant concentration of the heavily doped first and second layers of the second polarity type 110a and 110b, for example, is about $10^{18}$ cm$^{-3}$ to $10^{20}$ cm$^{-3}$. The dopant concentration of the first and second layers of the first polarity type 108a and 108b, for example, is about $10^{17}$ cm$^{-3}$ to $10^{19}$ cm$^{-3}$. Other suitable dopant concentrations may also be useful.

The first and second layers of the first polarity type 108a/108b serve as the base while the heavily doped first and second layers of the second polarity type 110a/110b serve as the emitter of the anode portion of the respective first and second thyristor structures. The adjacent layer of the first polarity type and the layer of the heavily doped second polarity type form a p-n junction of the anode portion of the thyristor structure. Further, the first and second regions of the second polarity type 106a/106b also serve as the base while the well 104 also serves as the emitter of the cathode portion of the respective first and second thyristor structures. The adjacent layer of the second polarity type and the well form a p-n junction of the cathode portion of the thyristor structure. The well also functions as the first word line of the device while the gate 114 is configured to function as a second word line of the device and is capacitively coupled to the layers of the second polarity type 106a/106b through the gate dielectric 116.

The device 100 further includes an interlevel dielectric (ILD) layer 120 disposed over the first and second thyristor structures and the gate. The ILD layer, for example, includes an oxide layer. Other suitable types of dielectric material may also be used. Silicide contacts 112 may be formed between the ILD layer 120 and the heavily doped first and second layers of the second polarity type 110a/110b. The ILD layer 120 includes a first contact opening that is coupled to the heavily doped first layer of the second polarity type 110a of the first thyristor structure. A first electrically-conductive material is filled in the first opening of the ILD layer 120 to form the first contact 122a and configured to couple to a first bit line of the device 100. The ILD layer 120 also includes a second contact opening that is coupled to the heavily doped second layer of the second polarity type 110b of the second thyristor structure. A second electrically-conductive material is filled in the second opening of ILD layer 120 to form the second contact 122b and is coupled to a second bit line of the device 100.

As shown in FIG. 1a, the gate is a recessed gate such that a portion of the gate is extended vertically with respect to a horizontal plane toward the well 104 to be parallel with the first and second regions of the second polarity type 106a/106b with respect to the horizontal plane. Further, as described above, the first and second regions of the second polarity type 106a/106b include band-engineered (BE) regions. These features help lower the operating voltage, improve read/write speed, and further improve retention time of the memory device 100.

As shown in FIG. 1a, the device 100 includes first and second thyristor structures which enable a symmetrical two-bits-per-cell design to be achieved. The embodiment, as shown in FIG. 1a, includes two different bits in a single cell structure. Further, the device also features self-aligned and compact first polarity type layer 108a/108b and heavily doped second polarity type layer 110a/110b. This helps improve variation and achieve smaller cell size. The operation of the device 100, for example, is similar to the operation of a conventional T-RAM structure. The operation of a T-RAM structure is described in, for example, "32 nm High-density High-speed T-RAM Embedded Memory Technology", Gupta et al., Electron Devices Meeting (IEDM), 2010 IEEE International, 2010, pp. 12.1.1-12.1.4, which is incorporated herein by reference for all purposes.

Figure 1B:
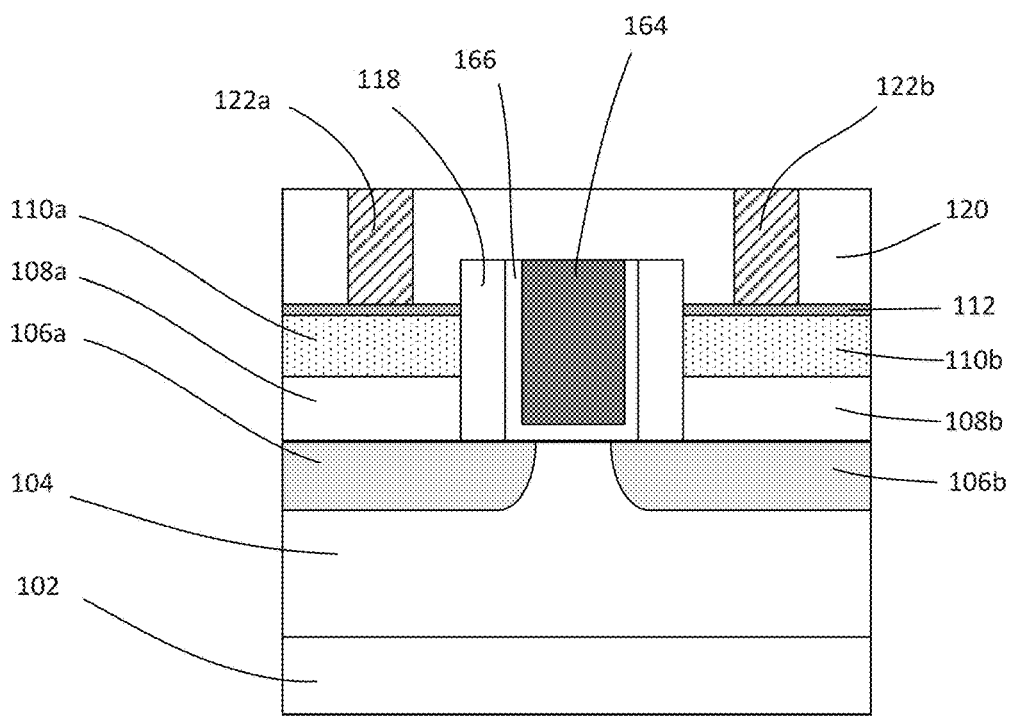

FIG. 1b shows a cross-sectional view of a memory device 150 which varies from the memory device 100 of FIG. 1a in accordance with another embodiment of the present disclosure. As most components of the memory device 150 are identical or at least similar to corresponding components of the memory device 100, in the interest of brevity, the description below focuses on the differences between the memory device 150 and the memory device 100.

As shown in FIG. 1b, the gate of the memory device 150 does not extend below the top surface of the substrate 102 as does the gate of the memory device 100. In particular, gate electrode 164 and gate dielectric 166 of the memory device 150 do not extend below the top surface of the substrate 102 to be parallel with the first and second regions of the second polarity type 106a/106b.

Figure 2A:
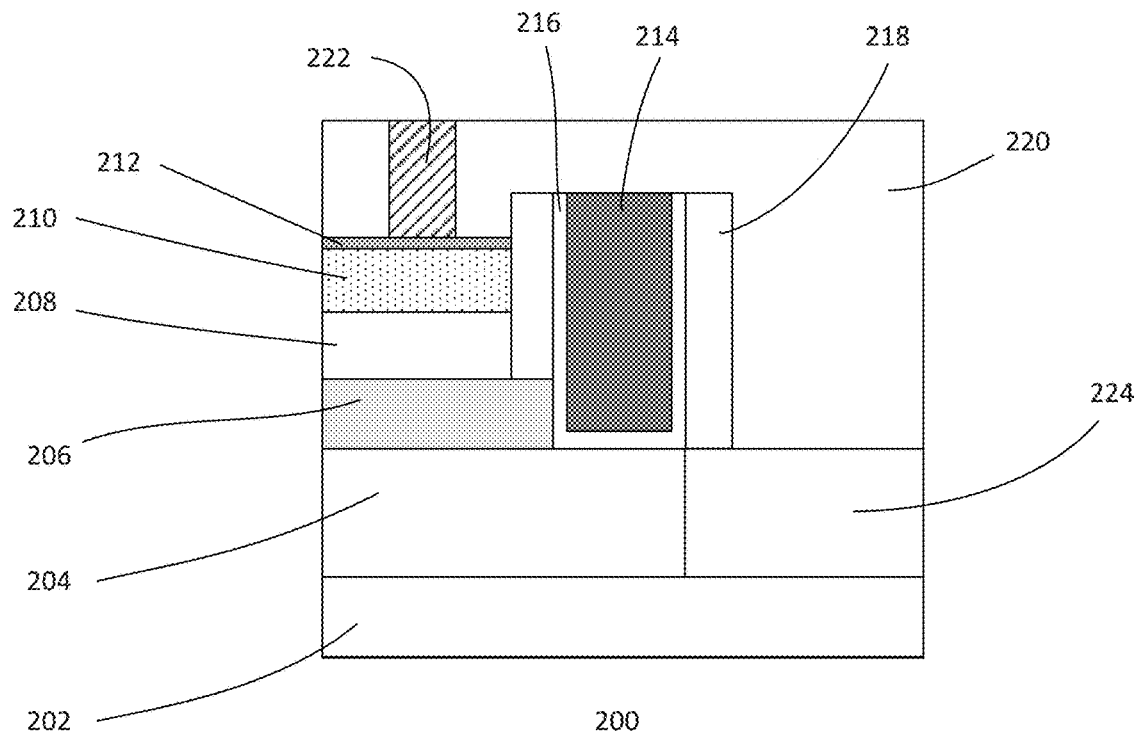
FIGS. 2a-2b show cross-sectional views of various embodiments of a device.

FIG. 2a shows a cross-sectional view of a device 200 in accordance with one embodiment of the present disclosure. The device 200 includes a T-RAM similar to the device shown in FIGS. 1a-1b. Thus, similar features will not be described in detail.

Referring to FIG. 2a, the device 200 includes a well 204 of a first polarity type formed in a substrate 202 of a second polarity type, a region 206 of the second polarity type disposed over the well 204, and a gate disposed on the substrate 202. The gate includes a gate electrode 214 and a gate dielectric 216. Spacers 218 are disposed on first and second sides of the gate.

The device includes a thyristor structure having a layer of the first polarity type 208 disposed on the region of the second polarity type 206 adjacent to a first side of the gate. The thyristor structure also includes a heavily doped layer of the second polarity type 210 disposed on the first layer of the first polarity type 208 adjacent to the first side of the gate.

In one embodiment, the layer of the first polarity type 208 serves as the base while the heavily doped layer of the second polarity type 210 serves as the emitter of the anode portion of the thyristor structure. The adjacent layer of the first polarity type and the layer of the heavily doped second polarity type form a p-n junction of the anode portion of the thyristor structure. Further, the region of the second polarity type 206 also serves as the base while the well 204 serves as the emitter of the cathode portion of the thyristor structure. The adjacent layer of the second polarity type 206 and the well 204 form a p-n junction of the cathode portion of the thyristor structure. The well also functions as the first word line of the device while the gate 114 is configured to function as a second word line of the device and is capacitively coupled to the layer of the second polarity type 206 through the gate dielectric 216.

The device 200 further includes an ILD layer 220 disposed over the heavily doped layer of the second polarity type 210 and the gate. A silicide contact 212 may be formed between the ILD layer 220 and the heavily doped layer of the second polarity type 210. The ILD layer 220 includes a contact opening that is coupled to the heavily doped layer of the second polarity type 210. An electrically-conductive material is filled in the opening of the ILD layer 220 to form the contact 222 and is coupled to a bit line of the memory device 200.

The memory device 200 further includes a shallow trench isolation (STI) region 224 disposed in the well 204. As shown in FIG. 2a, the dielectric layer 220 extends toward the substrate 202, to be adjacent to a second side of the gate opposite the first side of the gate, and in contact with the STI region 224. The gate, as shown, lands on the edge of the STI region. This may reduce the interference of one cell from another cell.

In one embodiment, the region of the second polarity type 206 includes a BE region. In one embodiment, the region of the second polarity type 206 includes SiGe, Si:C or Ge BE region. Other suitable types of BE materials may also be useful. The BE region, in one embodiment is an epitaxial layer. As shown in FIG. 2a, the gate is a recessed gate such that a portion of the gate is extended vertically with respect to a horizontal plane toward the well 204 to be parallel with the region of the second polarity type 206 with respect to the horizontal plane. These features help lower the operating voltage, improve read/write speed, and further improve retention time of the memory device 200.

The embodiment, as shown in FIG. 2a, features a 1-bit-per-cell structure. As shown in FIG. 2a, the structure of the memory device 200 has self-aligned and compact first polarity type layer 208 and heavily doped second polarity type layer 210. This helps improve variation and achieve smaller cell size. The operation of the device 200, for example, is similar to the operation of a conventional T-RAM structure as mentioned above.

Figure 2B:
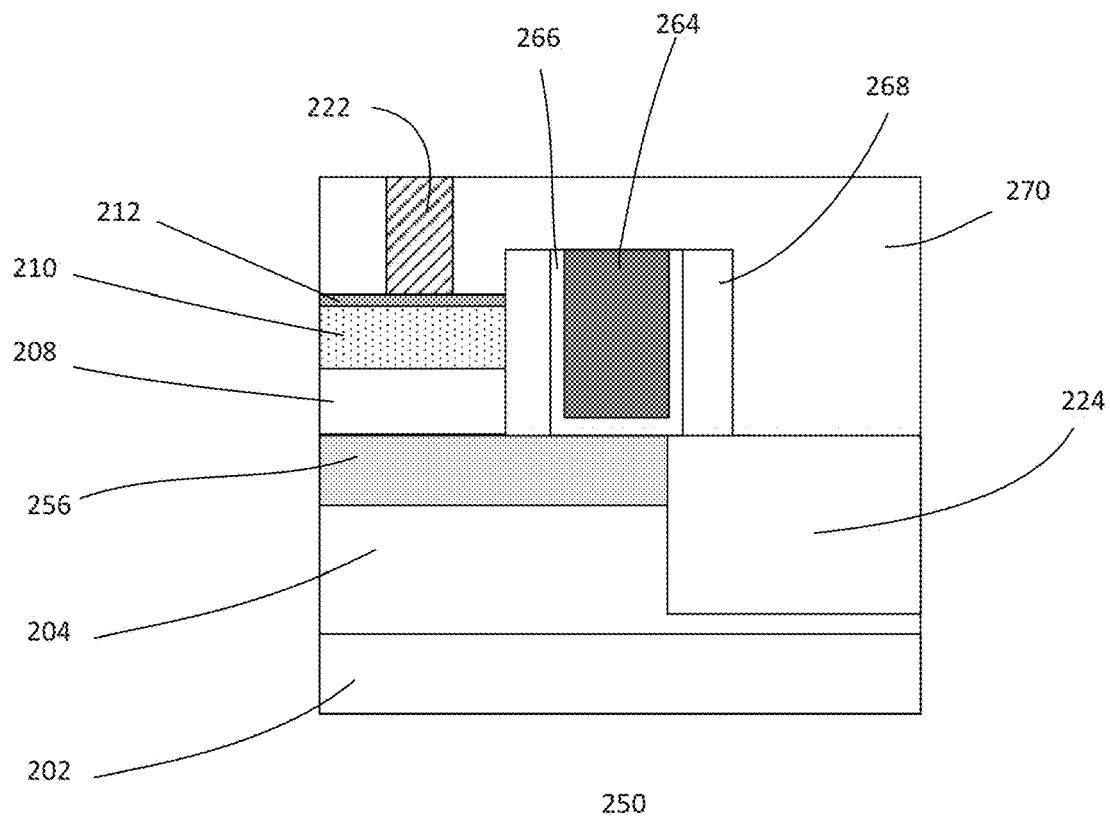

FIG. 2b shows a cross-sectional view of a device 250 which varies from the device 200 of FIG. 2a in accordance with another embodiment of the present disclosure. As most components of the device 250 are identical or at least similar to corresponding components of the device 200, in the interest of brevity, the description below focuses on the differences between the device 250 and the device 200.

As shown in FIG. 2b, the gate of the device 250 does not extend below the top surface of the substrate 202 as does the gate of the device 200. In particular, gate electrode 264, gate dielectric 266 and spacers 268 of the device 250 do not extend below the top surface of the substrate 202 to be parallel with the region of the second polarity type 256.

Figure 3A:
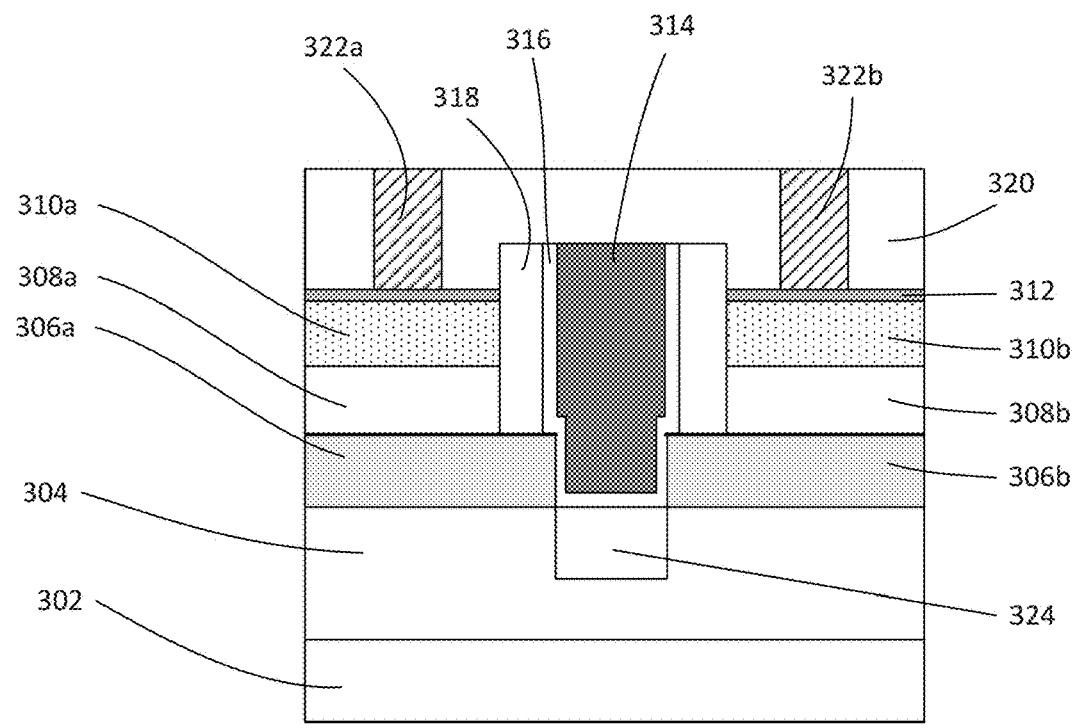
FIGS. 3a-3b show cross-sectional views of various embodiments of a device.

FIG. 3a shows a cross-sectional view of a device 300 in accordance with one embodiment of the present disclosure. The device 300 may include similar features as already described in FIGS. 1a-1b and FIGS. 2a-2b. Thus, similar features will not be described in detail. The device 300 includes a 2 T-RAM structure or two-bits-per-cell structure having a well 304 of a first polarity type formed in a substrate 302 of a second polarity type. In one embodiment, the device includes a first fin structure correspond to a first region 306a of the second polarity type disposed over the well 304, a second fin structure corresponds to a second region 306b of the second polarity type formed over the well 304, and a gate disposed on the substrate 302 and in between the first and second regions of the second polarity type 306a/306b. In one embodiment, the first and second regions of the second polarity type 306a/306b include band-engineered (BE) regions. The gate includes a gate electrode 314 and a gate dielectric 316. Spacers 318 are disposed on first and second sides of the gate. The device 300 further includes a STI region 324 formed in the well 304. As shown in FIG. 3a, the STI region 324 is directly below the gate.

The device 300 includes thyristor structures built on or integrated with fin-type CMOS processing. In one embodiment, the device includes a first thyristor structure having a first layer of the first polarity type 308a disposed on the first region of the second polarity type 306a of the first fin structure and adjacent a first side of the gate. The first thyristor structure also includes a heavily doped first layer of the second polarity type 310a disposed on the first layer of the first polarity type 308a and adjacent the first side of the gate. The device, in one embodiment, includes a second thyristor structure having a second layer of the first polarity type 308b disposed on the second region of the second polarity type 306b of the second fin structure and adjacent a second side of the gate which is opposite the first side of the gate. The second thyristor structure also includes a heavily doped second layer of the second polarity type 310b disposed on the second layer of the first polarity type 308b adjacent to the second side of the gate. The materials and the dopant concentrations of the respective regions or layers are the same as that already described in FIGS. 1a-1b above.

The first and second layers of the first polarity type 308a/308b serve as the base while the heavily doped first and second layers of the second polarity type 310a/310b serve as the emitter of the anode portion of the respective first and second thyristor structures. The adjacent layer of the first polarity type and the layer of the heavily doped second polarity type form a p-n junction of the anode portion of the thyristor structure. Further, the first and second regions of the second polarity type 306a/306b also serve as the base while the well 304 also serves as the emitter of the cathode portion of the respective first and second thyristor structures. The adjacent layer of the second polarity type and the well form a p-n junction of the cathode portion of the thyristor structure. The well also functions as the first word line of the device while the gate 314 is configured to function as a second word line of the device and is capacitively coupled to the layers of the second polarity type 306a/306b through the gate dielectric 316.

The device 300 further includes an ILD layer 320 disposed over the heavily doped layers of the second polarity type 310a/310b of the first and second thyristor structures and the gate. Silicide contacts 312 may be formed between the ILD layer 320 and the heavily doped layers of the second polarity type 310a/310b. The ILD layer 320 includes a first contact opening that is coupled to the heavily doped first layer of the second polarity type 310a of the first thyristor structure. A first electrically-conductive material is filled in the first opening of the ILD layer 320 to form the first contact 322a and configured to couple to a first bit line of the device 300. The ILD layer 320 also includes a second contact opening that is coupled to the heavily doped second layer of the second polarity type 310b of the second thyristor structure. A second electrically-conductive material is filled in the second opening of ILD layer 320 to form the second contact 322b and is coupled to a second bit line of the device 300.

As shown in FIG. 3a, the gate of the MOS structure is a recessed gate such that a portion of the gate is extended vertically with respect to a horizontal plane toward the well 304 to be parallel with the first and second regions of the second polarity type 306a/306b with respect to the horizontal plane. Moreover, as described above, the first and second regions of the second polarity type 306a/306b include BE region. These features help lower the operating voltage, improve read/write speed, and further improve retention time of the device 300.

As shown in FIG. 3a, the device 100 includes first and second thyristor structures which enable a symmetrical two-bits-per-cell design to be achieved. The embodiment, as shown in FIG. 3a, includes two different bits in a single cell structure. Further, the device also features self-aligned and compact first polarity type layer 308a/308b and heavily doped second polarity type layer 310a/310b. This helps improve variation and achieve smaller cell size.

Figure 3B:
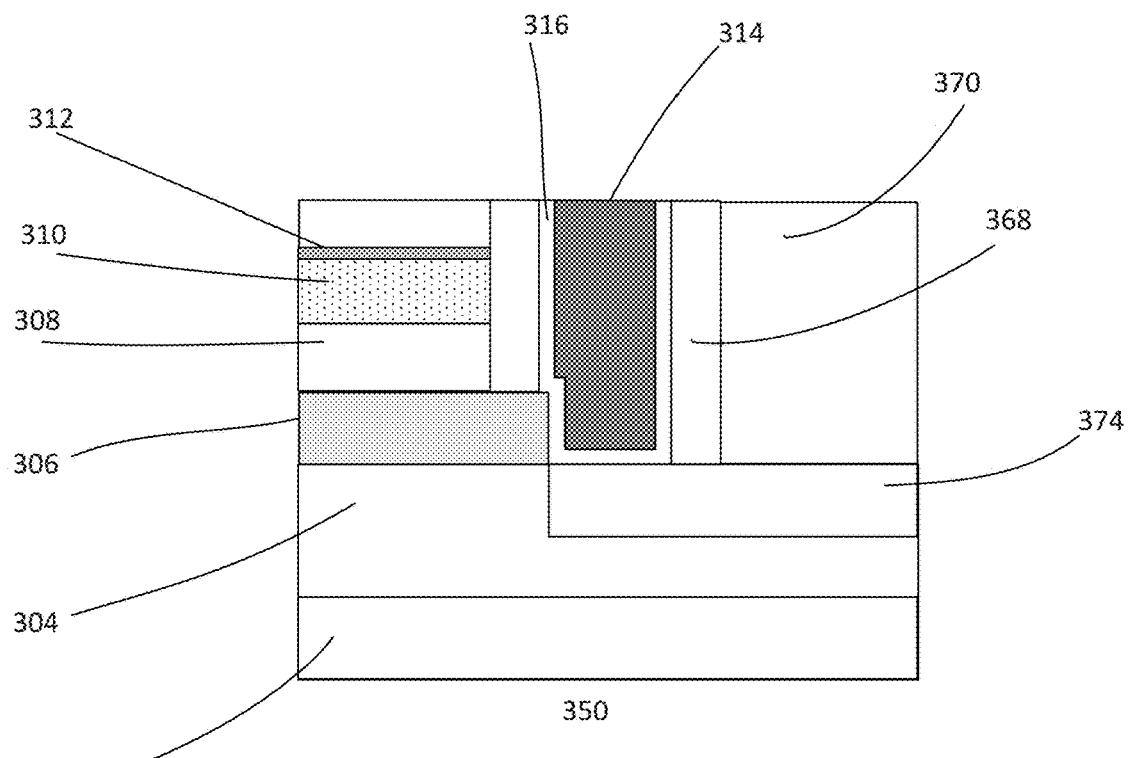

FIG. 3b shows a cross-sectional view of a device 350 which varies from the device 300 of FIG. 3a in accordance with another embodiment of the present disclosure. The device 350 includes a T-RAM or a 1-bit-per-cell structure having a well 304 of a first polarity type formed in a substrate 302 of a second polarity type, a fin structure correspond to a region 306 of the second polarity type defined on the substrate 302 and over the well 304, and a gate disposed on the substrate 302. In one embodiment, the region 306 of the second polarity type includes a BE region. The gate includes a gate electrode 314 and a gate dielectric 316. Spacers 368 are disposed on first and second sides of the gate.

In one embodiment, the device 350 includes a thyristor structure having a layer of the first polarity type 308 disposed on the region of the second polarity type 306 of the fin structure and adjacent to a first side of the gate. The thyristor structure also includes a heavily doped layer of the second polarity type 310 disposed on the first layer of the first polarity type 308 and adjacent to the first side of the gate.

The layer of the first polarity type 308 serves as the base while the heavily doped layer of the second polarity type 310 serves as the emitter of the anode portion of the thyristor structure. The adjacent layer of the first polarity type and the layer of the heavily doped second polarity type form a p-n junction of the anode portion of the thyristor structure. Further, the region of the second polarity type 306 also serves as the base while the well 304 also serves as the emitter of the cathode portion of the thyristor structure. The adjacent layer of the second polarity type and the well form a p-n junction of the cathode portion of the thyristor structure. The well also functions as the first word line of the device while the gate 314 is configured to function as a second word line of the device and is capacitively coupled to the layer of the second polarity type 306 through the gate dielectric 316.

The device 350 further includes an ILD layer 370 disposed over the thyristor structure and the gate. A silicide contact may be formed between the ILD layer 370 and the thyristor structure. The ILD layer 370 includes an opening that is coupled to the heavily doped layer of the second polarity type 310. An electrically-conductive material 322 is filled in the opening of the ILD layer 370 and is coupled to a bit line of the memory device 350.

The device 350 further includes a STI region 374 formed in the well 304 below the gate. As shown in FIG. 3b, the dielectric layer 370 extends toward the substrate 302, to be adjacent a second side of the gate which is opposite to the first side of the gate, and in contact with the STI region 374.

As shown in FIG. 3b, the gate of the MOS structure is a recessed gate such that a portion of the gate is extended vertically with respect to a horizontal plane toward the well 304 to be parallel with the region of the second polarity type 306 with respect to the horizontal plane. Additionally, as described above, the region of the second polarity type 306 includes a BE region. These features help lower the operating voltage, improve read/write speed, and further improve retention time of the memory device 350. Further, the device also features self-aligned and compact first polarity type layer 308 and heavily doped second polarity type layer 310. This helps improve variation and achieve smaller cell size.

Figure 4A:
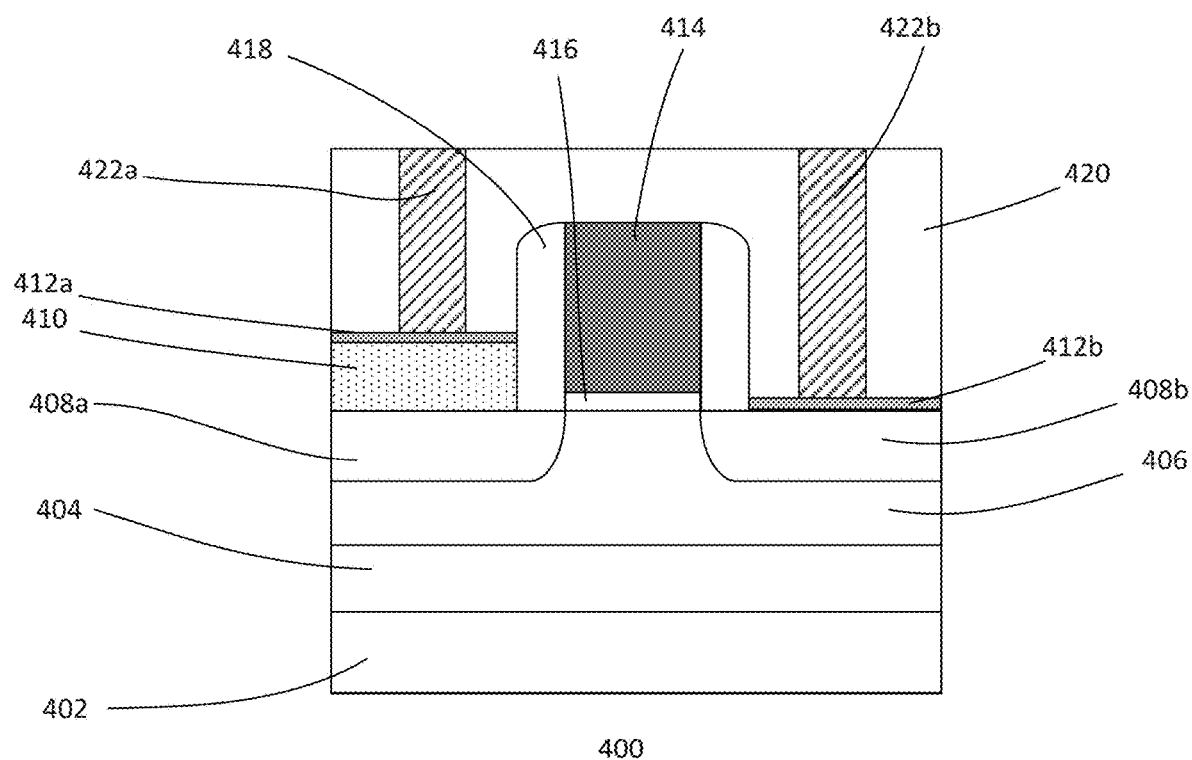
FIGS. 4a-4d show cross-sectional views of other various embodiments of a device.

FIG. 4a shows a cross-sectional view of a device 400 in accordance with one embodiment of the present disclosure. The device 400 includes a T-RAM having a well 404 of a first polarity type (or, alternatively, a region of isolation buffer which includes amorphous silicon) formed in a substrate 402 of a second polarity type, a body region 406 of the second polarity type formed in the substrate 402 and over the well 404 (or the region of isolation buffer), a lightly or intermediately doped region of the first polarity type 408a and a heavily doped region of the first polarity type 408b formed in the body region 406, and a gate disposed on the substrate 402 and over the body region 406.

The gate includes a gate electrode 414 and a gate dielectric 416. Spacers 418 are disposed on first and second sides of the gate. In one embodiment, the first polarity type is n-type and the second polarity type is p-type. In such case, the well 404 is an n-type well or a deep n-type well (DNW), and the substrate 402 is a p-type substrate. In the case that the substrate 402 includes a region of isolation buffer having amorphous-silicon instead of a well of the first polarity type, the region of amorphous silicon replaces the need for a buried oxide layer in the substrate 402. This helps achieve floating body second polarity type base and eliminate high cost associated with producing silicon-on-insulator.

In one embodiment, the device 400 includes a thyristor structure having an elevated self-aligned heavily doped layer of the second polarity type 410 disposed on the region of the first polarity type 408a disposed in the substrate and adjacent to the first side of the gate.

The region of the first polarity type 408a serves as the base while the heavily doped layer of the second polarity type 410 serves as the emitter of the anode portion of the thyristor structure. The adjacent region of the first polarity type and the elevated layer of the heavily doped second polarity type form a p-n junction of the anode portion of the thyristor structure. Further, the body region of the second polarity type 406 also serves as the base while the heavily doped region of the first polarity type 408b disposed in the substrate adjacent to the second side of the gate also serves as the emitter of the cathode portion of the thyristor structure. The adjacent body region of the second polarity type and the heavily doped region of the first polarity type form a p-n junction of the cathode portion of the thyristor structure.

The device 400 also includes an ILD layer 420 disposed over the thyristor structure and the substrate. Silicide contacts 412a/412b may be formed between the ILD layer 420 and the heavily doped layer of the first polarity type 410 and heavily doped region of the first polarity type 408b. The ILD layer 420 includes first and second contact openings. The first contact opening is coupled to the heavily doped layer of the second polarity type 410 of the thyristor structure. The second opening is coupled to the heavily doped region of the first polarity type 408b. The device 400 further includes first and second electrically-conductive materials filled in the first and second openings of the ILD layer 420 to form first and second contacts 422a/422b. The first contact 422a is configured to be coupled to a bit line while the second contact 422b is coupled to a first word line of the memory device 400. The gate is configured to function as a second word line of the memory device 400 and is capacitively coupled to the body region of the second polarity type 406 through the gate dielectric 416.

In one embodiment, the body region 406 of the second polarity type includes a BE body region. This feature helps to lower the operating voltage, improve read/write speed, and further improve retention time of the memory device 400. As shown in FIG. 4a, the device 400 has self-aligned and compact first polarity type region 408a and heavily doped second polarity type layer 410. This avoids the need for silicide block layer and also helps improve variation and achieve smaller cell size.

Figure 4B:
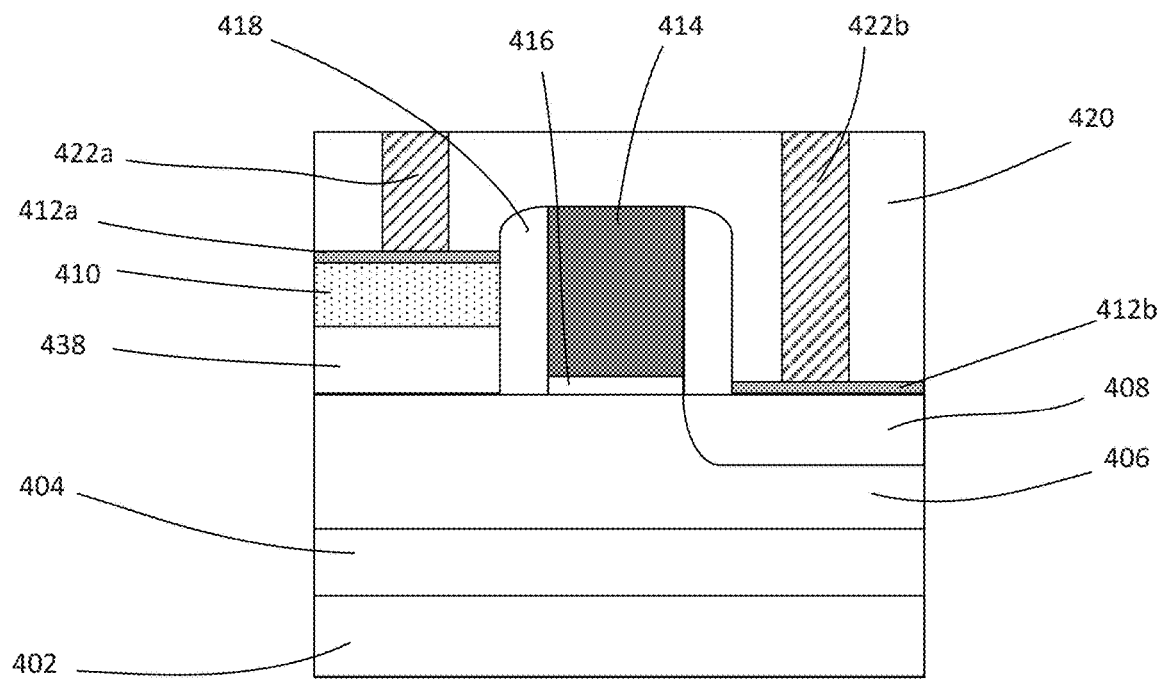

FIG. 4b shows a cross-sectional view of a device 430 which varies from the device 400 of FIG. 4a in accordance with another embodiment of the present disclosure. As most components of the memory device 430 are identical or at least similar to corresponding components of the memory device 400, in the interest of brevity, the description below focuses on the differences between the device 430 and the device 400.

As shown in FIG. 4b, in lieu of the region of the first polarity type 408a formed in the body region 406 as in the device 400, the thyristor structure includes a self-aligned elevated layer of the first polarity type 438 disposed on the substrate 402 and over the body region 406 of the second polarity type. The thyristor structure also includes an elevated self-aligned heavily doped layer of the second polarity type 410 disposed on the layer of the first polarity type 438.

Figure 4C:
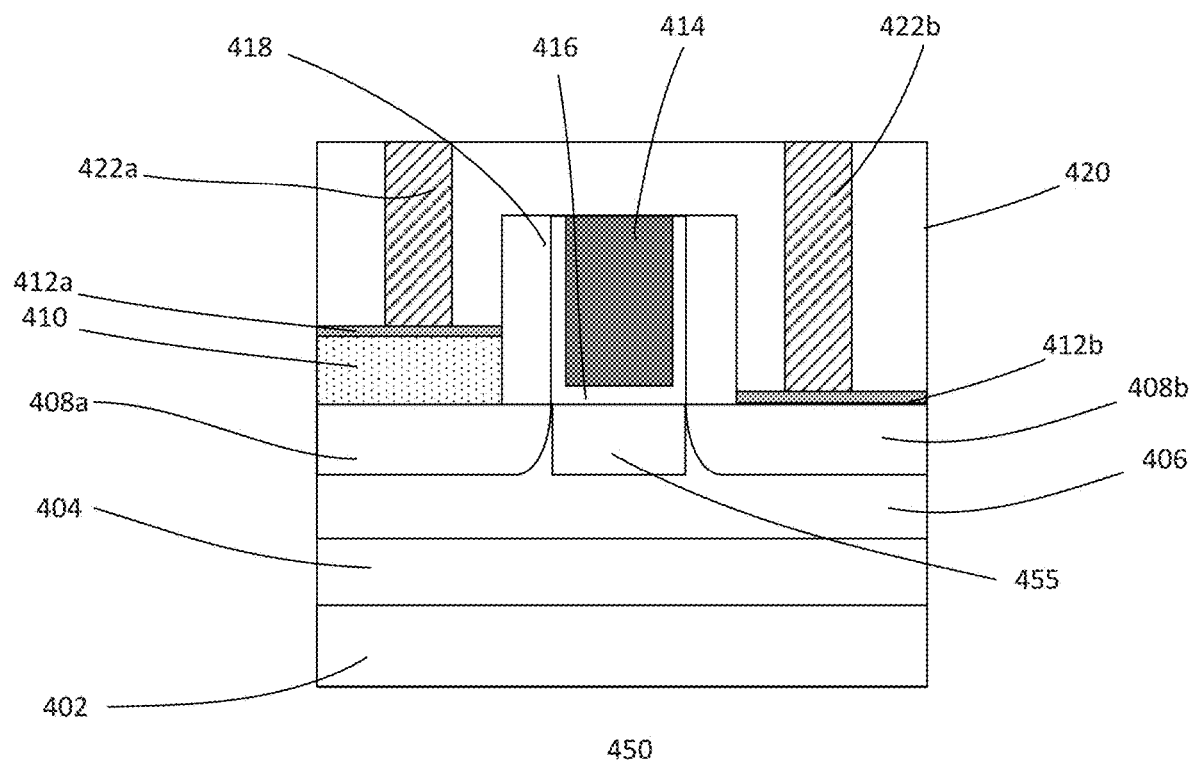

FIG. 4c shows a cross-sectional view of a device 450 in accordance with one embodiment of the present disclosure. The device 450 includes a T-RAM having a well 404 of a first polarity type (or, alternatively, an isolation buffer having amorphous silicon) formed in a substrate 402 of a second polarity type, a body region 406 of the second polarity type formed in the substrate 402 and over the well 404 (or the isolation buffer), a lightly or intermediately doped region of the first polarity type 408a and a heavily doped region of the first polarity type 408b formed in the body region 406 adjacent to the first and second sidewalls of the gate, and a gate disposed on the substrate 402 and over the body region 406.

The gate includes a gate electrode 414 and a gate dielectric 416. Spacers 418 are disposed on first and second sides of the gate. In one embodiment, the first polarity type is n-type and the second polarity type is p-type. In such case, the well 404 is an n-type well or a deep n-type well (DNW), and the substrate 402 is a p-type substrate. In the case that the substrate 402 includes an isolation buffer which includes amorphous silicon instead of a well of the first polarity type, the region of isolation buffer replaces the need for a buried oxide layer in the substrate 402. This helps achieve floating body second polarity type base and eliminate high cost associated with producing silicon-on-insulator.

In one embodiment, the device 450 includes a thyristor structure having an elevated self-aligned heavily doped layer of the second polarity type 410 disposed on the region of the first polarity type 408a disposed in the substrate and adjacent to the first side of the gate.

The region of the first polarity type 408a serves as the base while the heavily doped layer of the second polarity type 410 serves as the emitter of the anode portion of the thyristor structure. The adjacent region of the first polarity type and the elevated layer of the heavily doped second polarity type form a p-n junction of the anode portion of the thyristor structure. Further, the body region of the second polarity type 406 also serves as the base while the heavily doped region of the first polarity type 408b disposed in the substrate adjacent to the second side of the gate also serves as the emitter of the cathode portion of the thyristor structure. The adjacent body region of the second polarity type and the heavily doped region of the first polarity type form a p-n junction of the cathode portion of the thyristor structure.

The device 450 also includes an ILD layer 420 disposed over the thyristor structure and the substrate. Silicide contacts 412a/412b may be formed between the ILD layer 420 and the heavily doped layer of the first polarity type 410 and heavily doped region of the first polarity type 408b. The ILD layer 420 includes first and second contact openings. The first contact opening is coupled to the heavily doped layer of the second polarity type 410 of the thyristor structure. The second opening is coupled to the heavily doped region of the first polarity type 408b. The device 400 further includes first and second electrically-conductive materials filled in the first and second openings of the ILD layer 420 to form first and second contacts 422a/422b. The first contact 422a is configured to be coupled to a bit line while the second contact 422b is coupled to a first word line of the memory device 450. The gate is configured to function as a second word line of the memory device 450.

In one embodiment, a portion in the body region 406 of the second polarity type below the gate includes a BE portion 455. In one embodiment, the BE portion 455 includes SiGe BE portion. Other suitable types of BE material may also be useful. As shown, the gate is capacitively coupled to the BE portion 455 through the gate dielectric 416. These features help lower the operating voltage, improve read/write speed, and further improve retention time of the memory device 450.

As shown in FIG. 4c, the device 450 has self-aligned and compact first polarity type region 408a and heavily doped second polarity type layer 410. This avoids the need of silicide block layer and helps improve variation and achieve smaller cell size.

Figure 4D:
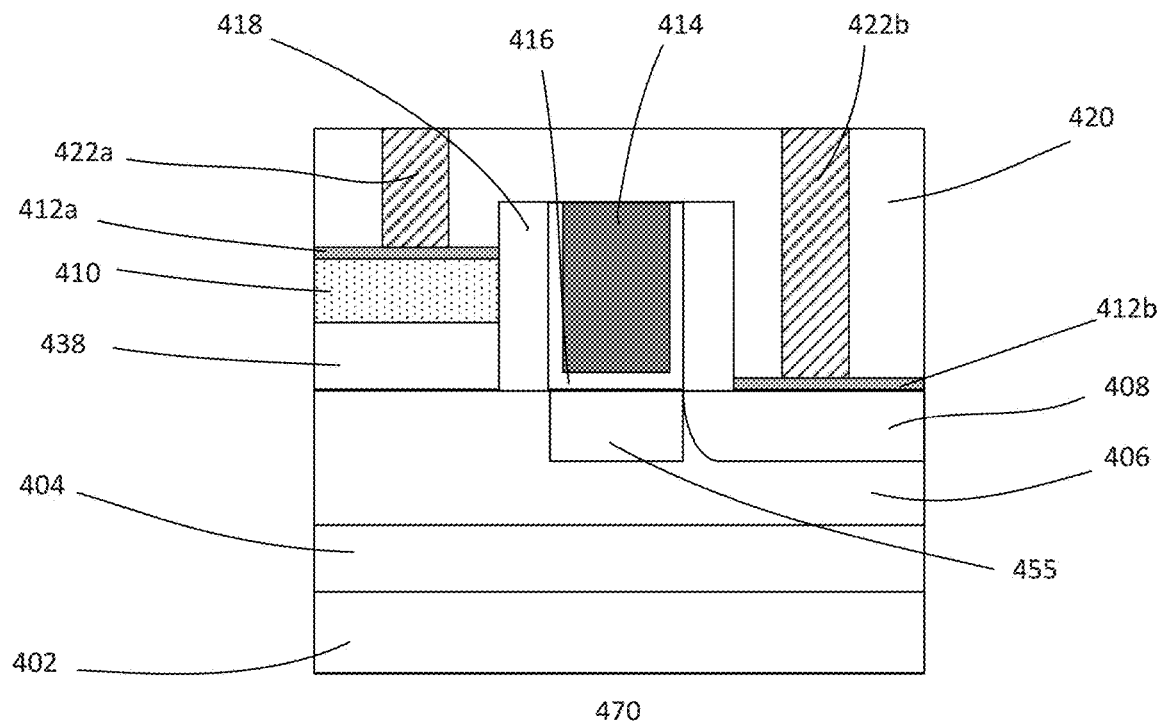

FIG. 4d shows a cross-sectional view of a device 470 which varies from the device 450 of FIG. 4c in accordance with another embodiment of the present disclosure. As most components of the device 470 are identical or at least similar to corresponding components of the device 450, in the interest of brevity, the description below focuses on the differences between the device 470 and the device 450.

As shown in FIG. 4d, in lieu of the region of the first polarity type 408a formed in the body region 406 as in the device 450, the thyristor structure of the device 470 includes a self-aligned elevated layer of the first polarity type 438 disposed on the substrate 402 and over the body region 406 of the second polarity type. The thyristor structure also includes a self-aligned heavily doped layer of the second polarity type 410 disposed on the layer of the first polarity type 438.

Figure 5A:
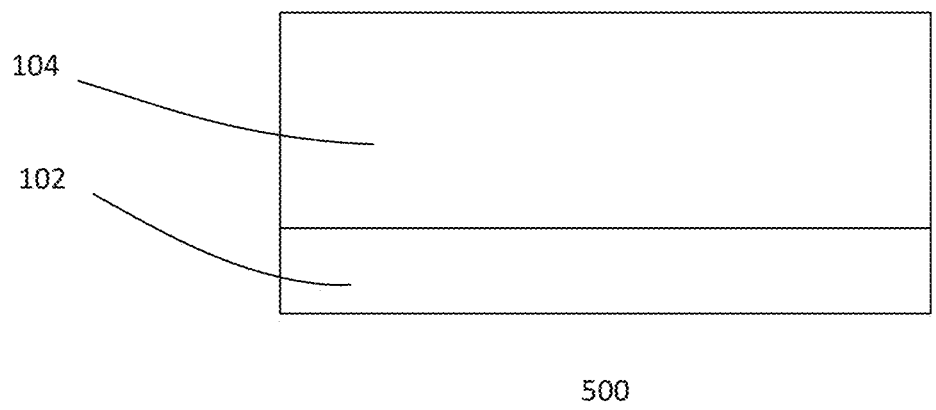
FIGS. 5a-5j show cross-sectional views of an embodiment of a process for forming a device in accordance with one embodiment of the present disclosure.

FIGS. 5a-5j show cross-sectional views of an embodiment of a process 500 for forming a device in accordance with one embodiment of the present disclosure. In one embodiment, the process 500 forms the device 150 of FIG. 1b. The device 150 includes a 2 T-RAM structure or 2-bits-per-cell structure. In forming the device 150, the process 500 forms first and second thyristor structures integrated with CMOS processing. Referring to FIG. 5a, a substrate 102 is provided. The substrate, for example, is a semiconductor substrate, such as a silicon substrate. In one embodiment, the substrate is a second polarity type doped substrate. For example, the substrate is lightly doped with second polarity type dopants. The second polarity type dopants, for example, include p-type dopants. Other suitable types of semiconductor substrates may also be useful.

The substrate includes a device region. The device region, in one embodiment, serves as a cell region for a memory cell. It is, however, understood that the substrate may include a plurality of device regions. In one embodiment, the cell region serves as a device region of a 2 T-RAM. Numerous cell regions may be provided in an array region to form a plurality of memory devices. Isolation regions (not shown) are formed in the substrate 102. The isolation region serves to isolate the cell region from other device regions (not shown) for other types of devices. The isolation region, for example, is a shallow trench isolation (STI) region. Other types of isolation regions may also be useful. The STI regions (not shown) may be formed using various suitable techniques.

The process continues to form a well 104. The well, in one embodiment, includes first polarity type dopants. The first polarity type dopants, for example, are n-type dopants. The dopant concentration is, for example, $10^{16}$ cm$^{-3}$ to $10^{18}$ cm$^{-3}$. Other suitable types of dopants and dopant concentrations may also be useful. In one embodiment, the well 104 extends to a depth below the isolation regions (not shown). Other suitable depths may also be useful. The well 104, for example, may be part of the substrate. For example, dopants are implanted into the substrate to form the well. Providing any suitable implant energies and doses may also be useful. The implant parameters, such as energy and dose, are tailored to produce the well at the desired location and have the desired effect. By adjusting the energy and dose of the implant, the location and thickness of the well can be controlled. Other techniques for providing the well may also be useful. For example, the well may be an epitaxial isolation well. In such case, the epitaxial well may be formed prior to forming the isolation regions. The epitaxial well may be in-situ doped. Implanting the epitaxial isolation well may also be useful.

The process continues to form a gate or a dummy gate structure. To form a dummy gate structure, a gate dielectric layer and a gate electrode layer over the top surface of the substrate. The gate dielectric layer, for example, includes silicon oxide ($SiO_2$). Other suitable types of dielectric materials may be useful. The dielectric layer is formed by, for example, thermal oxidation, chemical vapor deposition (CVD) or atomic layer deposition (ALD). The thickness of the gate dielectric layer, for example, may be about 1-5 nm. The gate electrode layer, for example, includes polysilicon. Other suitable types of gate electrode materials may also be useful. The thickness of the gate electrode can be about 20-200 nm. The gate electrode layer, for example, can be formed by CVD. Other suitable techniques for forming and other suitable thickness dimensions for the gate dielectric and electrode layers may also be useful.

Figure 5B:
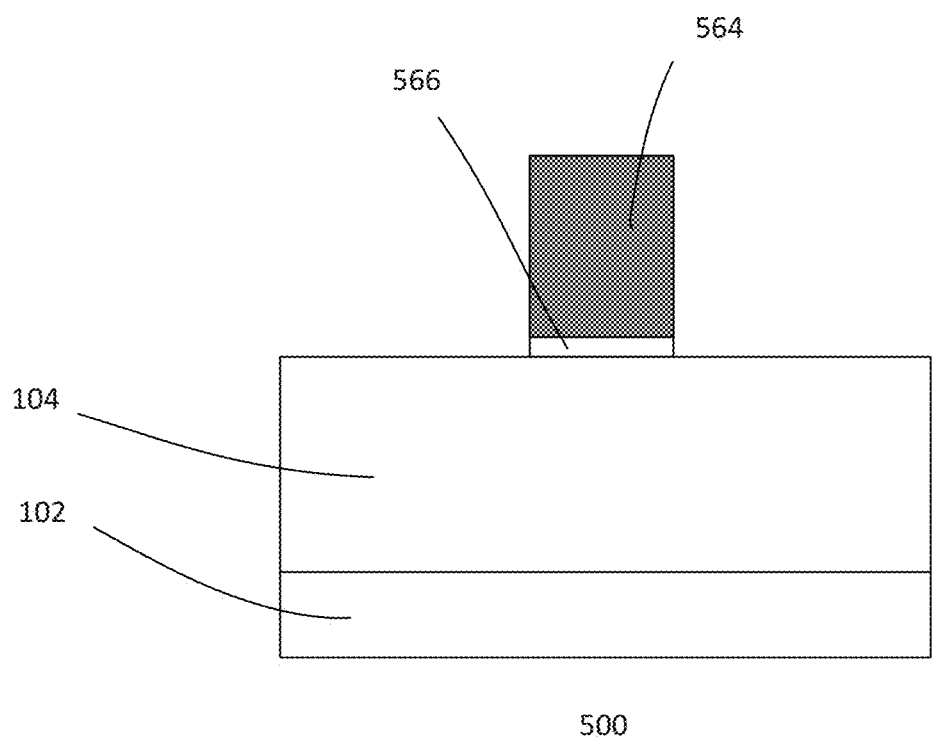

Referring to FIG. 5b, the gate layers are processed to form a gate or dummy gate having a patterned gate dielectric 566 and gate electrode 564. The patterning of the gate layers can be achieved, for example, by mask and etch techniques. For example, a patterned photoresist mask may be used as an etch mask for an anisotropic etch, such as a reactive ion etch (RIE). To improve lithographic resolution, an ARC can be provided beneath the photoresist. Other techniques for patterning the gate layers to form the dummy gate may also be useful. After patterning the gate layers, the mask, including the ARC layer, may be removed.

Figure 5C:
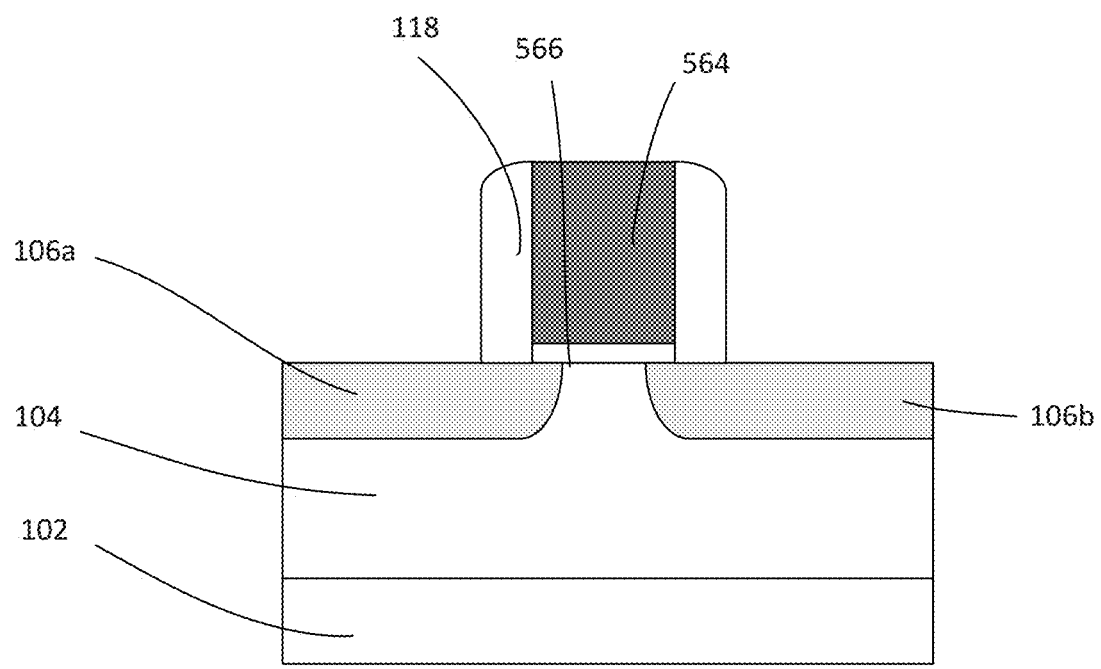

In one embodiment, the process continues to form regions of second polarity type 106a/106b in the substrate adjacent to first and second sides of the dummy gate as shown in FIG. 5c. The regions 106a/106b include lightly doped second polarity type dopants. To form the lightly doped regions, second polarity type dopants, such as p-type dopants, are implanted into the substrate. The implant, for example, may be self-aligned with respect to the dummy gate. For example, the implant may dope the substrate unprotected by the dummy gate and isolation region. The depth of the lightly doped regions, for example, is about 5-100 nm. Other suitable depth dimensions may also be useful, depending on technology node. The dopant concentration of the regions 106a/106b may be about $10^{16}$ cm$^{-3}$ to $10^{18}$ cm$^{-3}$. Other suitable dopant concentrations may also be useful. An implant mask which exposes the device region may be provided to perform the implant. The implant mask, for example, may be a photoresist layer. Other suitable types of implant masks may also be useful.

In an alternative embodiment, the regions 106a/106b in the substrate adjacent to first and second sides of the dummy gate as shown in FIG. 5c include BE regions. In one embodiment, either or both of the first and second regions of the second polarity type 106a/106b include BE region. The BE regions may be formed by recessing portions of the substrate unprotected by the gate using various suitable techniques. The depth of the recesses, for example, may be about the same as the depth of lightly doped diffusion regions of other device regions. The BE regions may be formed by, for example, selective epitaxial growth (SEG) process with in situ doping, filling the spaces or recesses. As shown, the top of the BE regions is about coplanar with the top of the substrate surface. Forming the BE regions which are slightly recessed or over the substrate surface may also be useful. The BE regions, in one embodiment, are SiGe BE regions. In one embodiment, the BE regions include second polarity type dopants. Other suitable types of BE regions may also be useful.

Sidewall spacers 118 may be formed over the first and second gate sidewalls. To form the sidewall spacers, a spacer layer is deposited on the substrate. The spacer layer, for example, may be silicon nitride. Other suitable types of dielectric material, such as silicon oxide or silicon oxynitride may also be used. The spacer layer may be formed by CVD. The spacer layer may also be formed using other techniques. The thickness of the spacer layer may be about, for example, 10-50 nm. Other suitable thickness ranges may also be useful. The thickness, for example, may depend on the desired width of the spacers. An anisotropic etch, such as RIE, may be performed to remove horizontal portions of the spacer layer, leaving spacers 118 on the sidewalls of the dummy gate as shown in FIG. 5c.

Figure 5D:
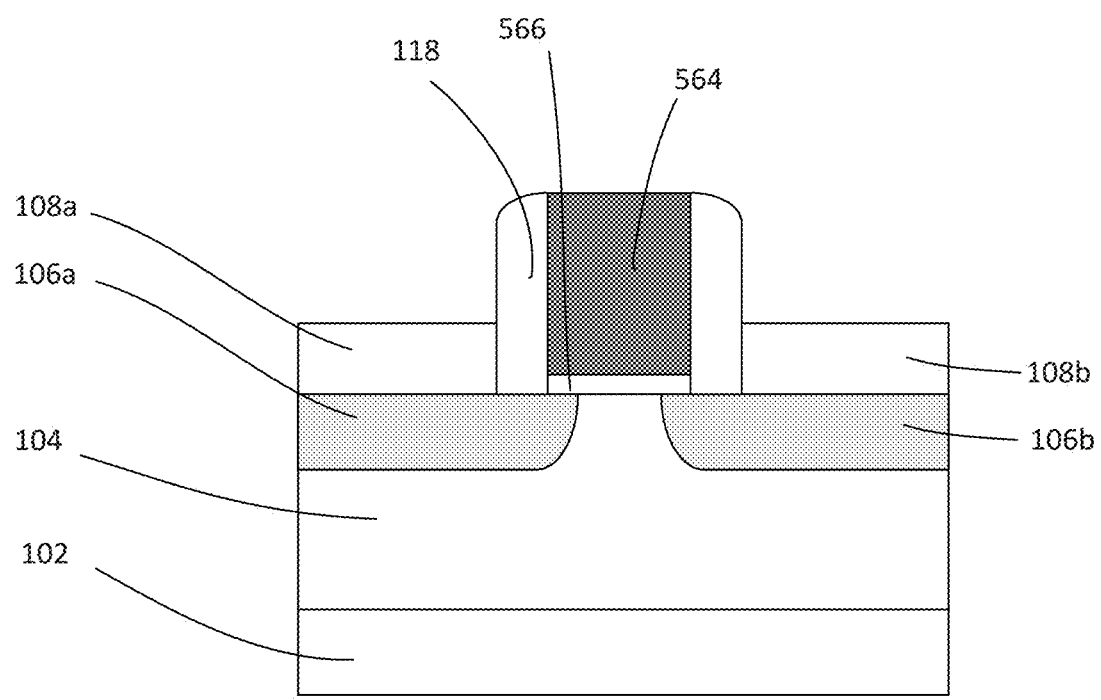

The steps illustrated with respect to FIGS. 5a-5c above are general steps performed for forming, for example, second polarity type MOS structure, such as PMOS structure. The process continues to integrate first and second thyristor structures in CMOS processing. In one embodiment, the process continues to form elevated first and second layers of the first polarity type 108a/108b over the first and second regions of the second polarity type 106a/106b as shown in FIG. 5d. The first and second layers of the first polarity type 108a/108b are formed by, for example, SEG process. The epitaxial layers, in one embodiment, are in-situ doped with first polarity type dopants, such as n-type dopants. Doping the epitaxial layers with first polarity type dopants by ion implantation may also be useful. In one embodiment, the first and second layers of the first polarity type 108a/108b of the first and second thyristor structures may be formed as part of the process for forming first polarity type epitaxial raised source/drain (RSD) regions of other devices on the same substrate. The thickness of the first and second layers of the first polarity type 108a/108b, for example, is about 10-50 nm and the dopant concentration of the first polarity type is about $10^{17}$ cm$^{-3}$ to $10^{19}$ cm$^{-3}$. Other suitable thickness dimensions and concentrations may also be useful.

Figure 5E:
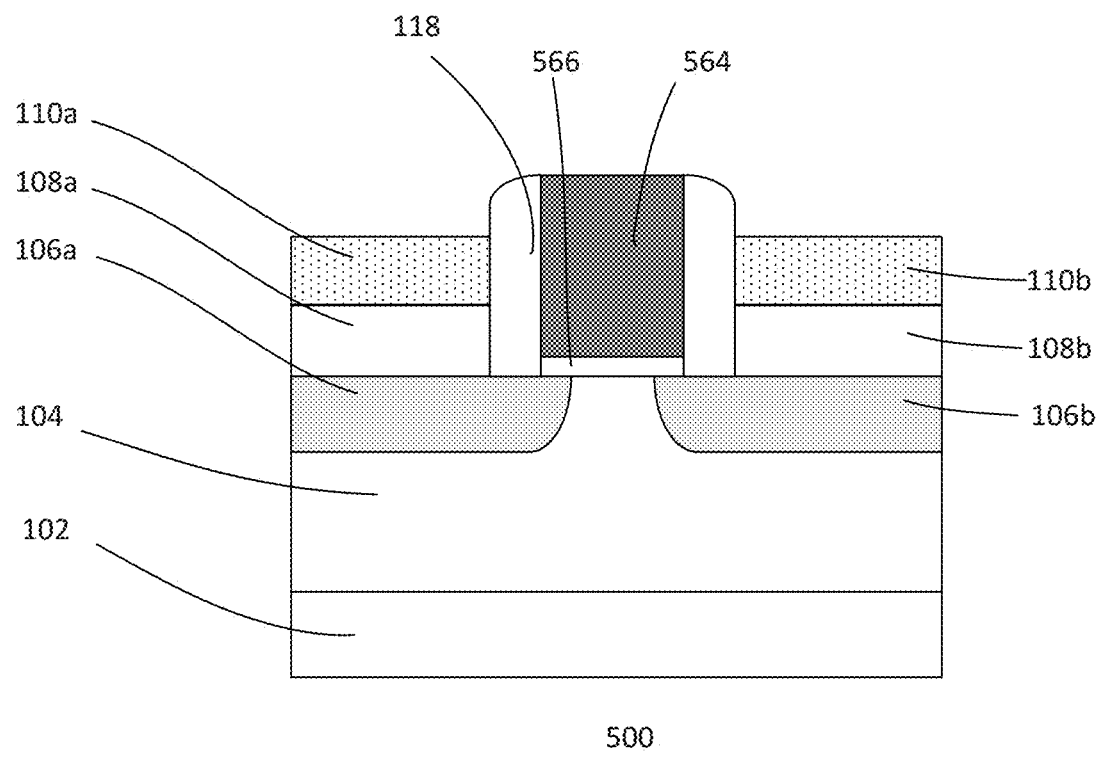

Referring to FIG. 5e, first and second heavily doped second polarity type layers 110a/110b are formed on the first and second layers of the first polarity type 108a/108b. The first and second heavily doped second polarity type layers 110a/110b are formed by, for example, SEG process. The epitaxial layers, in one embodiment, are heavily in-situ doped with second polarity type dopants, such as p-type dopants. Heavily doping the epitaxial layers with second polarity type dopants by ion implantation may also be useful. In one embodiment, the first and second heavily doped second polarity type layers 110a/110b of the first and second thyristor structures may be formed as part of the process for forming second polarity type epitaxial raised source/drain (RSD) regions of other devices on the same substrate. The thickness of the first and second heavily doped second polarity type layers 110a/110b, for example, is about 10-50 nm and the dopant concentration of the second polarity type is about $10^{18}$ cm$^{-3}$ to $10^{20}$ cm$^{-3}$. Other suitable thickness dimensions and concentrations may also be useful.

Figure 5F:
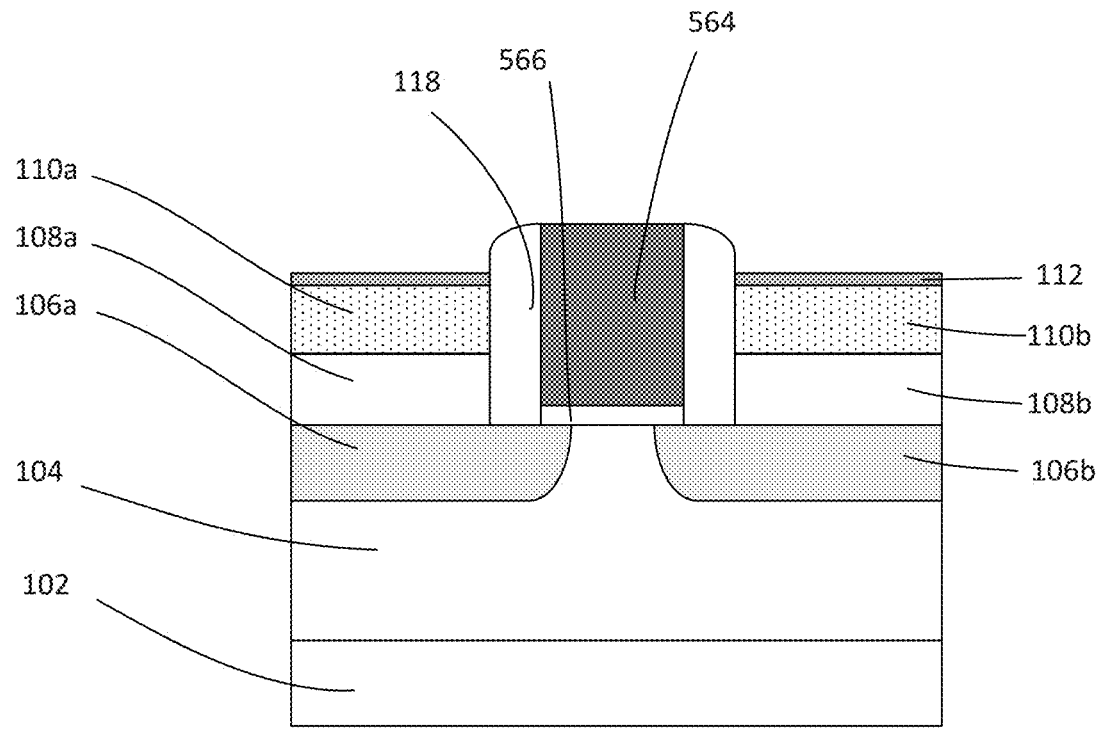

The process may continue to complete the 2 T-RAM structure. For example, silicide contacts 112 may be formed on the first and second heavily doped second polarity type layers 110a/110b. The silicide contacts, for example, may be nickel-based metal silicide layers. Other suitable types of silicide contacts may also be useful. The silicide contacts facilitate reduced contact resistance. To form silicide contacts, a metal layer may be deposited over the substrate and annealed to cause a reaction with silicon. Unreacted metal is removed by, for example, a wet etch, leaving the silicide contacts on the heavily doped first and second layers of the second polarity type 110a/110b as shown in FIG. 5f.

Figure 5G:
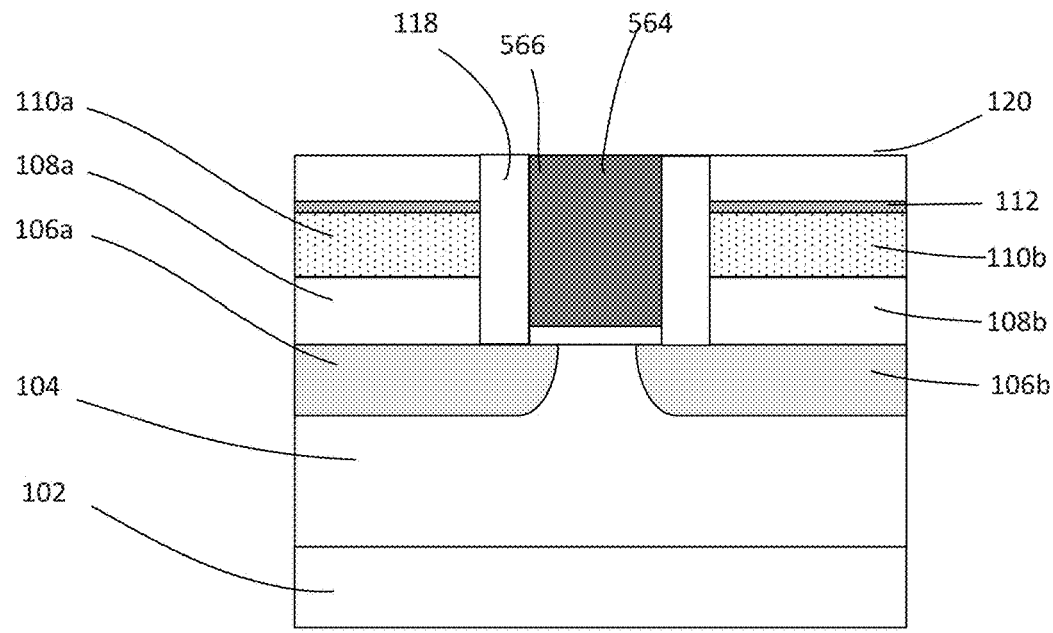

Referring to FIG. 5g, an interlevel dielectric (ILD) layer is formed over the substrate. The ILD layer, for example, is a silicon oxide layer. The ILD layer may be a high aspect ratio process (HARP) dielectric layer. Other suitable types of dielectric materials including BPSG, PSG, USG, TEOS oxide, PEOX, HDP oxide, etc., may also be useful. The ILD layer, for example, may be formed by CVD. Other suitable techniques may also be useful. Excess dielectric material of the ILD layer is removed by planarization process, such as CMP. Other types of planarization processes may also be useful. The CMP, for example, may use the dummy gate as a CMP stop. For example, the CMP forms a substantially coplanar surface between the top surfaces of the dummy gate, sidewall spacers and ILD layer 120 as shown in FIG. 5g.

Figure 5H:
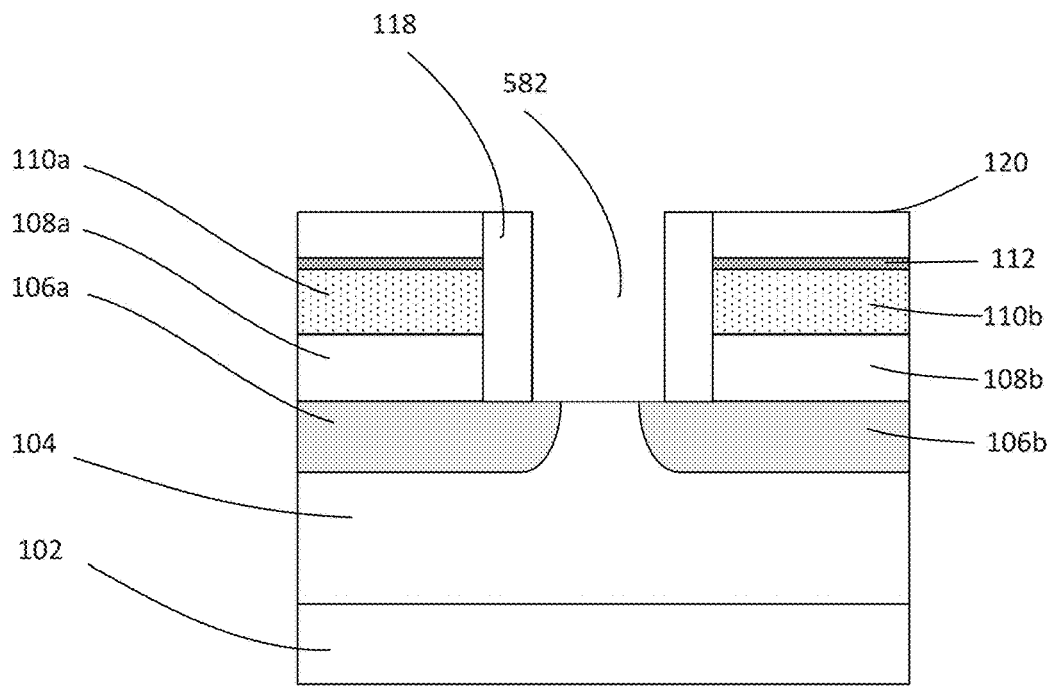

In one embodiment, the process may continue to form additional dielectric layer to form a pre-metal dielectric (PMD) layer in which contacts are formed to contact regions of the substrate, followed by BEOL process. In an alternate embodiment, the dummy gate is removed as shown in FIG. 5h. A dual etch process using different chemistries, for example, may be employed to remove the dummy gate electrode and gate dielectric. For example, a dry etch followed by a wet etch/clean process are performed to remove the dummy gate electrode 564 by etch selectivity control of the dummy gate to the ILD layer 120 and spacers 118. As for the removal of the gate dielectric layer 566, in one embodiment, it is removed by reactive ion etch (RIE). Other suitable techniques for removing the dummy gate may also be useful. The removal of the dummy gate forms a gate opening 582 which exposes sides of the spacers 118 which are away from the ILD 120 as shown.

The process continues by forming a high-k metal gate structure. The high-k metal gate structure includes a gate dielectric 166 and a gate electrode 164. The gate dielectric, for example, includes high-k dielectric material, such as HfSiON, SiON or $HfO_2$. Other suitable types of dielectric materials may be useful. The thickness of the gate dielectric layer, for example, may be about 1-10 nm. The gate electrode layer, for example, includes metal or metal nitride. Various suitable types of metal, such as Ru, W, Pt, TiN, Ti, Zr, TaN, Si or Al, can be used. Other suitable types of metals may also be useful. The thickness of the gate electrode can be about 10-200 nm. Other suitable thickness dimensions for the gate dielectric and electrode layers may also be useful.

In some embodiments, a work function tuning layer may be formed in between the gate dielectric and the metal gate electrode layer. For example, $La_2O_3$ may be formed for an n-type device while TiN/Al/TiN may be formed for a p-type device in addition to HfSiON and/or $HfO_2$. Other configurations of gates may also be useful.

The gate dielectric and gate electrode layers are conformally formed on the substrate. For example, the gate dielectric layer lines the ILD 120, exposed sides of the sidewall spacers 118 and the exposed portion of the substrate while the gate electrode layer covers the gate dielectric layer and fills the gate opening 582. The gate dielectric layer may be formed by, for example, atomic layer deposition technique while the gate electrode layer is formed by sputtering or CVD. Forming the gate dielectric and gate electrode layers by other techniques may also be useful.

Figure 5I:
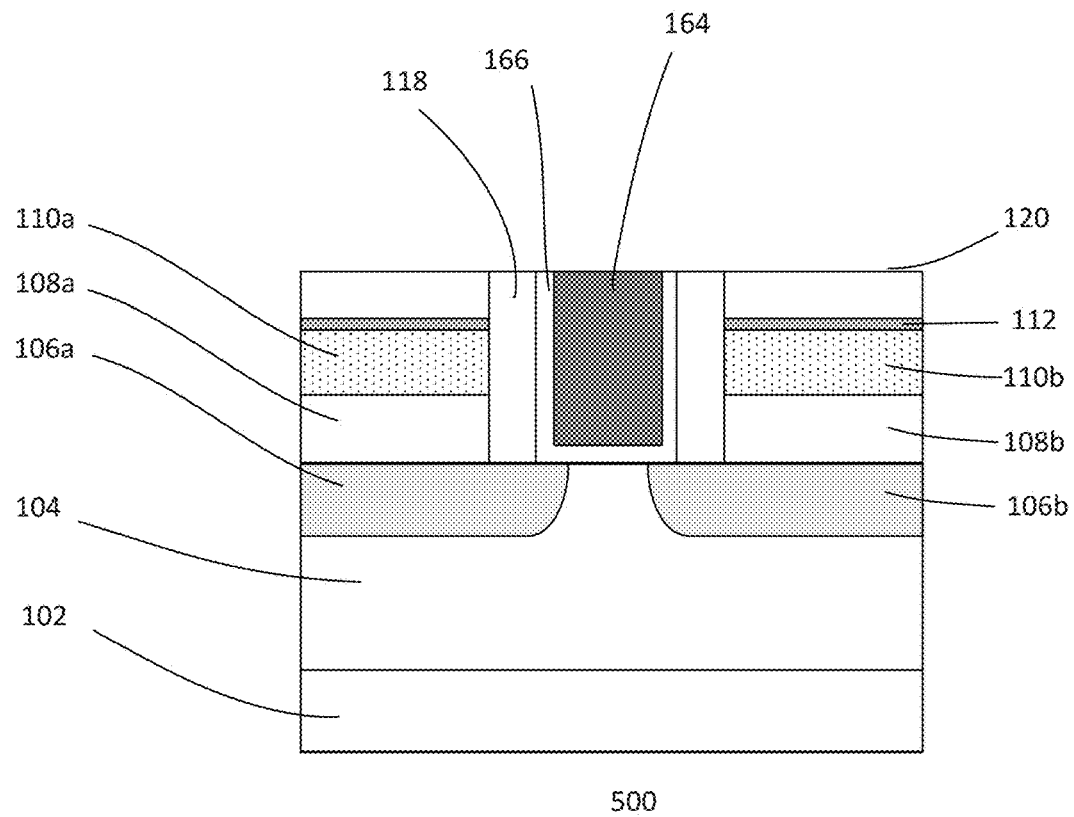

Referring to FIG. 5i, the substrate is planarized to remove excess gate dielectric and electrode materials. For example, the planarization process removes excess materials over the ILD layer 120. In one embodiment, the planarization process is CMP. Other types of planarization processes may also be useful. The CMP, for example, may use the ILD layer 120 as a CMP stop. The planarization process forms a substantially coplanar surface with the ILD layer 120, the sidewalls spacers 118, the gate dielectric and gate electrode layers 166 and 164. The planarization process forms high-k metal gate structure in the gate opening.

Figure 5J:
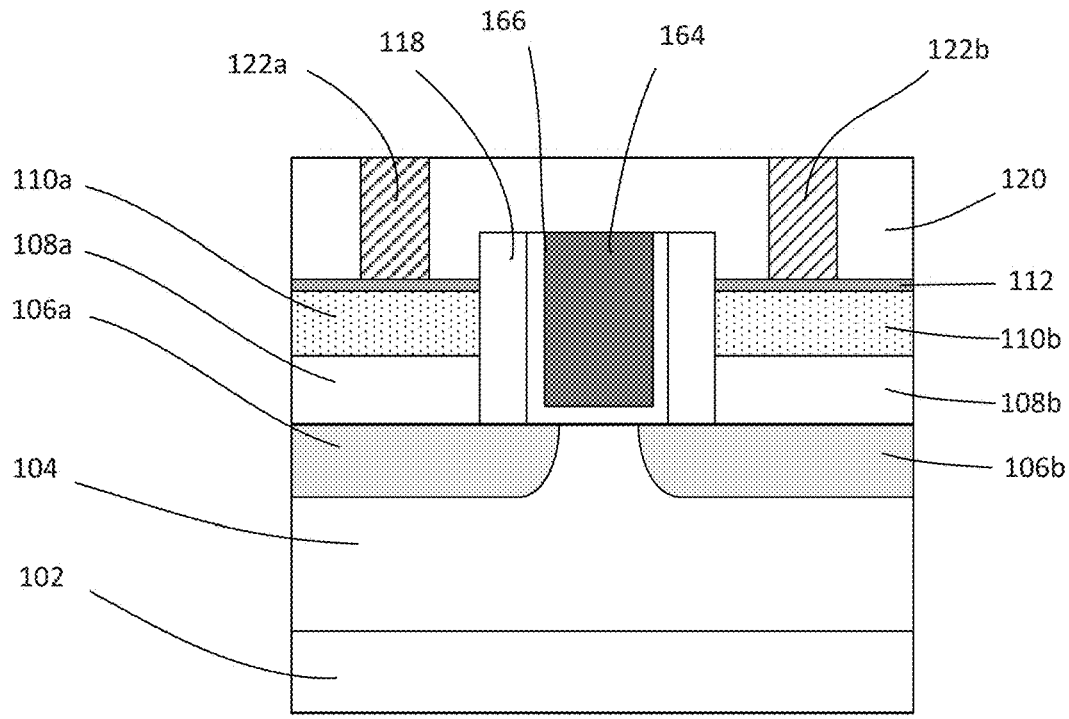

As shown in FIG. 5j, the process continues to forming additional dielectric layer to form a pre-metal dielectric (PMD) layer in which contacts are formed to contact regions of the substrate. The PMD layer, for example, formed similarly as the ILD layer 120 described above. To form contacts 122a/122b, a soft mask (not shown) may be used to form via or contact openings to the contact regions. The soft mask, for example, is a photoresist mask. To improve lithographic resolution, an anti-reflective coating (ARC) may be provided between the PMD layer and soft mask. The soft mask is patterned to form openings corresponding to the contact regions. A conductive layer is then formed on the substrate, filling the openings and covering the ILD layer 120. A planarizing process, such as CMP, removes excess conductive layer, forming contacts 122a/122b having a substantially coplanar surface with the top surface of the ILD layer 120. Other techniques for forming contacts may also be useful. The first contact 122a is configured to function as a first bit line of the memory device 150 while the second contact 122b is configured to function as a second bit line of the memory device 150. As shown, the first and second contacts 122a/122b are coupled to the respective heavily doped first and second layers of the second polarity type 110a/110b of the first and second thyristor structures. Contacts to the gate (not shown) are formed at the end of the gate.

The process may continue to complete the memory cell. For example, BEOL process including interconnect metal levels may be provided to form interconnections to the terminals of the transistor and other circuit components, as desired. Other processes may also be included to complete the memory cell or device, for example, final passivation, dicing and packaging.

The embodiment as described in FIGS. 5a-5j result in advantages. The embodiment as described in FIGS. 5a-5j enables the formation of a 2 T-RAM, allowing two different bits to be formed in a single cell area. Further, as described, the first and second regions of the second polarity type 106a/106b may include band-engineered (BE) regions. This helps lowering the operating voltage, improve read/write speed, and further improve retention time of the memory device 150. In addition, the SEG processes enable self-aligned and compact first polarity type layers 108a/108b and heavily doped second polarity type layer 110a/110b to be formed vertically over the substrate and adjacent to sidewalls of the gate. This helps improve variation and achieve smaller cell size.

Figure 6A:
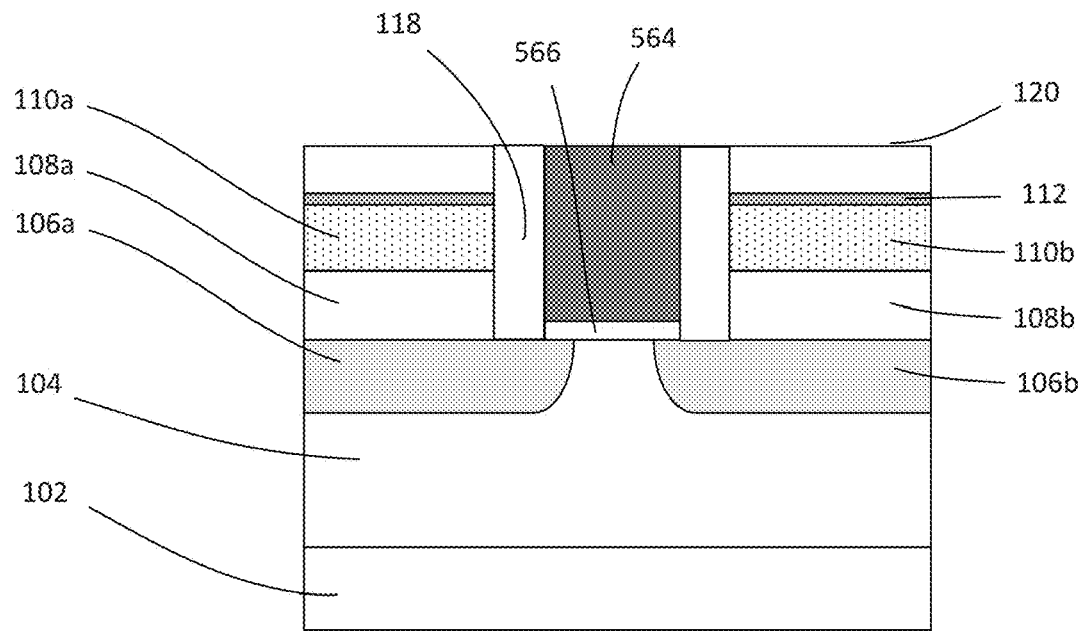
FIGS. 6a-6d show cross-sectional views of an embodiment of a process for forming a device in accordance with another embodiment of the present disclosure.

FIGS. 6a-6d show cross-sectional views of an embodiment of a process 600 for forming a device in accordance with another embodiment of the present disclosure. In one embodiment, the process 600 forms the device 100 of FIG. 1a. The process may contain similar steps as that described in FIGS. 5a-5j. In the interest of brevity, common elements may not be described or described in detail. As shown in FIG. 6a, a partially processed substrate with dummy gate is provided. The partially processed substrate with the dummy gate is at the same stage as that described in FIG. 5g.

Figure 6B:
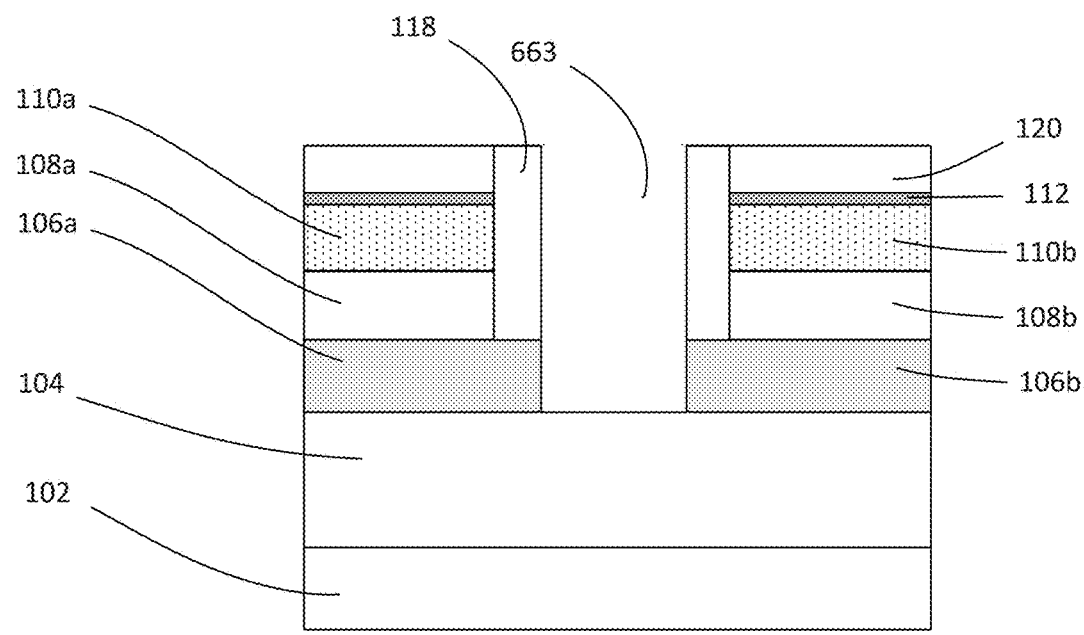

In one embodiment, the process may continue to form additional dielectric layer to form a pre-metal dielectric (PMD) layer in which contacts are formed to contact regions of the substrate, followed by BEOL process. In an alternate embodiment, the dummy gate is removed as shown in FIG. 6b using techniques as described in FIG. 5h. Other suitable techniques may also be employed to remove the dummy gate. The removal of the dummy gate exposes a portion of the top surface of the substrate. The process continues to form a trench 663 which extends to within a portion of the well 104 and portions of the regions of second polarity type 106a/106b under the dummy gate. A mask and etch process is employed to remove portions of the substrate within the well to form the trench 663. For example, the trench is formed by RIE. The sides of the trench, for example, are self-aligned to the inner sides of the spacers 118. As shown, the depth of the trench is about equal to the depth of the regions of second polarity type 106a/106b. Providing other depths or configurations may also be useful.

Figure 6C:
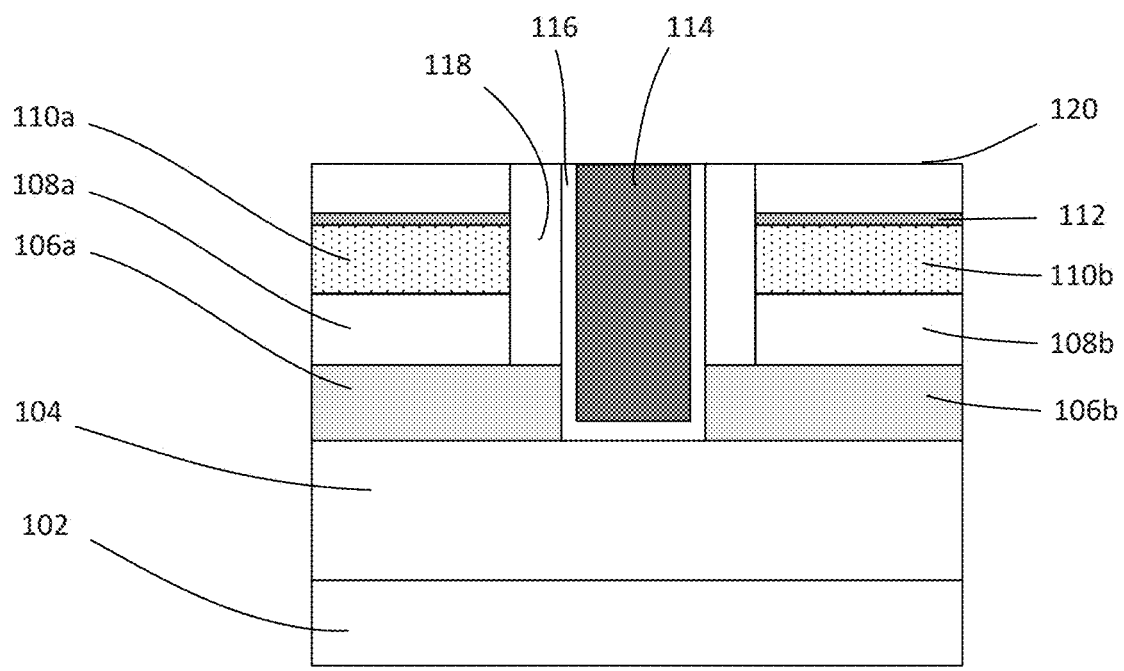
Figure 6D:
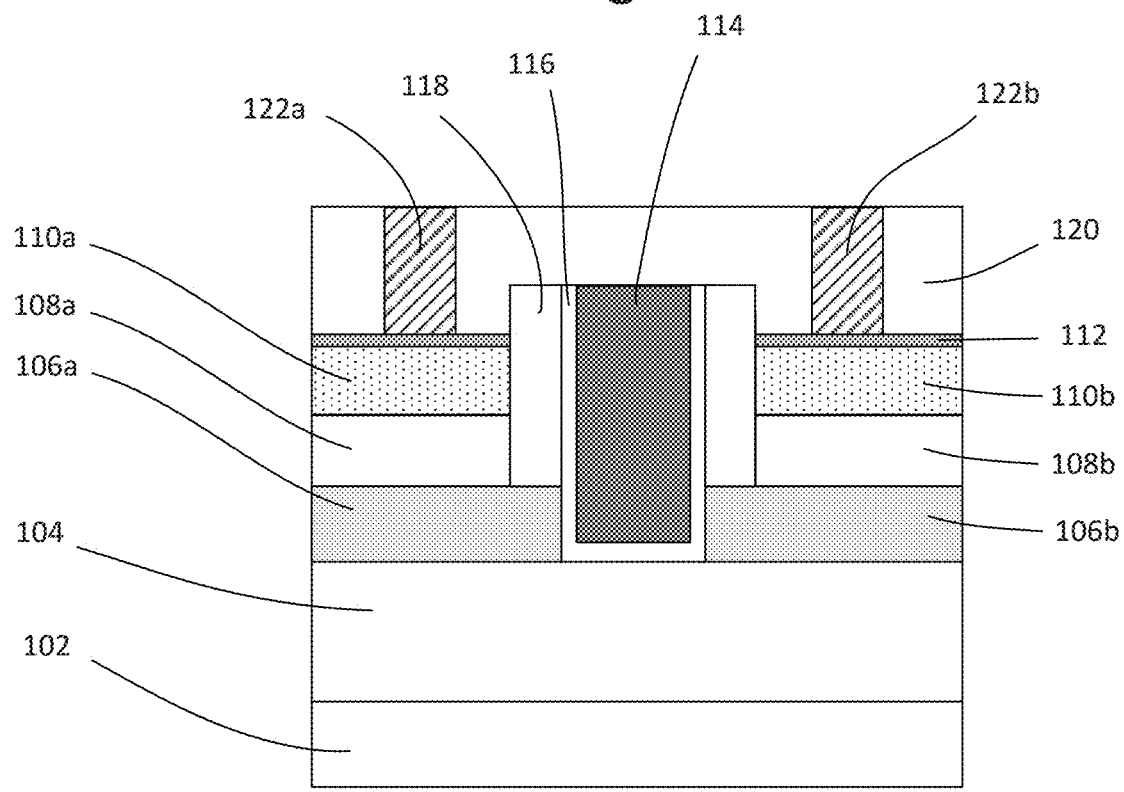

Referring to FIG. 6c, the process continues to form a high-k metal gate structure. The materials and techniques for forming the high-k metal gate structure is the same as that described in FIG. 5i. The process may continue to complete the memory cell. For example, the process continues to form PMD layer, contacts, etc., until a device shown in FIG. 6d is formed. Additional processes may be performed, including forming one or more interconnect levels, final passivation, dicing, assembly and packaging. Techniques and materials of these features are the same as that already described in FIG. 5j. As such, details of these steps will not be described.

FIGS. 7a-7h show cross-sectional views of an embodiment of a process 700 for forming a device in accordance with yet another embodiment of the present disclosure. In one embodiment, the process 700 forms the device 250 of FIG. 2b. The process may contain the same or similar steps as that described in FIGS. 5a-5j. In the interest of brevity, common elements may not be described or described in detail and the description below focuses on the differences between the process 700 and the process 500.

Figure 7A:
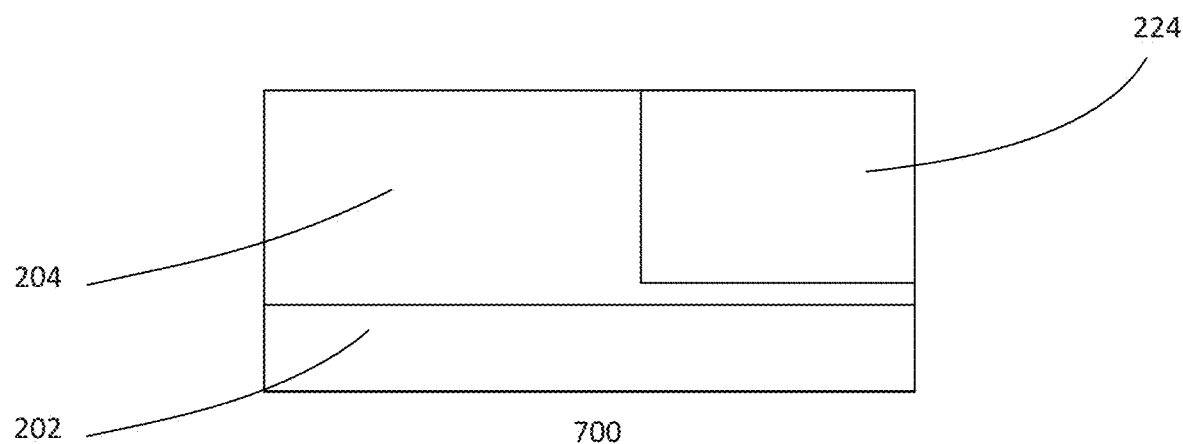
FIGS. 7a-7h show cross-sectional views of an embodiment of a process for forming a device in accordance with yet another embodiment of the present disclosure.

Referring to FIG. 7a, a partially processed substrate is provided. The partially processed substrate shows an isolation region 224 formed in the substrate. The isolation region includes STI region which serves to isolate the cell region from other device regions (not shown) for other types of devices. The partially processed substrate also includes a well 204 having first polarity type dopants. The well 204 extends to a depth below the isolation region 224. Other suitable depths may also be useful. The STI region and the well may include the same material and formed using various suitable techniques already described in FIG. 5a.

Figure 7B:
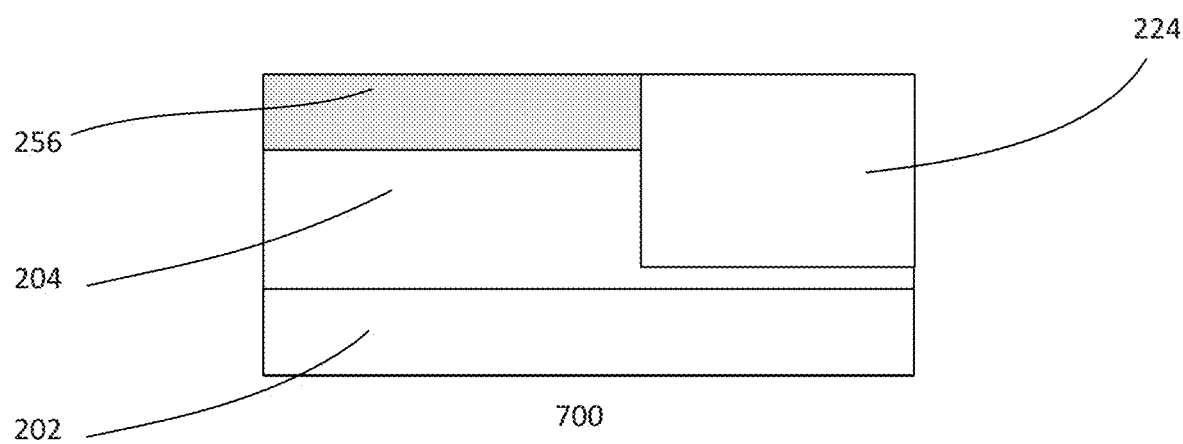

In FIG. 7b, a region of the second polarity type 256 is formed. The region of the second polarity type 256 includes the same material, dopant concentration and is formed by the same techniques as the regions 106a/106b as described in FIG. 5c. As such, details of the region of the second polarity type 256 will not be described. As shown, the region of the second polarity type 256 extends to the side or edge of the isolation region 224.

Figure 7C:
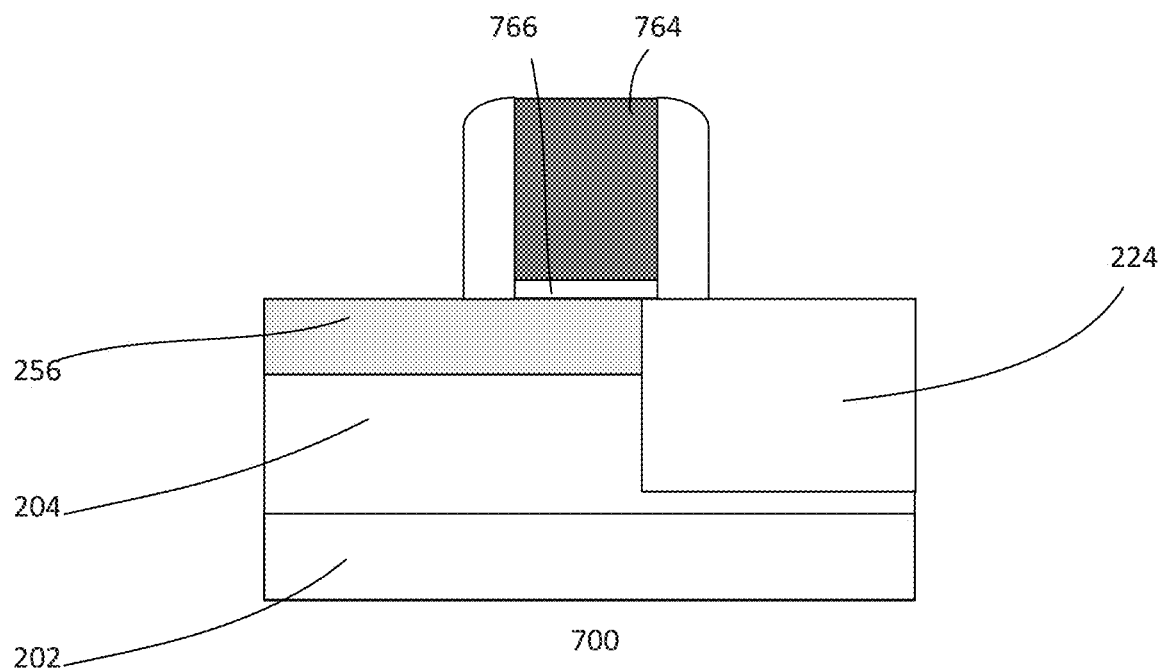

The process continues to form a gate or dummy gate having dummy gate electrode 764 and gate dielectric 766 and spacers 268. The materials and techniques for forming the dummy gate and spacers 268 are the same as that described in FIG. 5c, except that the dummy gate is patterned such that one side of the dummy gate and its adjacent spacer are formed over a portion of the isolation region 224 as shown in FIG. 7c. In one embodiment, the second side of the dummy gate is substantially aligned with the edge of the STI region adjacent to the region of the second polarity type 256. Providing the second side of the dummy gate which partially overlaps the STI region 224 may also be useful.

Figure 7D:
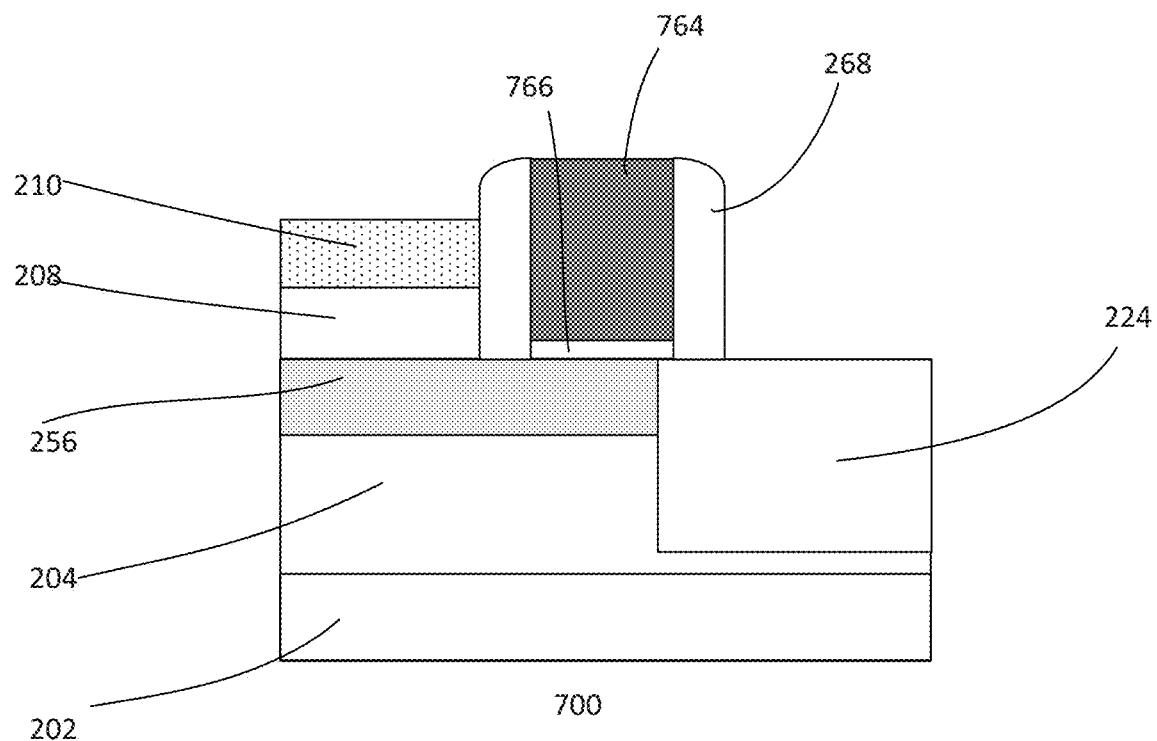

Referring to FIG. 7d, the process continues to integrate a thyristor structure in MOS processing. In one embodiment, the process forms a thyristor structure which includes an elevated layer of the first polarity type 208 on the region of the second polarity type 256 and adjacent to a first side of the dummy gate. The process further forms a heavily doped layer of the second polarity type 210 on the first layer of the first polarity type 208 and adjacent to the first side of the dummy gate. The materials and techniques for forming the layer of the first polarity type 208 and the heavily doped layer of the second polarity type 210 are the same as that described in FIGS. 5d-5e. As shown, the layer of the first polarity type 208 and the layer of the heavily doped second polarity type 210 are selectively formed adjacent to the first side of the dummy gate and are self-aligned.

Figure 7E:
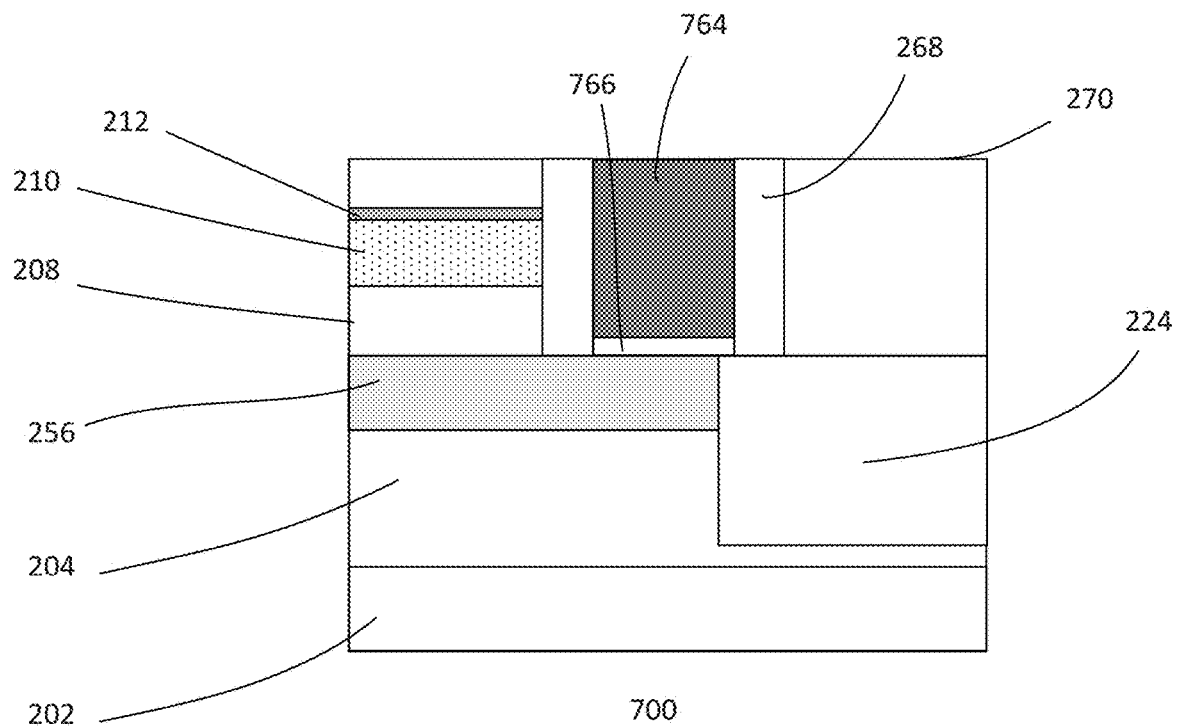

The process 700 continues to form silicide contact 212 over the heavily doped layer of the second polarity type 210 and an ILD layer 270 over the substrate, covering the dummy gate and top of the isolation region 224 as shown in FIG. 7e. The materials and techniques for forming the silicide contact 212 and the ILD 270 are the same as that described in FIGS. 5f-5g. As shown, the ILD layer is processed such that its top surface is substantially coplanar with the top surfaces of the dummy gate and spacers.

Figure 7F:
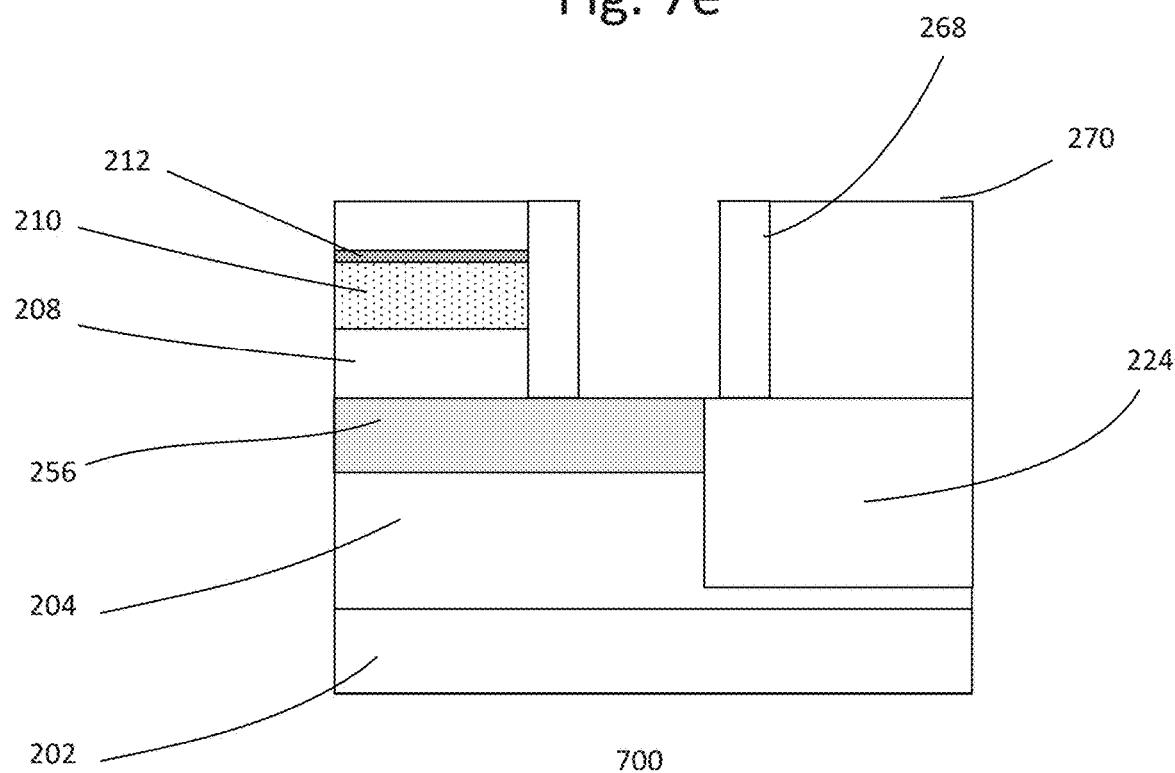
Figure 7G:
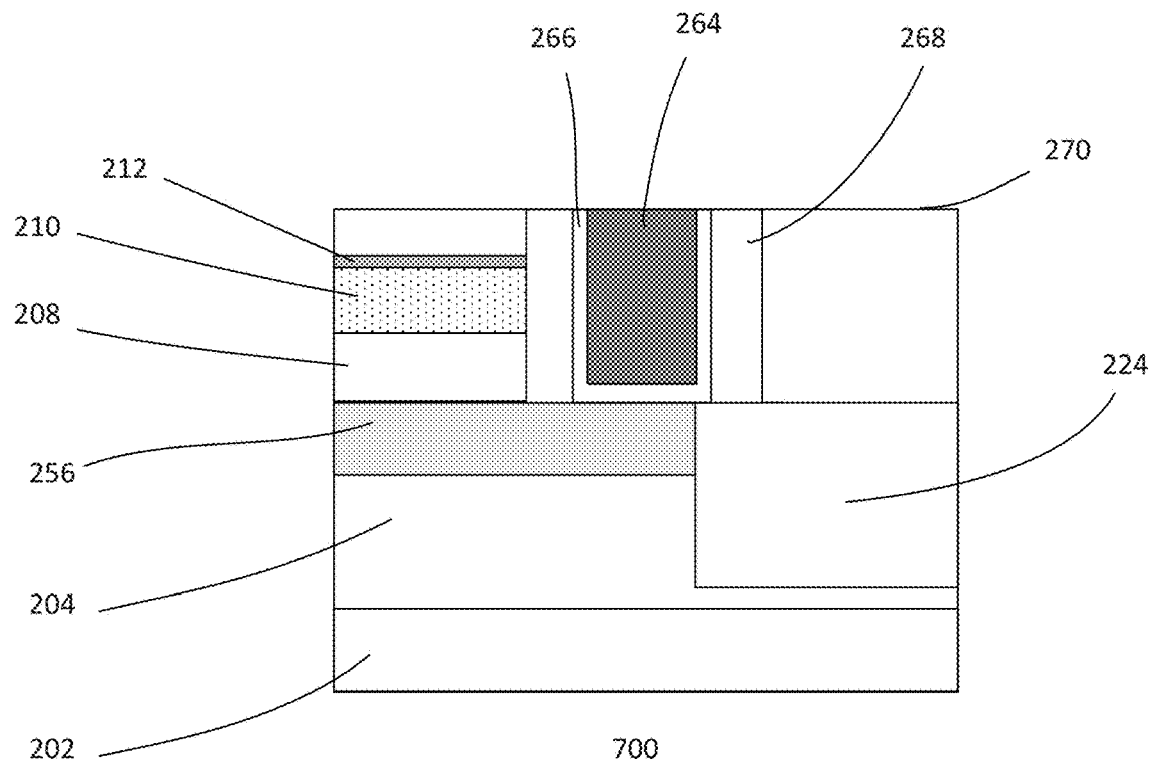
Figure 7H:
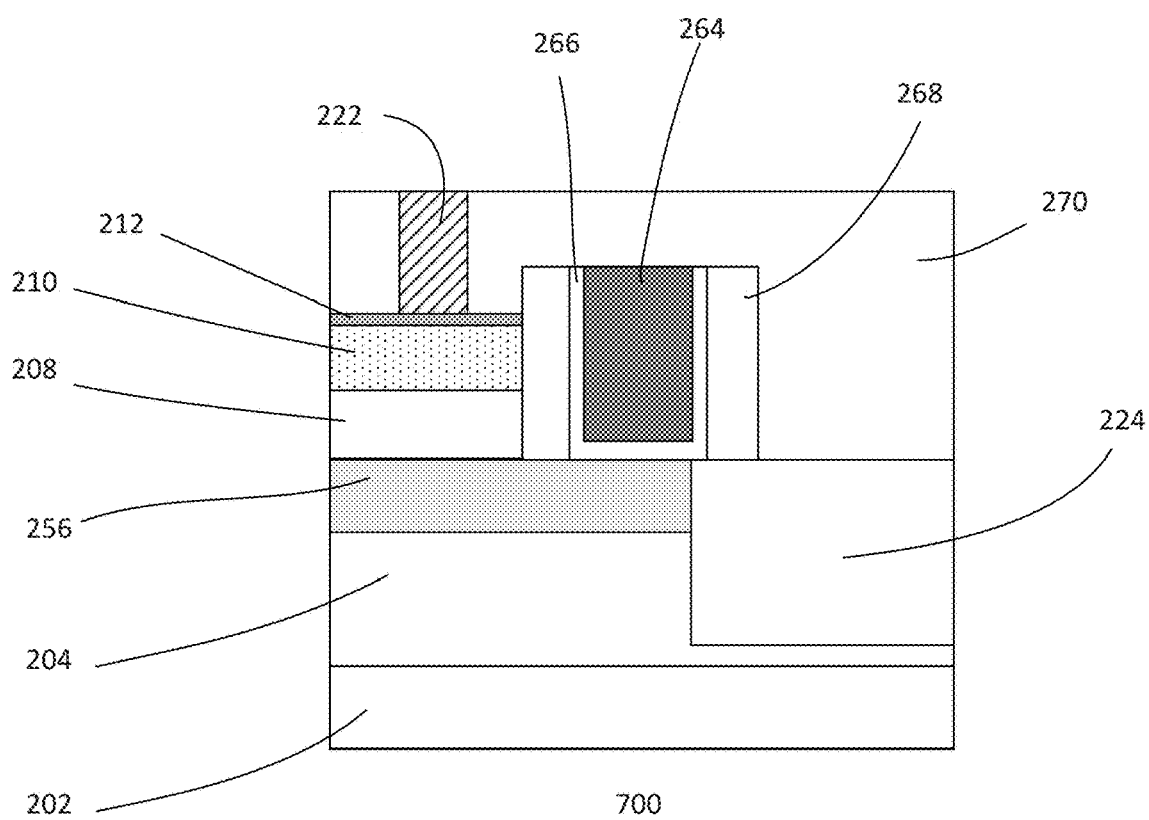

In one embodiment, the process may continue to form additional dielectric layer to form a pre-metal dielectric (PMD) layer in which contacts are formed to contact region of the substrate, followed by BEOL process. In another embodiment, as shown in FIG. 7f, the dummy gate is removed using techniques as described in FIG. 5h. The removal of the dummy gate exposes a portion of the top surface of the region of the second polarity type 256 and a portion of the isolation region 224 under the dummy gate. The process continues to form high-k metal gate structure having high k dielectric 266 and metal gate electrode 264 as illustrated in FIG. 7g. The materials and techniques for forming the high-k metal gate structure is the same as that described in FIG. 5i. The process may continue to complete the memory cell. For example, the process continues to form PMD layer, contact 222, etc., until a device shown in FIG. 7h is formed. As shown, the ILD layer 270 includes contact 222 that is coupled to the heavily doped layer of the second polarity type 210 of the T-RAM. Additional processes may be performed, including forming one or more interconnect levels, final passivation, dicing, assembly and packaging. Techniques and materials of these features are the same as that already described in FIG. 5j. As such, details of these steps will not be described.

FIGS. 8a-8e show cross-sectional views of an embodiment of a process 800 for forming a device in accordance with another embodiment of the present disclosure. In one embodiment, the process 800 forms the device 200 of FIG. 2a. The device 200 is similar to the device 250 and the process 800 may be similar to the process 700 and may contain similar steps as that described in FIGS. 5a-5j. In the interest of brevity, common elements may not be described or described in detail.

Figure 8A:
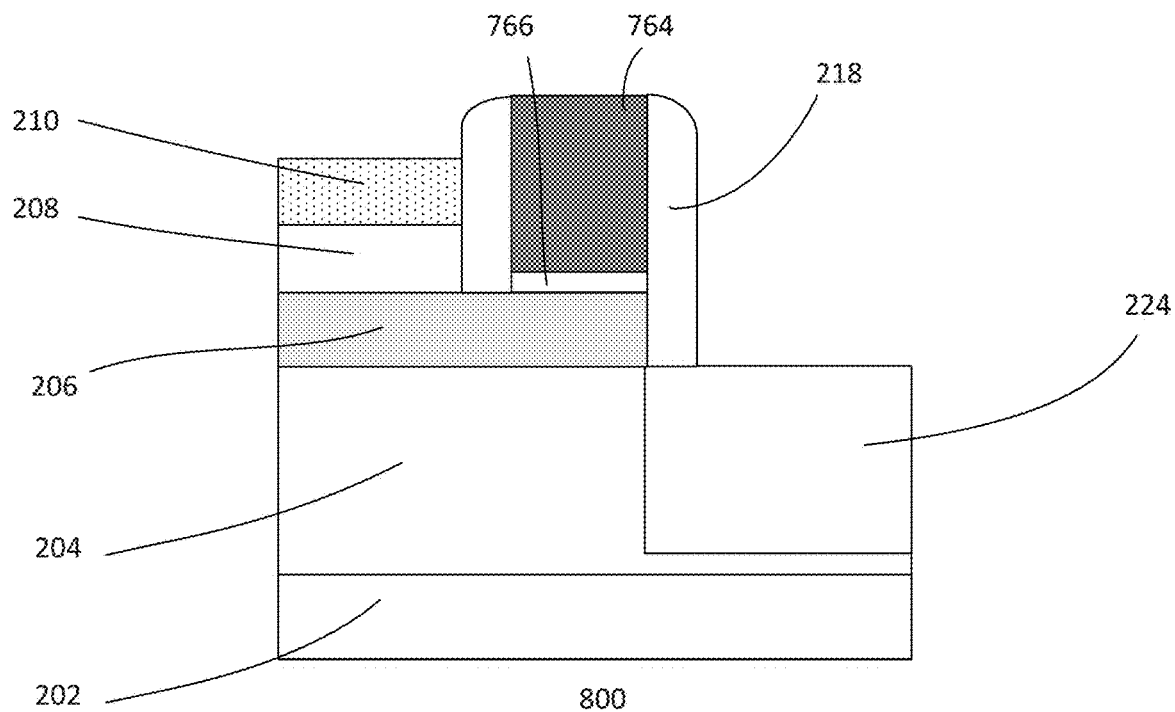
FIGS. 8a-8e show cross-sectional views of an embodiment of a process for forming a device in accordance with yet another embodiment of the present disclosure.

As shown in FIG. 8a, a partially processed substrate similar to that described in FIG. 7d is provided. In one embodiment, instead of forming a region of the second polarity type 256 in the well 204, the process 800 forms a region of the second polarity type 206 over the substrate as shown in FIG. 8a. The region of the second polarity type 206, in one embodiment, is formed by SEG process. The epitaxial layer 206, in one embodiment, is in-situ doped with second polarity type dopants, such as p-type dopants. Doping the epitaxial layer with second polarity type dopants by ion implantation may also be useful. The region of the second polarity type, in some embodiments, may also include a BE region. The process 800 continues to form the dummy gate and sidewall spacers 218 may be formed over the first and second gate sidewalls. The sidewall spacers are formed using the same material and technique as already described in FIG. 5c. As shown in FIG. 8a, the first sidewall spacer adjacent to the first gate sidewall extends to the top surface of the region of the second polarity type 206 while the second sidewall spacer adjacent to the second gate sidewall and sidewall of the second polarity type 206 extends to the top of the STI region 224.

Figure 8B:
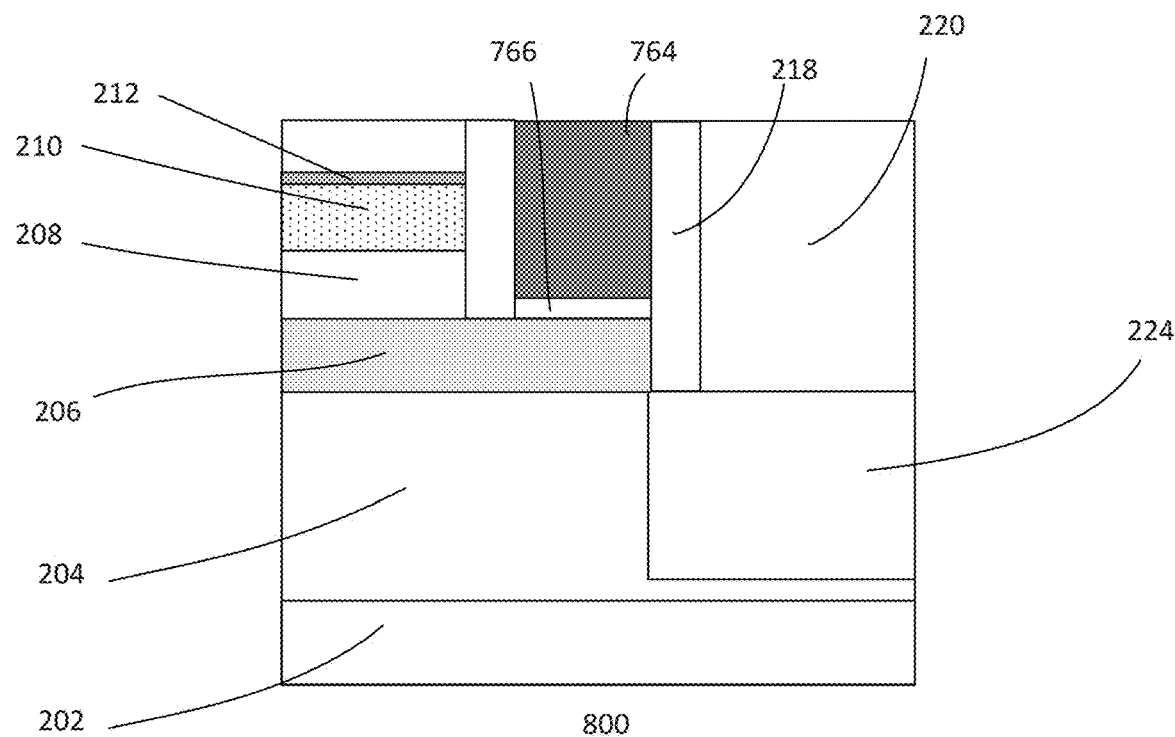

The process 800 continues to form elevated layers of the first polarity type 208 and the heavily doped layer of the second polarity type 210 on the region of the second polarity type 206 and adjacent to a first side of the dummy gate as shown in FIG. 8a. Silicide contact 212 is formed over the heavily doped layer of the second polarity type 210 and an ILD layer 270 is formed over the substrate and is processed as shown in FIG. 8b. Materials and techniques for forming these layers are the same as that described in FIGS. 7d-7e.

Figure 8C:
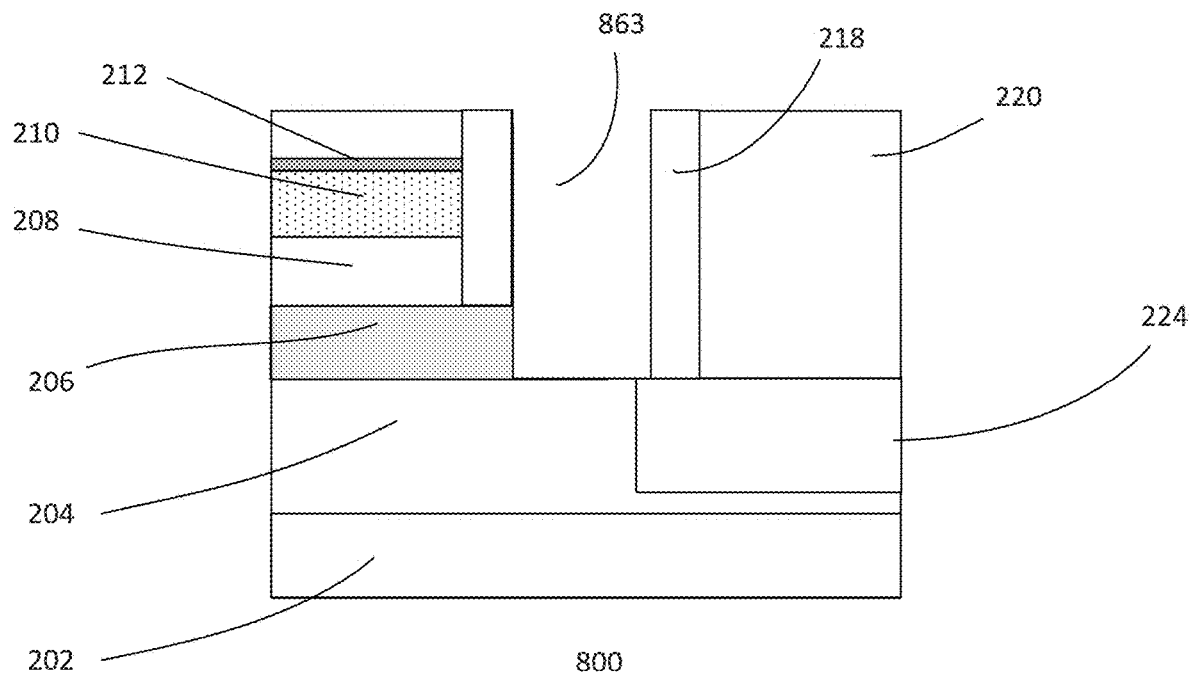

Referring to FIG. 8c, the dummy gate structure is removed using techniques as described in FIG. 5h. Other suitable techniques may also be employed to remove the dummy gate. The removal of the dummy gate exposes a portion of the top surface of the region of the second polarity type 206. The process continues to form a trench 863 within a portion of the region of the second polarity type 206 under the dummy gate. A mask and etch process is employed to remove a portion of the region of the second polarity type 206 to form the trench 863. For example, the trench is formed by RIE. The sides of the trench, for example, are self-aligned to the inner sides of the spacers 218. As shown, the depth of the trench is about equal to the depth of the region of second polarity type 206. Providing other depths or configurations may also be useful.

Figure 8D:
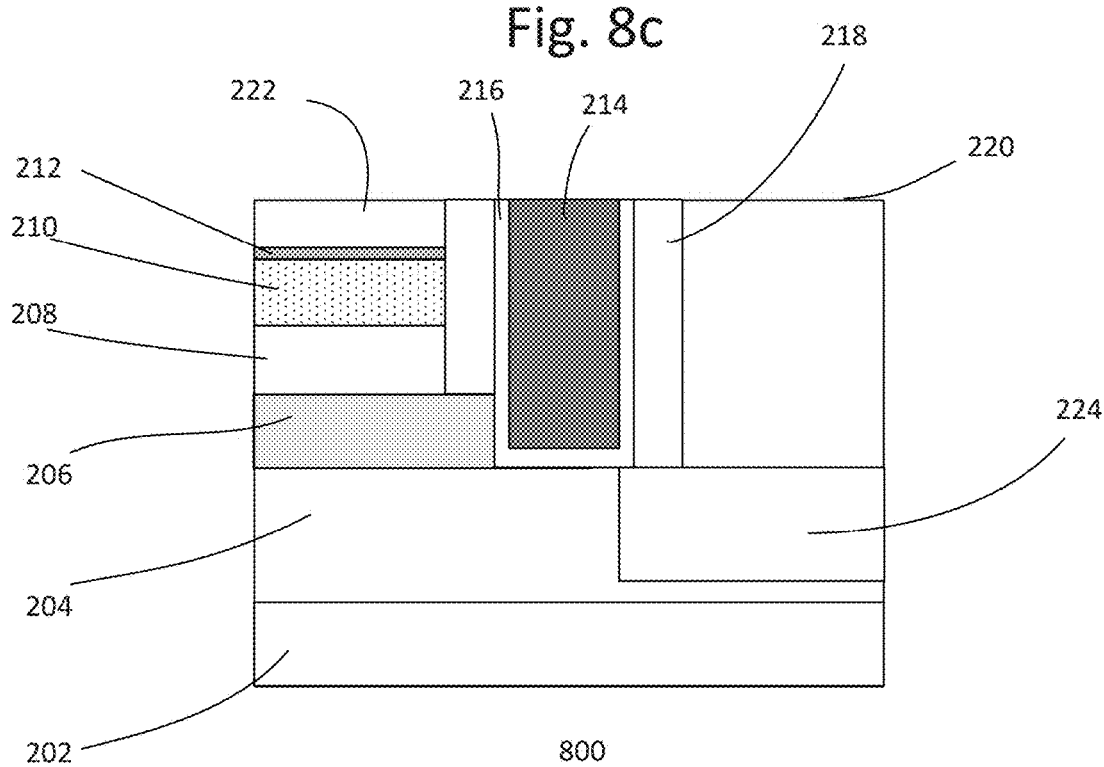
Figure 8E:
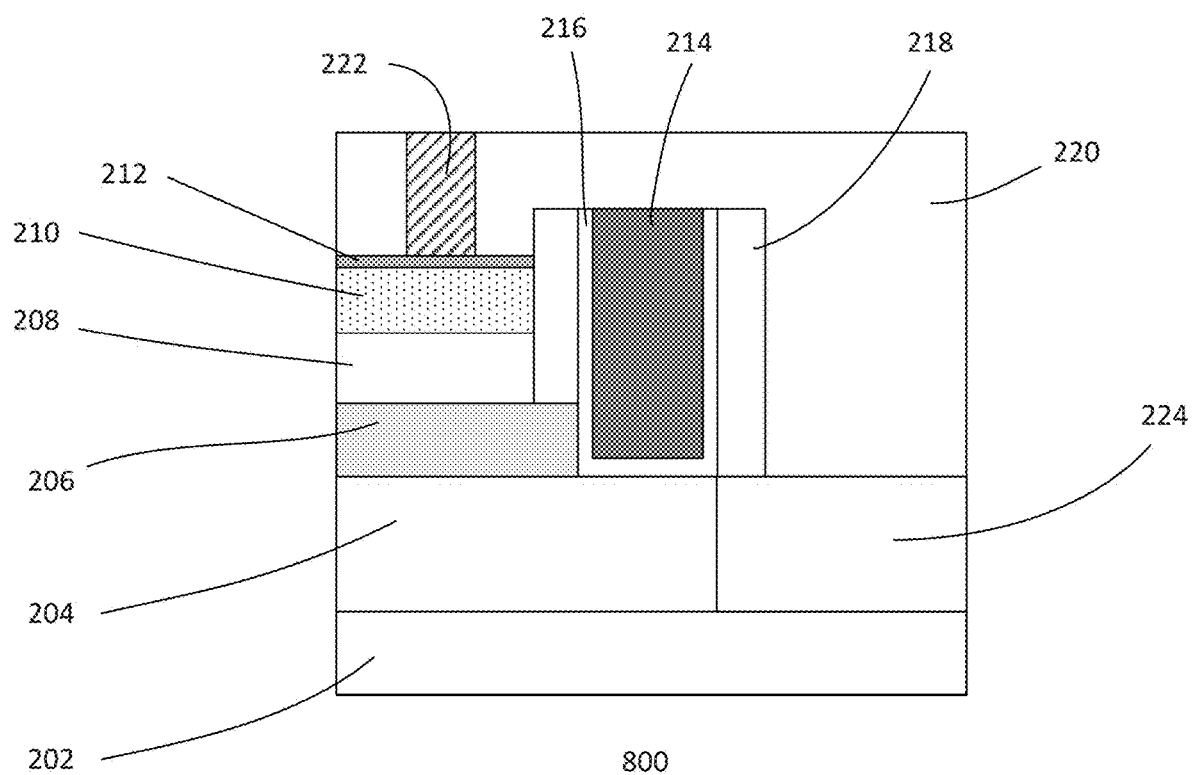

Referring to FIG. 8d, the process continues to form a high-k metal gate structure. The materials and techniques for forming the high-k metal gate structure is the same as that described in FIG. 5i. The process may continue to complete the memory cell. For example, the process continues to form PMD layer, contact 222, etc., until a device shown in FIG. 8e is formed. Additional processes may be performed, including forming one or more interconnect levels, final passivation, dicing, assembly and packaging. Techniques and materials of these features are the same as that already described in FIG. 5j. As such, details of these steps will not be described.

FIGS. 9a-9h show cross-sectional views of an embodiment of a process 900 for forming a device in accordance with yet another embodiment of the present disclosure. In one embodiment, the process 900 forms the device 300 of FIG. 3a. In forming the device 300, the process 900 forms first and second thyristor structures integrated with fin-type MOS processing. The process 900 may contain similar steps as that described in FIGS. 5a-5j. In the interest of brevity, common elements may not be described or described in detail.

Figure 9A:
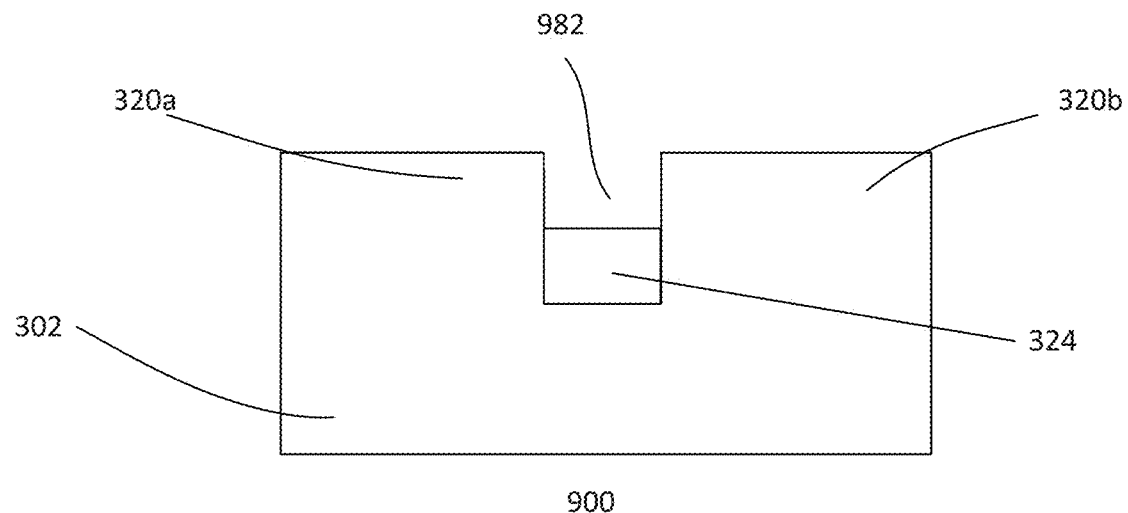
FIGS. 9a-9h show cross-sectional views of an embodiment of a process for forming a device in accordance with yet another embodiment of the present disclosure.

Referring to FIG. 9a, a substrate 302 is provided. The substrate may be a silicon substrate. The substrate may be lightly doped with second polarity type dopants, for example, p-type dopants. Providing other types of substrates, including SiGe, Ge and group III-V semiconductors such as GaAs, InP and InAs, including substrates doped with other types of dopants or undoped substrates, are also useful. The substrate may be prepared with a device region. In one embodiment, the device region serves as a region for fin-type transistors. Although the substrate is described with one device region, it is understood that the substrate may include numerous device regions (not shown). The numerous device regions may include different types of device regions.

Referring to FIG. 9a, the substrate is processed to form a plurality of fin structures. For illustration purpose, the substrate is processed to form first and second fin structures 320a/320b. It is understood that the substrate may be processed to form more than two fin structures. The height of the fin, for example, may be about 10-200 nm. As for the width, it may be about 3-500 nm. Other suitable fin dimensions may also be useful.

Forming the fin structures 320a/320b may be achieved using various methods. The fin structures, for example, may be formed by patterning the substrate. For example, a patterned hard mask (not shown) is formed over the substrate. In one embodiment, a hard mask layer (not shown), such as silicon oxide or silicon nitride, is formed on the substrate 302. Other suitable types of materials which are selective to the isolation layer as will be described later may also be used as the hard mask layer. The hard mask layer may be formed by chemical vapor deposition (CVD). Other suitable types of hard mask or techniques for forming the hard mask may also be useful.

The hard mask layer is patterned to correspond to the shape of the fin structures. The patterning of the hard mask layer can be achieved by mask and etch techniques. For example, a patterned soft mask (not shown), such as photoresist, may be used as an etch mask to pattern the hard mask layer. The soft mask may be patterned by photolithography. To improve lithographic resolution, an ARC (not shown) may be provided beneath the photoresist. The pattern of the photoresist mask is transferred to the hard mask by, for example, an anisotropic etch, such as a reactive ion etch (RIE). The soft mask is removed. An anisotropic etch, such as a RIE, is performed to remove portions of the substrate surface unprotected by the hard mask, leaving fin structures 320a/320b as described above disposed on the top surface of the substrate. Other suitable methods may also be employed to form the fin structure. The hard mask (not shown), remains on the top surface of the fin.

The process continues to form the isolation layer or region 324. An isolation layer, such as a dielectric layer which includes a silicon oxide layer, is formed over the substrate covering the fin structure. Other suitable types of dielectric layer may also be useful. The isolation layer, for example, may be formed over the substrate using chemical vapor deposition (CVD) or high aspect ratio process (HARP). Other techniques for forming the isolation layer may also be useful. In one embodiment, a polishing process, such as a chemical mechanical polishing process (CMP) is performed to planarize the isolation layer to the top surface of the hard mask over the fin structures. A removal process, such as selective to the isolation layer which includes oxide material, is performed to remove or recess portions of the oxide to form the isolation region 324 and a gap or opening 982 between the fin structures as shown in FIG. 9a. The removal process may include dry etch, wet etch or a combination thereof. The isolation layer, for example, has a height or thickness sufficient to provide isolation from the substrate below. The thickness of the isolation layer, for example, may be about 10-500 nm. Other suitable thickness ranges may also be useful.

Figure 9B:
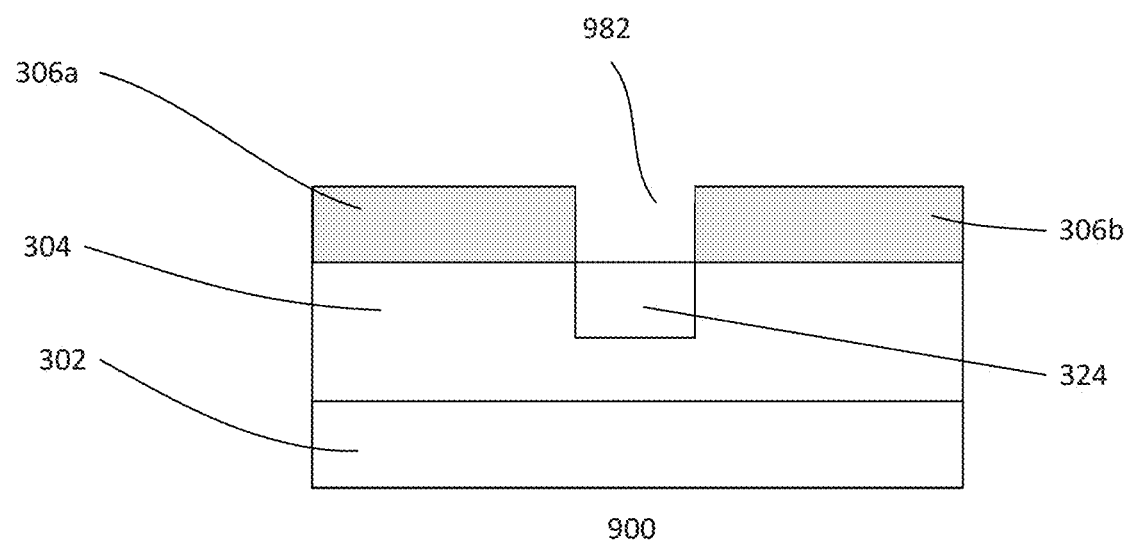

A well 304 is formed in the substrate as shown in FIG. 9b. The well, in one embodiment, includes first polarity type dopants. For example, first polarity type dopants are implanted into the substrate. A well implant mask may be used. The well implant mask may be the same mask used to form first polarity type wells in fin-type MOS processes. The well may be lightly or intermediately doped with first polarity type dopants. The well may be formed by ion implantation with dopant concentration of about $10^{16}$ cm$^{-3}$ to $10^{18}$ cm$^{-3}$ and includes a depth below the bottom of the isolation region 324.

In one embodiment, the process continues to form regions of second polarity type 306a/306b in the fin structures 320a/320b. The regions 306a/306b include lightly doped second polarity type dopants. To form the lightly doped regions, second polarity type dopants, such as p-type dopants, are implanted into the fin structures. The depth of the lightly doped regions, for example, may be about the height of the fin structures. Other suitable depth dimensions may also be useful, depending on technology node. The dopant concentration may be about $10^{16}$ cm$^{-3}$ to $10^{18}$ cm$^{-3}$. Other suitable dopant concentrations may also be useful. An implant mask which exposes the fin structures may be provided to perform the implant. The implant mask, for example, may be a photoresist layer. Other suitable types of implant masks may also be useful.

Figure 9C:
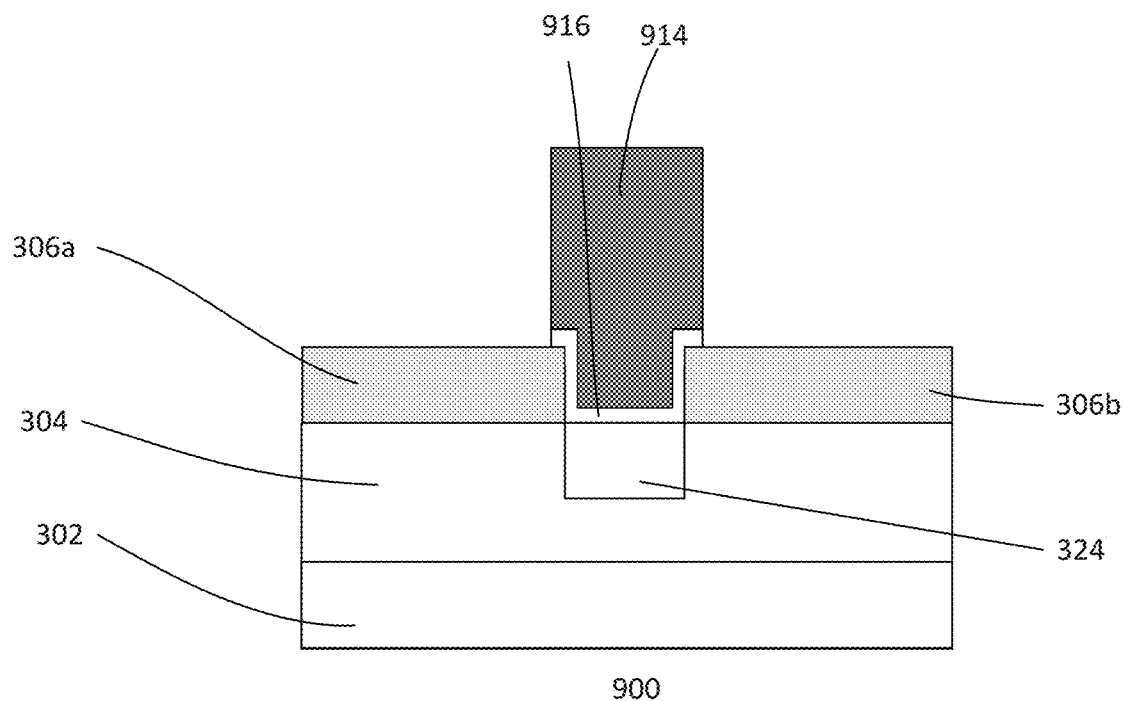

The process continues to form a gate or dummy gate having dummy gate dielectric 916 and dummy gate electrode layer 914. The materials and techniques for forming the dummy gate structure is the same as that described in FIG. 5b. As shown in FIG. 9c, the dummy gate structure is formed in the opening 982 between the fin structures. The dummy gate dielectric and dummy gate electrode layers are formed over the substrate as well as in the opening 982 and are patterned as shown in FIG. 9c.

In an alternate embodiment, the regions of second polarity type 306a/306b are BE regions. In such case, the fin structures may not be lightly doped with second polarity type dopants as described earlier in FIG. 9b. To form BE regions having second polarity type 306a/306b, the fin structures may be removed via suitable etch techniques and followed by, for example, selective epitaxial growth (SEG) process, filling the spaces or recesses. The BE regions 306a/306b, in one embodiment, are SiGe BE regions as shown in FIG. 9c. In one embodiment, the BE regions are lightly doped with second polarity type dopants. Other suitable types of BE regions may also be useful. In yet another embodiment, instead of removing the fin structures and then form the BE regions, the BE regions 306a/306b may be formed by epitaxially growing an epitaxial layer on a blanket or planar substrate and then etch the epitaxial layer to form the fin structures.

Figure 9D:
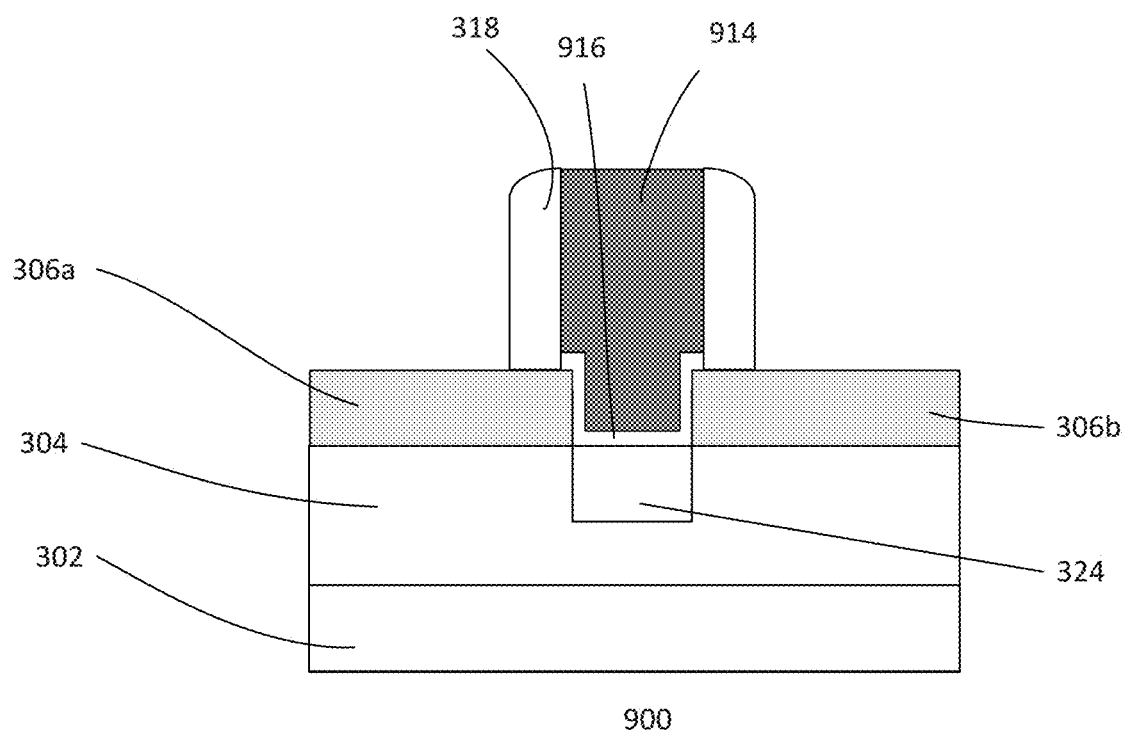

Referring to FIG. 9d, sidewall spacers 318 are formed over the first and second sidewalls of the dummy gate. The materials and technique for forming the spacers 318 are the same as that described in FIG. 5c.

Figure 9E:
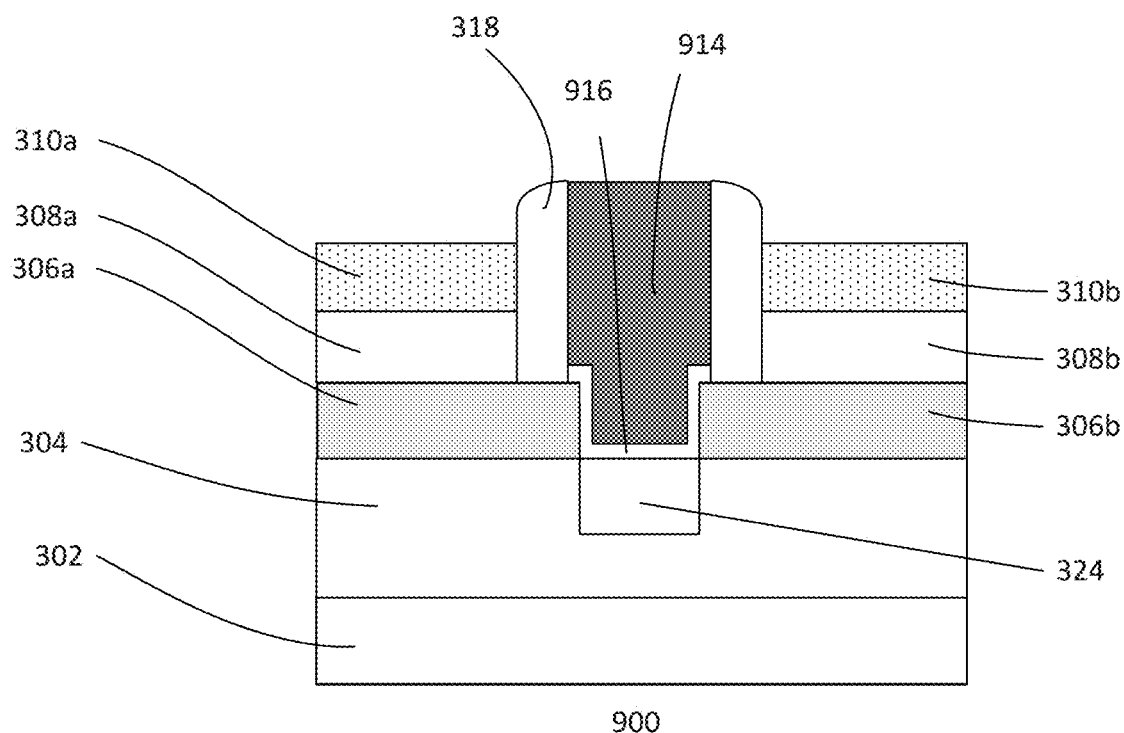

The process continues to form the first and second thyristor structures. In one embodiment, the process continues to form elevated first and second layers of the first polarity type 308a/308b over the first and second regions of the second polarity type 306a/306b as shown in FIG. 9e. The materials and techniques for forming the elevated self-aligned first and second layers of the first polarity type 308a/308b are the same as that described in FIG. 5d. Self-aligned first and second heavily doped second polarity type layers 310a/310b are formed on the first and second layers of the first polarity type 308a/308b. The materials and techniques for forming the heavily doped second polarity type layers 310a/310b are the same as that described in FIG. 5e.

Figure 9F:
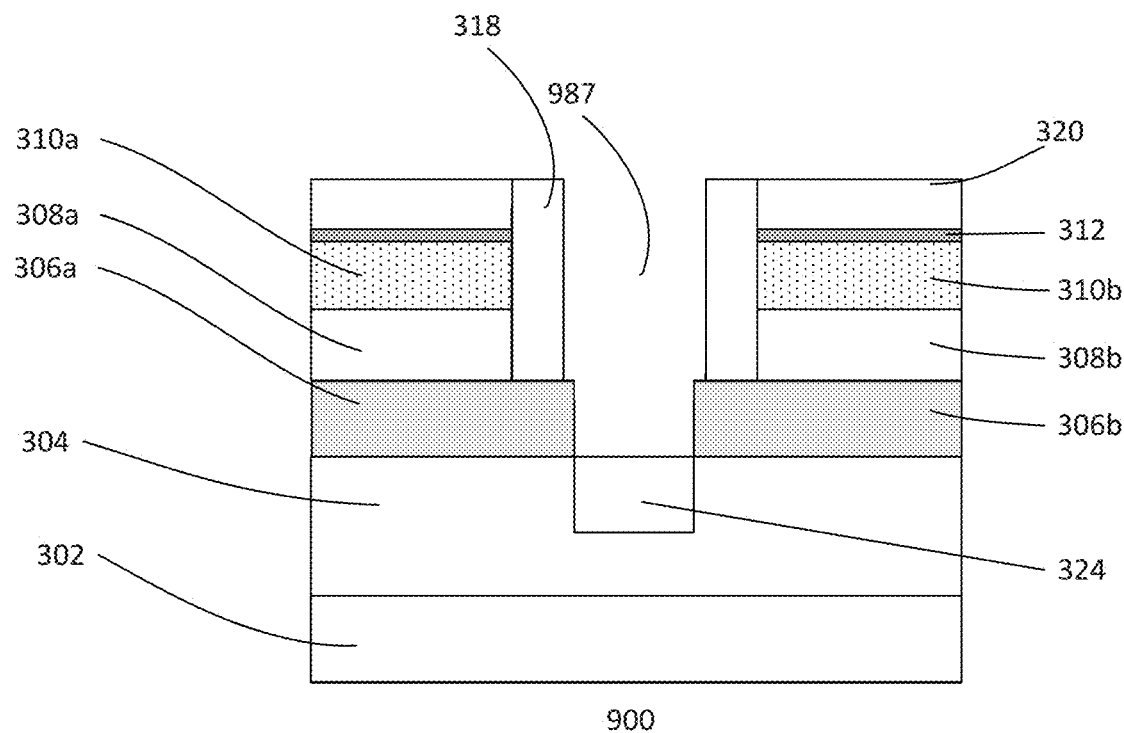

The process may continue to complete the 2 T-RAM or two-bits-per-cell structure. Referring to FIG. 9f, silicide contacts 312 may be formed on the heavily doped first and second layers of the second polarity type 310a/310b. An ILD layer 320 is formed over the substrate. The silicide contacts 312 and ILD layer 320 and the techniques for forming these layers are the same as that described in FIGS. 5f-5g. A substantially coplanar surface between the top surface of the dummy gate, sidewall spacers 318 and ILD layer 320 is achieved.

In one embodiment, the process may continue to form additional dielectric layer to form a pre-metal dielectric (PMD) layer in which contacts are formed to contact region of the substrate, followed by BEOL process. In an alternate embodiment as shown in FIG. 9f, the dummy gate is removed. The dummy gate is removed using techniques as described in FIG. 5h. The removal of the dummy gate forms an opening 987 which exposes top surface of the isolation region 324 as well as inner sides of the spacers 318 away from the ILD layer 320 and inner sides of the first and second regions of the second polarity type 306a/306b.

Figure 9G:
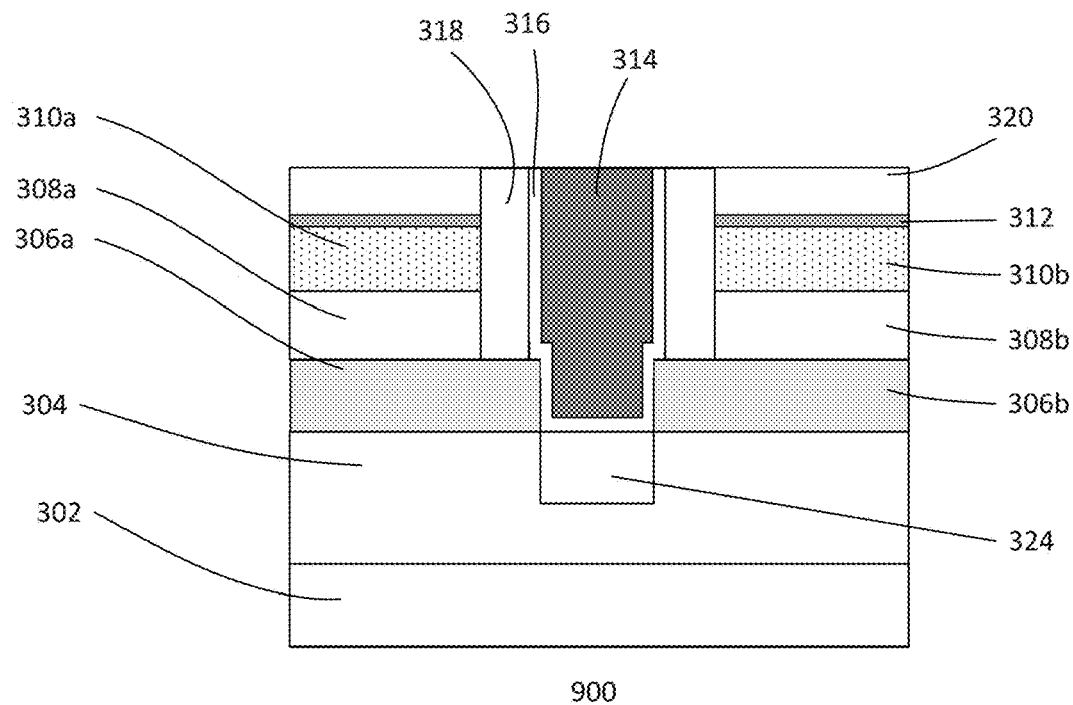

The process continues by forming a high-k metal gate structure as shown in FIG. 9g. The high-k metal gate structure includes a gate dielectric 316 and a gate electrode 314. The materials and techniques for forming the high-k metal gate structure are the same as that described in FIG. 5i.

Figure 9H:
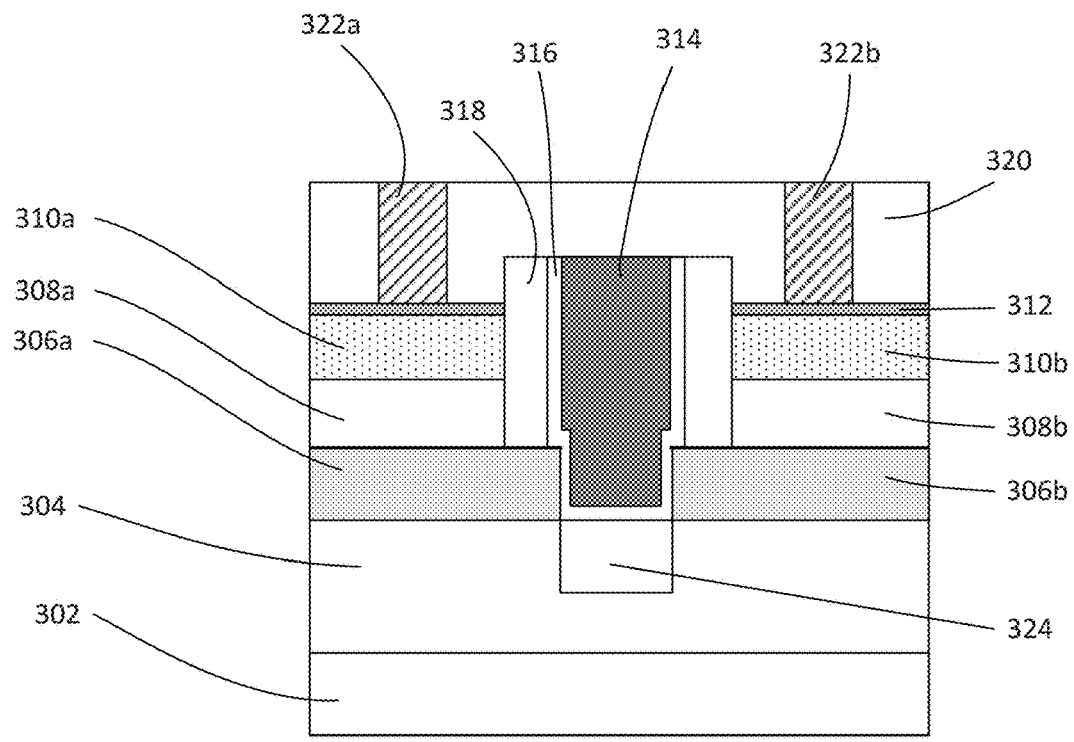

The process may continue to complete the memory cell. For example, the process continues to form PMD layer, contacts 322a/322b, etc., until a device shown in FIG. 9h is formed. The first contact 322a is configured to be coupled to a first bit line of the device while the second contact 322b is configured to be coupled to a second bit line of the device 300. Additional processes may be performed, including forming one or more interconnect levels, final passivation, dicing, assembly and packaging. Techniques and materials of these features are the same as that already described in FIG. 5j. As such, details of these steps will not be described.

FIGS. 10a-10d show cross-sectional views of an embodiment of a process 1000 for forming a device in accordance with another embodiment of the present disclosure. In one embodiment, the process 1000 forms the device 350 of FIG. 3b. As the process 1000 of forming the device 350 is similar to the process 900 of forming the device 300 and may include similar steps described in FIGS. 5a-5j, in the interest of brevity, the description below focuses on the differences between process 1000 and process 900.

Figure 10A:
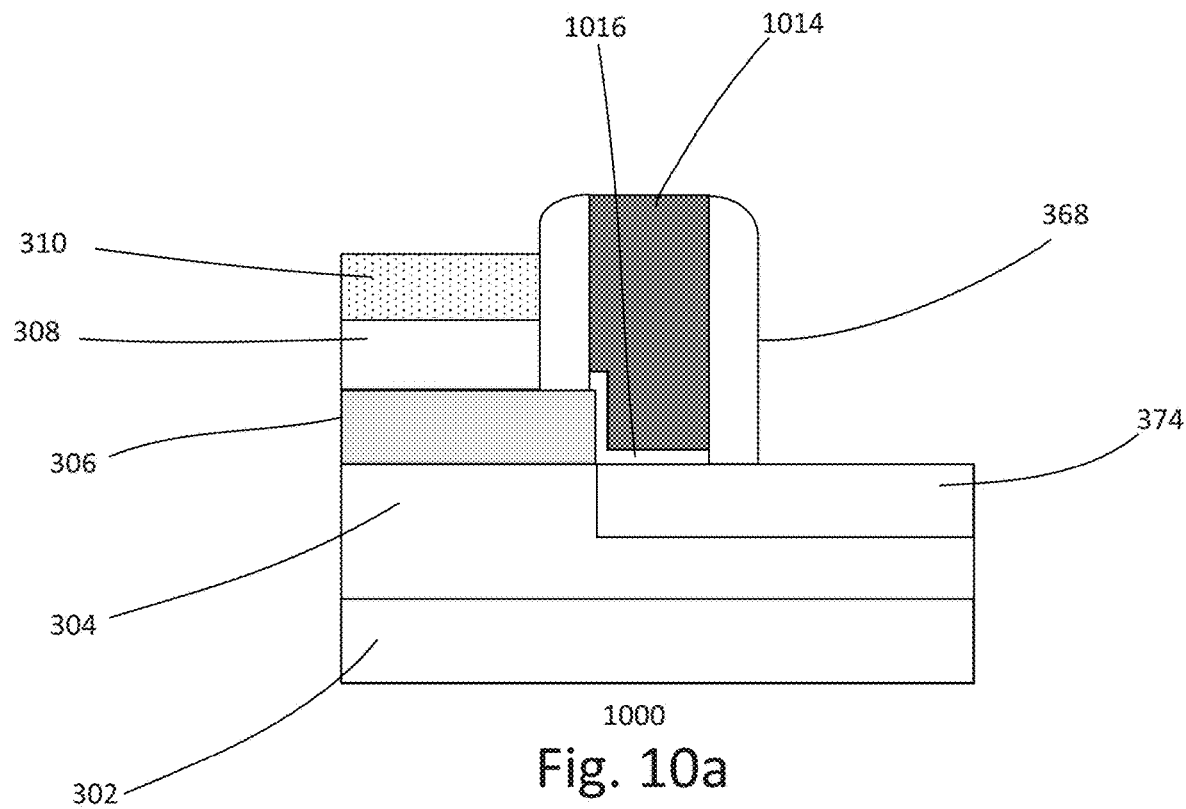
FIGS. 10a-10d show cross-sectional views of an embodiment of a process for forming a device in accordance with yet another embodiment of the present disclosure.

As shown in FIG. 10a, a partially processed substrate similar to that described in FIG. 9e is provided. In one embodiment, instead of forming two fin structures or two regions of the second polarity type 306a/306b, the process 1000 forms a fin structure or a region of the second polarity type 306 while the gate dielectric and electrode layers 1016 and 1014 of the dummy gate are patterned in such a way such that the dummy gate overlaps the STI region 374 and partially overlaps the region of the second polarity type over the substrate as shown in FIG. 10a. The region of the second polarity type 306, for example, may include a BE region. The process 1000 continues to form sidewall spacers 368 over the first and second gate sidewalls. The sidewall spacers are formed using the same material and technique as already described in FIG. 5c. As shown in FIG. 10a, the first sidewall spacer adjacent to the first gate sidewall extends to the top surface of the region of the second polarity type 306 while the second sidewall spacer adjacent to the second gate sidewall extends to the top of the STI region 374.

Figure 10B:
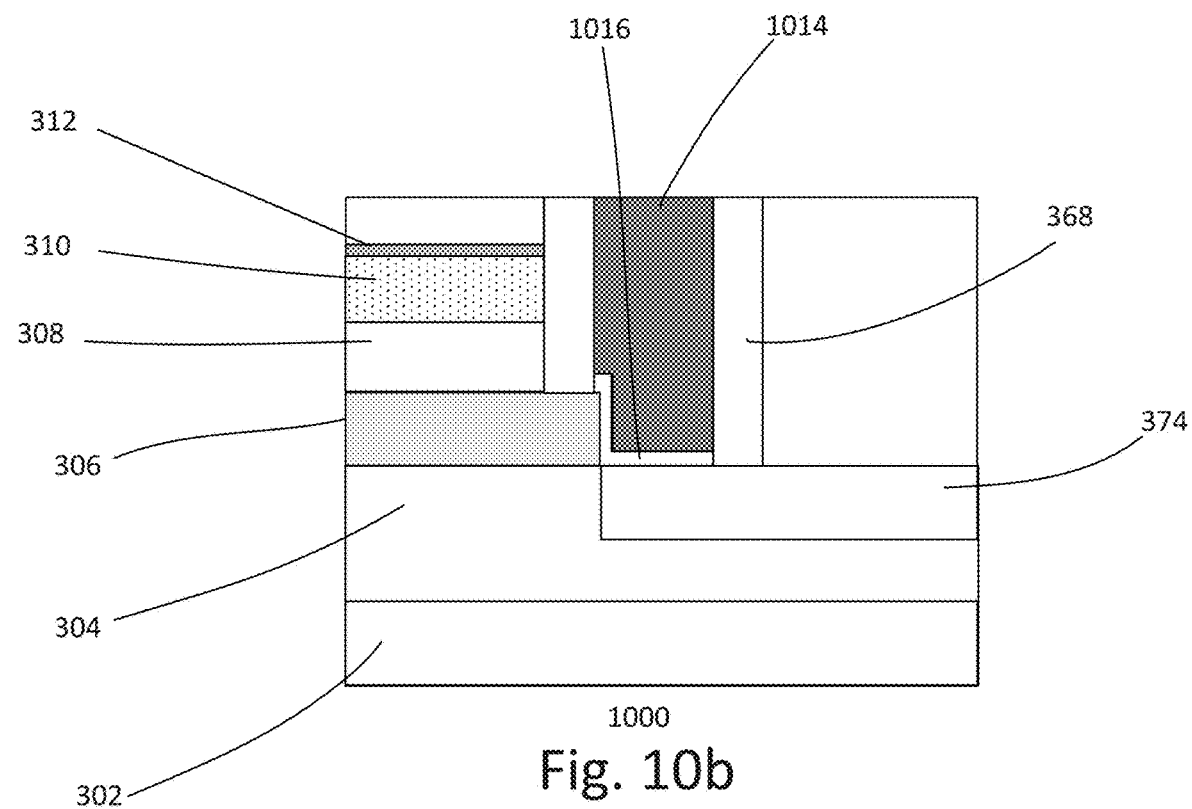

The process 1000 continues to form elevated layers of the first polarity type 308 and the heavily doped layer of the second polarity type 310 on the region of the second polarity type 306 and adjacent to a first side of the dummy gate as shown in FIG. 10a. Silicide contact 312 is formed over the heavily doped layer of the second polarity type 310 and an ILD layer 370 is formed over the substrate and is processed as shown in FIG. 10b. Materials and techniques for forming these layers are the same as that described in FIGS. 9e-9f.

Figure 10C:
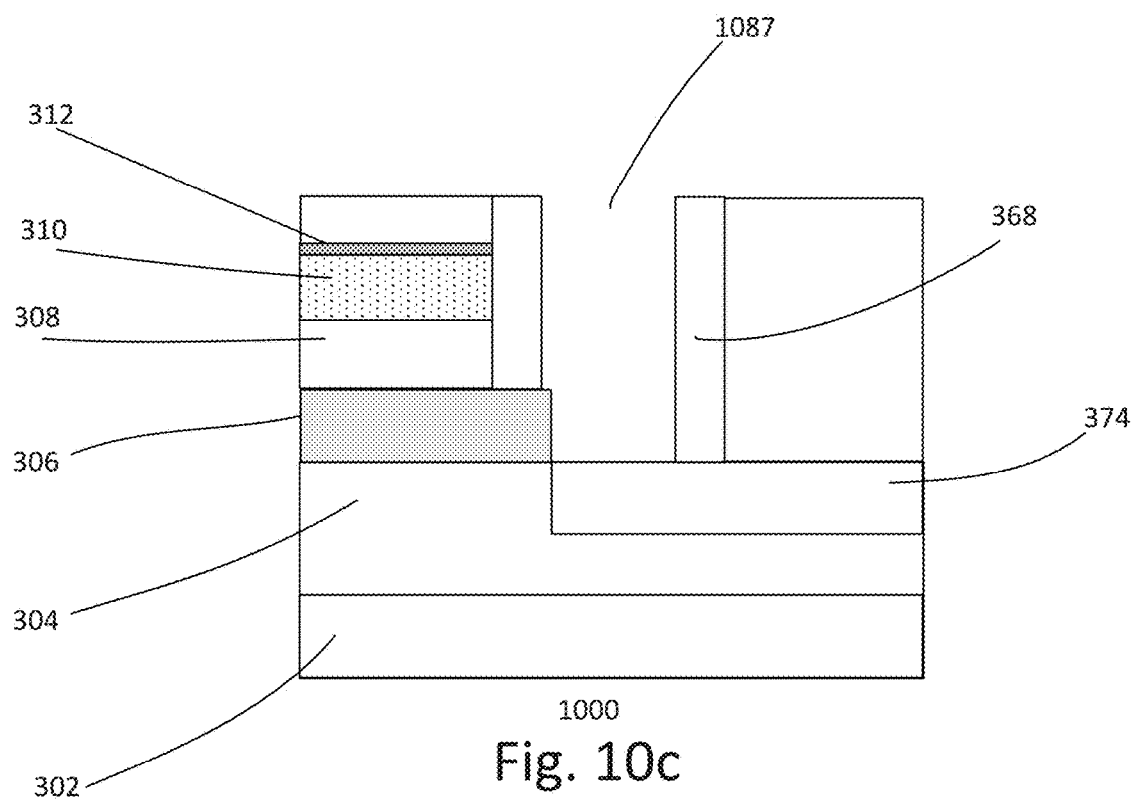

Referring to FIG. 10c, the dummy gate structure is removed using techniques as described in FIG. 5h. Other suitable techniques may also be employed to remove the dummy gate. The removal of the dummy gate forms an opening 1087, exposing a portion of the top surface of the region of the second polarity type 306 and a portion of the top surface of the STI region 374.

Figure 10D:
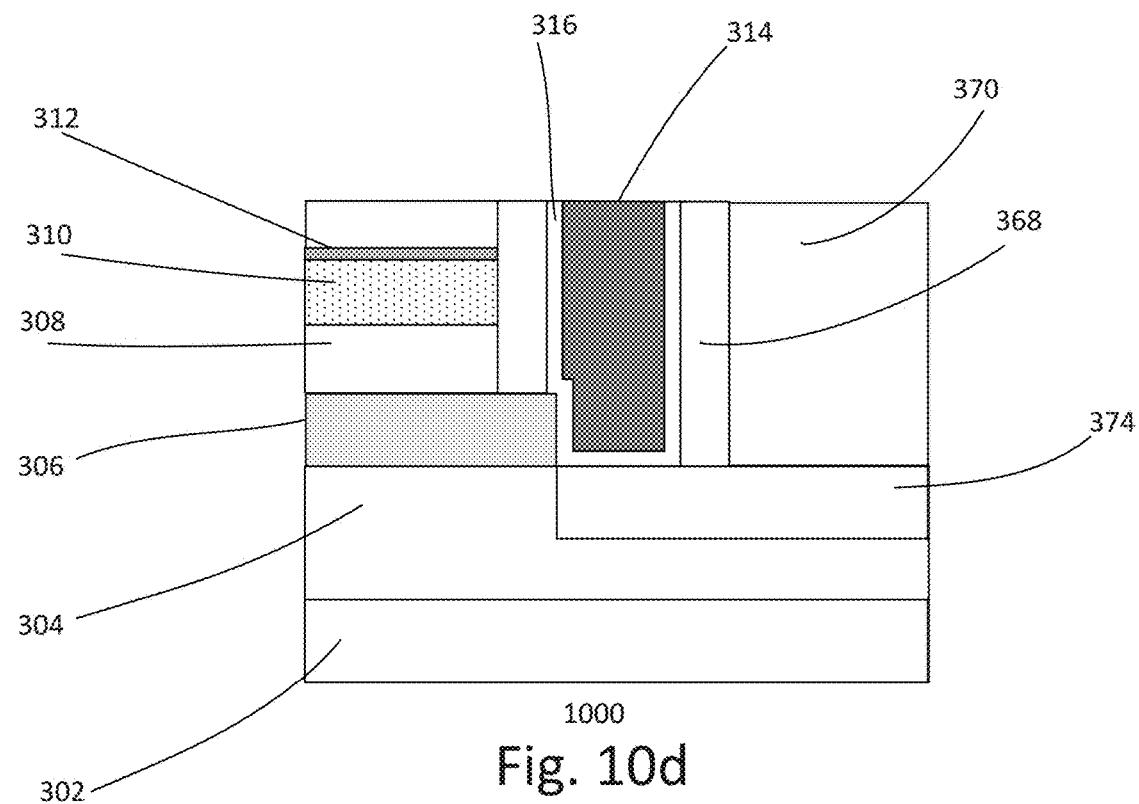

Referring to FIG. 10d, the process continues to form a high-k metal gate structure. The high-k metal gate structure includes a gate dielectric 316 and a gate electrode 314. The materials and techniques for forming the high-k metal gate structure are the same as that described in FIG. 5i. The process may continue to complete the memory cell. For example, the process continues to form PMD layer, contact 322, etc., until a device shown in FIG. 10d is formed. Additional processes may be performed, including forming one or more interconnect levels, final passivation, dicing, assembly and packaging. Techniques and materials of these features are the same as that already described in FIG. 5j. As such, details of these steps will not be described.

FIGS. 11a-11f show cross-sectional views of an embodiment of a process 1100 for forming a device in accordance with yet another embodiment of the present disclosure. In one embodiment, the process 1100 forms the device 400 of FIG. 4a. The process 1100 may contain similar steps as that described in FIGS. 5a-5j. In the interest of brevity, common elements may not be described or described in detail.

Figure 11A:
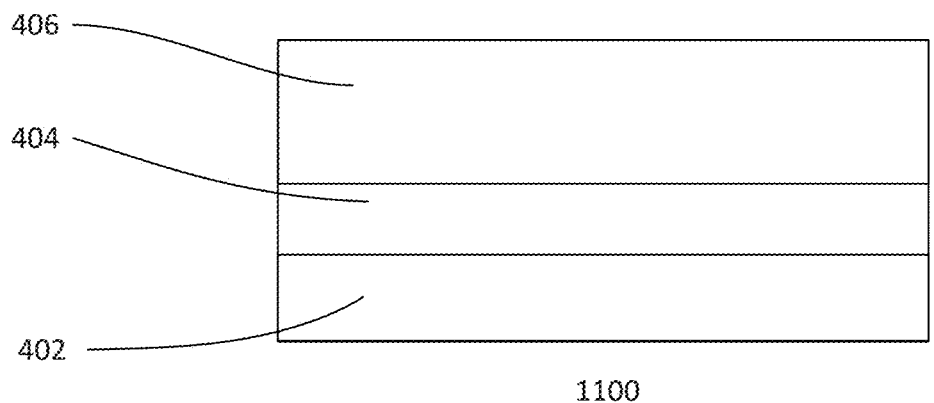
FIGS. 11a-11f show cross-sectional views of an embodiment of a process for forming a device in accordance with yet another embodiment of the present disclosure.

Referring to FIG. 11a, a substrate 402 is provided. The substrate 402 is the same as the substrate as described in FIG. 5a. For example, the substrate is lightly doped with second polarity type dopants. The second polarity type dopants, for example, include p-type dopants. Further, it is understood that the substrate may include a plurality of device regions. Isolation regions (not shown) are formed in the substrate 402. The isolation region serves to isolate the cell region from other device regions (not shown) for other types of devices. The isolation region, for example, is a shallow trench isolation (STI) region. Other types of isolation regions may also be useful. The STI regions (not shown) may be formed using various suitable techniques.

In one embodiment, the process continues to form a well 404. The well, in one embodiment, includes first polarity type dopants. Dopant concentrations and techniques for forming the first polarity type well 404 are the same as that described in FIG. 5a.

In an alternate embodiment, instead of forming the first polarity type well, the process continues to form a buried isolation buffer layer 404. In such case, the isolation buffer is an amorphized portion of the substrate 402. For example, in the case of a silicon substrate, the isolation buffer is an amorphized silicon (α-Si) layer. In one embodiment, amorphizing dopants are implanted into the substrate. The amorphizing dopants, for example, include silicon ions (Si+), germanium (Ge) or carbon (C) or a combination thereof. Alternatively, amorphizing dopants such as Ar or O and dopants such as B, P or As implanted by molecular or cluster implants may also be used. Other suitable types of amorphizing dopants may also be employed. The amorphizing dopants are implanted by, for example, high energy implantation (HEI). The HEI implant is performed at, for example, 160 KeV with a dose of about 5 e14-9 e14 atom/cm². Providing other suitable implant energies and doses may also be useful. Implanting the amorphizing ions by cold, molecular, or cluster implantation may also be useful. For example, lower energy requirements of molecular or cluster implantations may also be useful. The implant parameters, such as energy and dose, are tailored to produce isolation buffer layer at the desired location and have the desired effect. By adjusting the energy and dose of the implant, the location and thickness of the isolation buffer can be controlled. This also controls the thickness or height of the substrate surface.

An anneal may be performed after implanting the amorphizing dopants. The anneal, for example, includes laser anneal, rapid thermal anneal (RTA) or furnace anneal. Other suitable types of anneal technique may also be useful. Alternatively, amorphizing dopants may be activated during well or S/D region anneal process. In one embodiment, the top of the isolation buffer should have a depth sufficient to accommodate a body region of the transistor. For example, the top of the isolation buffer should be about 5-100 nm deep from the top surface of the substrate 402. The thickness of the isolation buffer should be sufficient to reduce substrate leakage. The thickness, for example, may be about 5-100 nm. Providing other suitable depths and thicknesses may also be useful.

Referring to FIG. 11a, in one embodiment, the area of the substrate between the top surface of the isolation buffer layer or first polarity type well 404, the isolation regions (not shown) and substrate top surface serves as a body region or floating body of a second polarity type 406 of the T-RAM. The body region, for example, may be part of the substrate and thus having the same doping as the substrate. For example, the body region is a lightly doped second polarity type region 406. An implantation process may optionally be performed to introduce the second polarity type dopants into the body region. The dopant concentration of the second polarity type, for example, is about $10^{16}$ cm$^{-3}$ to $10^{18}$ cm$^{-3}$. Other suitable dopant concentration may also be useful.

In an alternate embodiment, the body region 406 may not be part of the substrate. In such case, the process continues to form a BE body region 406 over the first polarity well or isolation buffer layer 404. The BE body region 406, in one embodiment, is a SiGe, Si:C or Ge BE body region. Other suitable types of BE materials may also be useful. The BE body region 406, for example, is formed by an epitaxial process. The epitaxial BE body, for example, is lightly doped with second polarity type dopants. The epitaxial BE body, for example, may be in-situ doped with second polarity type dopants. Other suitable techniques for forming the BE body may also be useful.

Figure 11B:
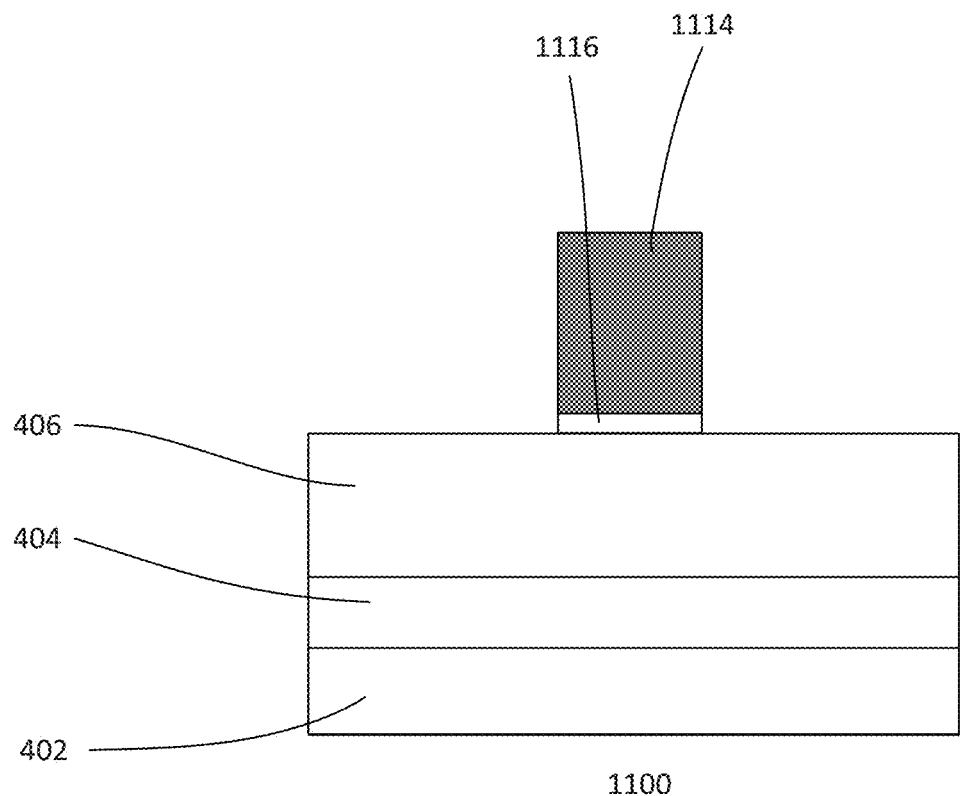

The process continues to form a gate or dummy gate having a dummy gate dielectric 1116 and dummy gate electrode 1114 as shown in FIG. 11b. The materials and techniques for forming the dummy gate are the same as that described in FIG. 5b.

Figure 11C:
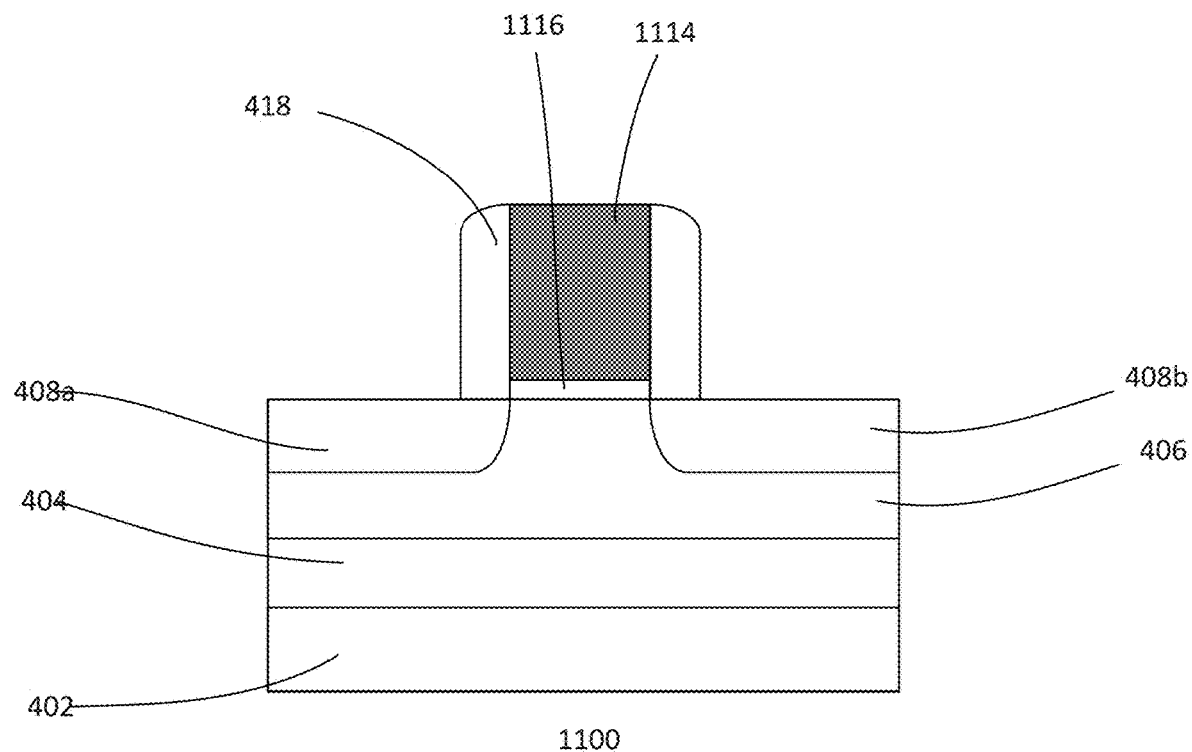

In one embodiment, the process continues to form regions of first polarity type 408a in the substrate adjacent to first and second sides of the dummy gate as shown in FIG. 11c. The regions 408a includes lightly doped first polarity type dopants. An implant mask which exposes the device region may be provided to perform the implant. Dopant concentrations of the regions of first polarity type 408a adjacent to the first and second sides of the dummy gate are the same as that described in FIG. 5d.

Referring to FIG. 11c, sidewall spacers 418 are formed over the first and second sidewalls of the dummy gate. The materials and technique for forming the spacers 418 are the same as that described in FIG. 5c. The process continues to form heavily doped region of the first polarity type 408b in the substrate adjacent to the second side of the gate as shown in FIG. 11c. An implant mask which exposes the region adjacent to the second side of the gate may be provided to perform the implant. An ion implantation process is performed to introduce first polarity type dopants. The dopant concentration of the heavily doped region of the first polarity type 408b adjacent to the second side of the dummy gate is about $10^{18}$ cm$^{-3}$ to $10^{20}$ cm$^{-3}$. Other suitable dopant concentrations may also be useful.

Figure 11D:
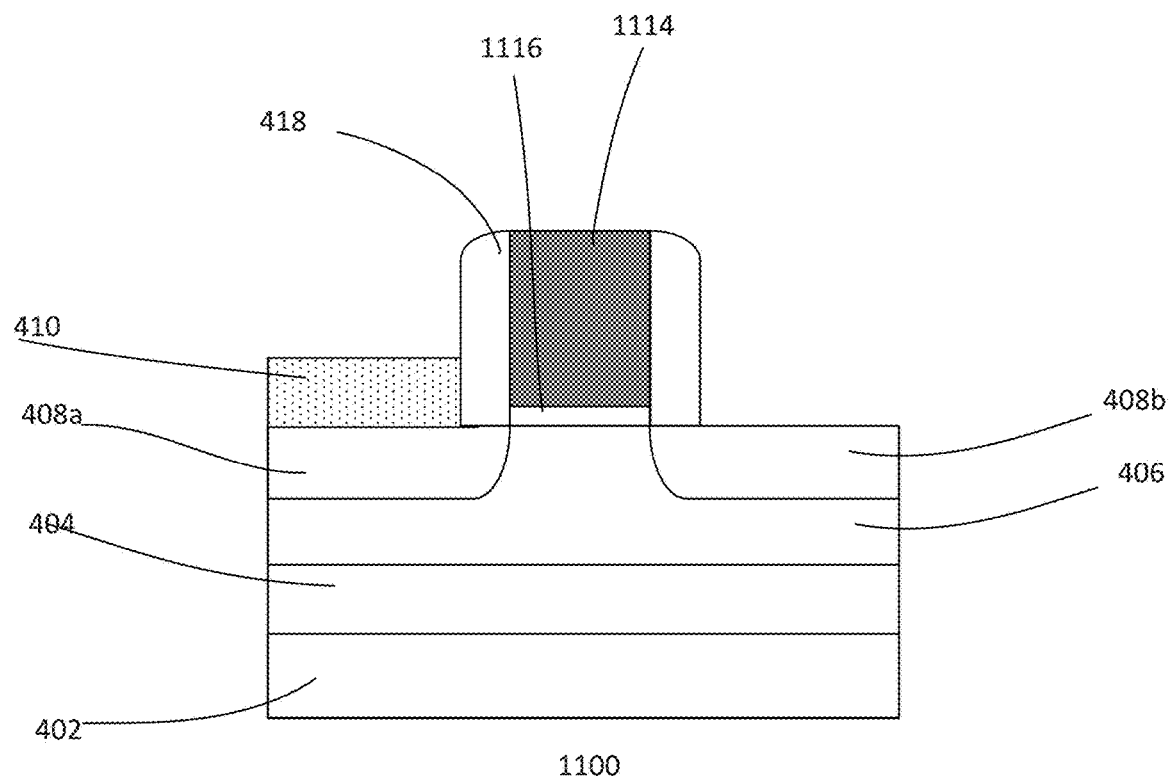

In FIG. 11d, the process continues to form a self-aligned elevated heavily doped second polarity type layer 410 on the region of the first polarity type 408a adjacent to the first side of the gate. The material and technique for forming the elevated heavily doped second polarity type layer 410 are the same as that described in FIG. 5e.

Figure 11E:
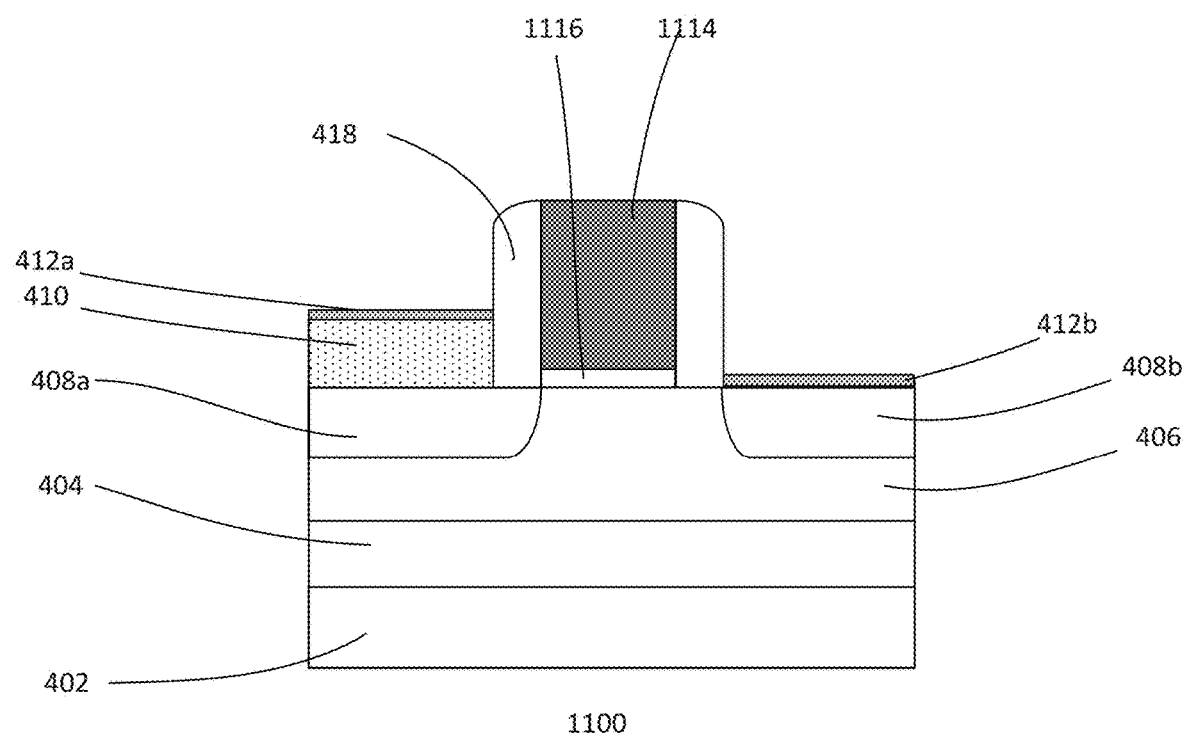

The process may continue to complete the T-RAM. Referring to FIG. 11e, silicide contacts 412a/412b may be formed on the heavily doped layer and region of the first and second polarity types 408b and 410. An ILD layer (not shown) may be formed over the substrate. The silicide contacts 412a/412b and ILD layer and the techniques for forming these layers are the same as that described in FIGS. 5f-5g. A substantially coplanar surface between the top surface of the dummy gate, sidewall spacers 418 and ILD layer is achieved.

In one embodiment, the process may continue to form additional dielectric layer to form a pre-metal dielectric (PMD) layer in which contacts are formed to contact regions of the substrate, followed by BEOL process. In an alternate embodiment, the process proceeds to remove the dummy gate. The dummy gate is removed using techniques as described in FIG. 5h. The removal of the dummy gate forms an opening (not shown) which exposes top surface of the body region of first polarity type 406 under the dummy gate as well as inner sides of the spacers 418 away from the ILD layer (not shown).

Figure 11F:
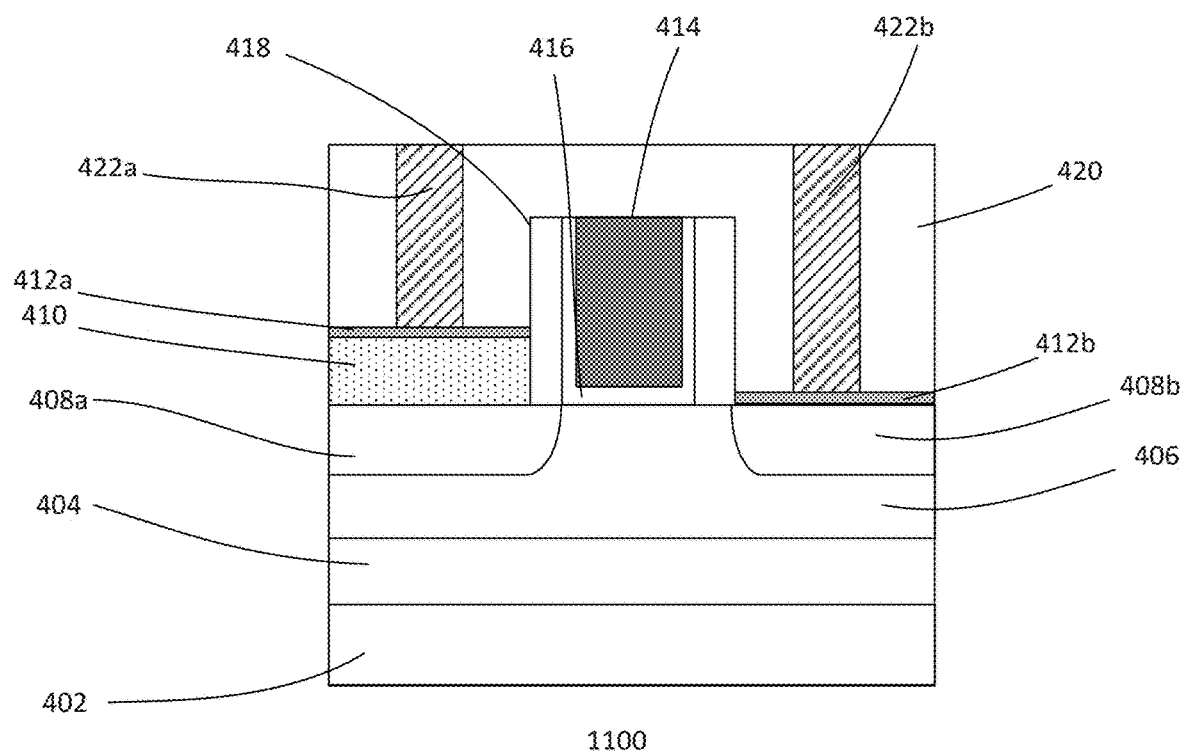

Referring to FIG. 11f, a high-k metal gate structure is formed. The high-k metal gate structure includes a gate dielectric 416 and a gate electrode 414. The materials and techniques for forming the high-k metal gate structure are the same as that described in FIG. 5i.

The process may continue to complete the memory cell. For example, the process continues to form PMD layer 420, contacts 422a/422b, etc., until a device shown in FIG. 11f is formed. The first contact 422a is configured to be coupled to a bit line of the device while the second contact 422b is configured to be coupled to a first word line of the device and the gate is configured to function as a second word line of the device. Additional processes may be performed, including forming one or more interconnect levels, final passivation, dicing, assembly and packaging. Techniques and materials of these features are the same as that already described in FIG. 5j. As such, details of these steps will not be described.

The embodiment as described in FIGS. 11a-11f above results in similar advantages as that described in FIGS. 5a-5j. Further, in the case that the substrate 402 includes a region of amorphous silicon instead of a well of the first polarity type, the region of amorphous silicon replaces the need for a buried oxide layer in the substrate 402. This helps achieve floating body second polarity type base, such as p-type base, and eliminates high cost associated with producing silicon-on-insulator. Additionally, self-aligned heavily doped second polarity layer removes the need for silicide block layer.

Figure 12A:
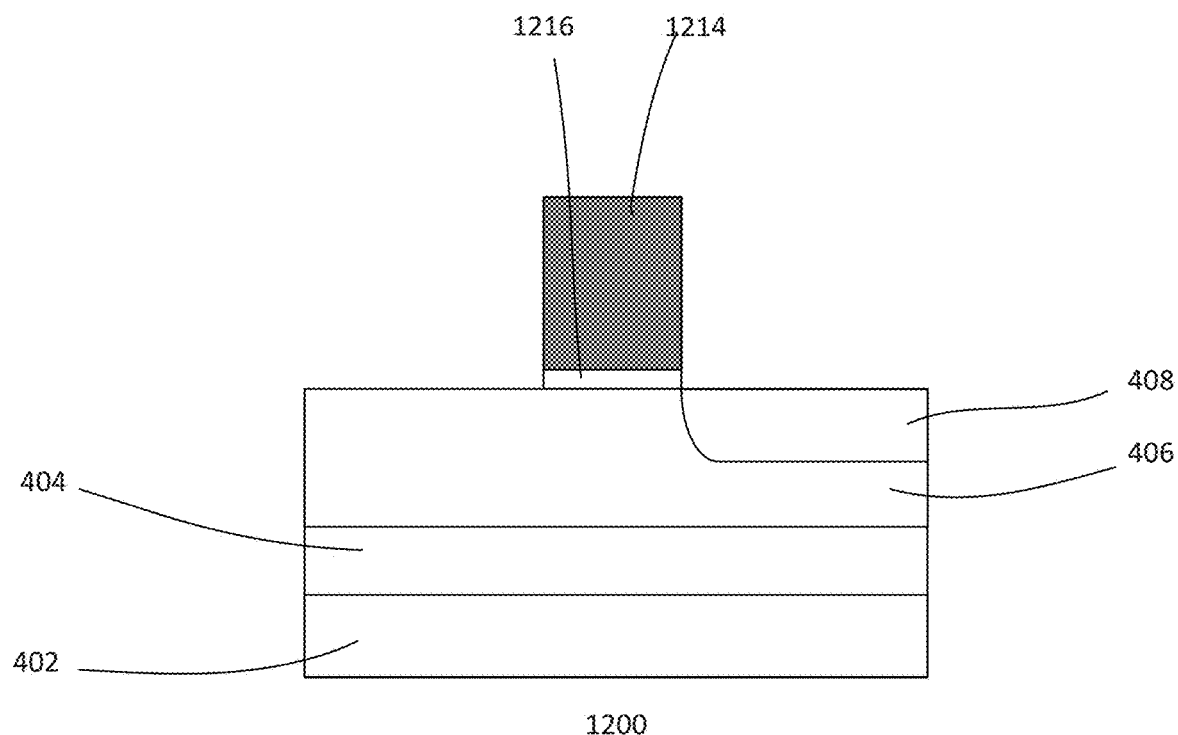
FIGS. 12a-12c show cross-sectional views of an embodiment of a process for forming a device in accordance with yet another embodiment of the present disclosure.
Figure 12B:
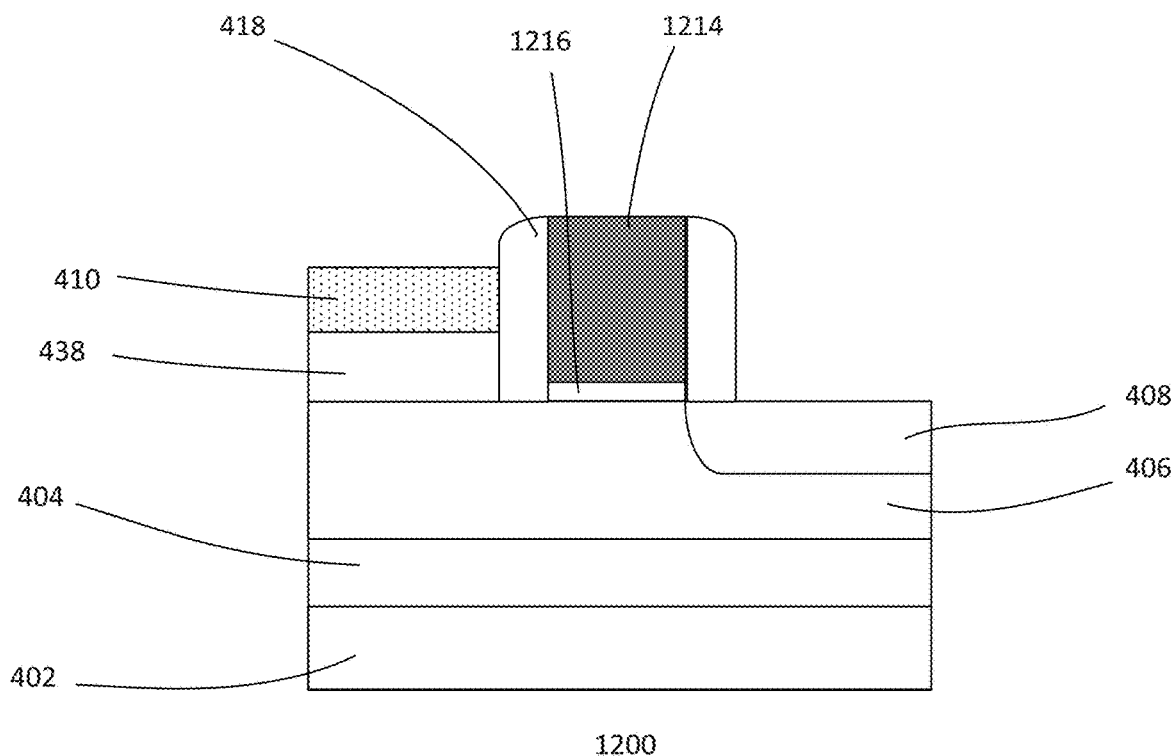
Figure 12C:
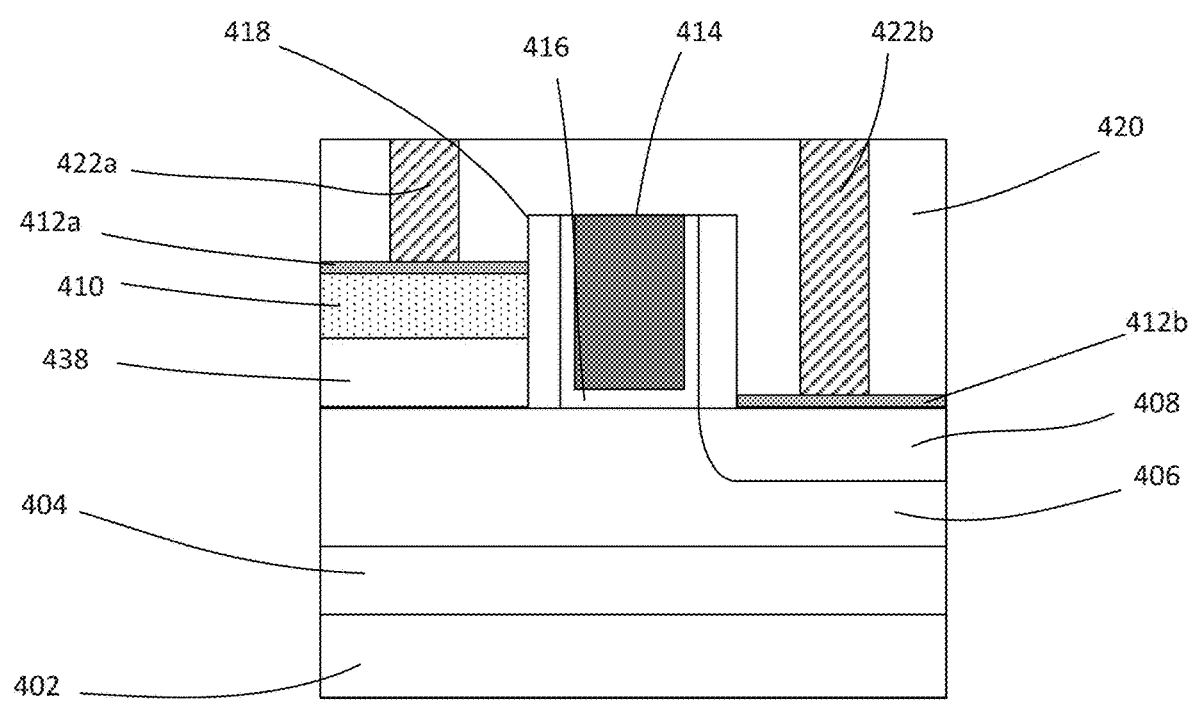

FIGS. 12a-12c show cross-sectional views of an embodiment of a process 1200 for forming a device in accordance with yet another embodiment of the present disclosure. In one embodiment, the process 1200 forms the device 430 of FIG. 4b. As the process of forming the memory device 430 is similar to that of forming the device 400, in the interest of brevity, the description below focuses on the differences between process 1200 and process 1100.

As shown in FIG. 12a, a partially processed substrate similar to that described in FIG. 11a is provided. For example, the partially processed substrate is processed up to the body region 406 having second polarity type dopants. In one embodiment, the body region 406 is part of the substrate 402 and includes lightly doped second polarity type dopants. Alternatively, the body region 406 includes BE region.

The process continues to form a gate or dummy gate having a dummy gate dielectric 1216 and dummy gate electrode 1214 as shown in FIG. 12a. The materials and techniques for forming the dummy gate are the same as that described in FIG. 5b.

In one embodiment, the process continues to form heavily doped region of the first polarity type 408 adjacent to the second side of the gate as shown in FIG. 12a. An implant mask which exposes the region adjacent to the second side of the gate may be provided to perform the implant. The dopant concentration of the heavily doped region of the first polarity type 408 and the technique for forming thereof are the same as the heavily doped region of the first polarity type 408b described in FIG. 11c.

Referring to FIG. 12b, sidewall spacers 418 are formed over the first and second sidewalls of the dummy gate. The materials and technique for forming the spacers 418 are the same as that described in FIG. 5c.

As shown in FIG. 12b, in lieu of the region of the first polarity type 408a formed in the body region 406 as in the device 400, the process 1200 forms an elevated layer of the first polarity type 438 over the body region 406 of the second polarity type adjacent to the first side of the gate. The material and technique for forming the elevated layer of the first polarity type 438 is the same as the elevated layer of the first polarity type 108a described in FIG. 5d. The process 1200 also forms an elevated heavily doped layer of the second polarity type 410 on the layer of the first polarity type 438 adjacent to the first side of the gate using technique as described in FIG. 5e.

The process may continue to complete the T-RAM. Referring to FIG. 12c, silicide contacts 412a/412b may be formed on the heavily doped layer and region of the first and second polarity types 408 and 410. An ILD layer (not shown) may be formed over the substrate. The silicide contacts 412a/412b and ILD layer and the techniques for forming these layers are the same as that described in FIGS. 5f-5g. A substantially coplanar surface between the top surface of the dummy gate, sidewall spacers 418 and ILD layer is achieved.

In one embodiment, the process may continue to form additional dielectric layer to form a pre-metal dielectric (PMD) layer in which contacts are formed to contact regions of the substrate, followed by BEOL process. In an alternate embodiment, the process proceeds to remove the dummy gate. The dummy gate is removed using techniques as described in FIG. 5h. The removal of the dummy gate forms an opening (not shown) which exposes top surface of the body region 406 under the dummy gate as well as inner sides of the spacers 418 away from the ILD layer (not shown).

Referring to FIG. 12c, a high-k metal gate structure is formed. The high-k metal gate structure includes a gate dielectric 416 and a gate electrode 414. The materials and techniques for forming the high-k metal gate structure are the same as that described in FIG. 5i.

The process may continue to complete the memory cell. For example, the process continues to form PMD layer 420, contacts 422a/422b, etc., until a device shown in FIG. 12c is formed. The first contact 422a is configured to be coupled to a bit line of the device while the second contact 422b is configured to be coupled to a first word line of the device and the gate is configured to function as a second word line of the device. Additional processes may be performed, including forming one or more interconnect levels, final passivation, dicing, assembly and packaging. Techniques and materials of these features are the same as that already described in FIG. 5j. As such, details of these steps will not be described.

FIGS. 13a-13e show cross-sectional views of an embodiment of a process 1300 for forming a device in accordance with yet another embodiment of the present disclosure. In one embodiment, the process 1300 forms the device 450 of FIG. 4c. As the process of forming the device 450 is similar to that of forming the device 400, in the interest of brevity, the description below focuses on the differences between process 1300 and process 1100.

Figure 13A:
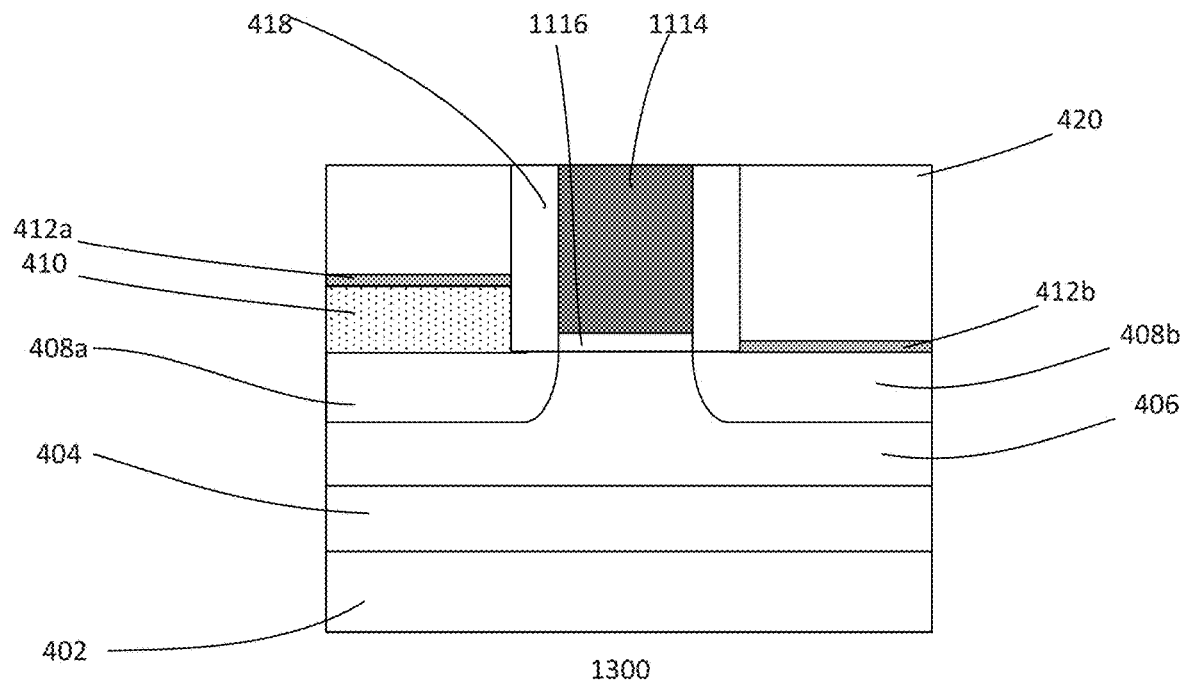
FIGS. 13a-13e show cross-sectional views of an embodiment of a process for forming a device in accordance with yet another embodiment of the present disclosure.

As shown in FIG. 13a, a partially processed substrate similar to that described in FIG. 11e is provided. For example, the partially processed substrate is processed up to forming an ILD layer 420 covering the dummy gate and silicide contacts 412a/412b and is processed such that a substantially coplanar surface between the top surface of the dummy gate, sidewall spacers 418 and ILD layer is achieved.

Figure 13B:
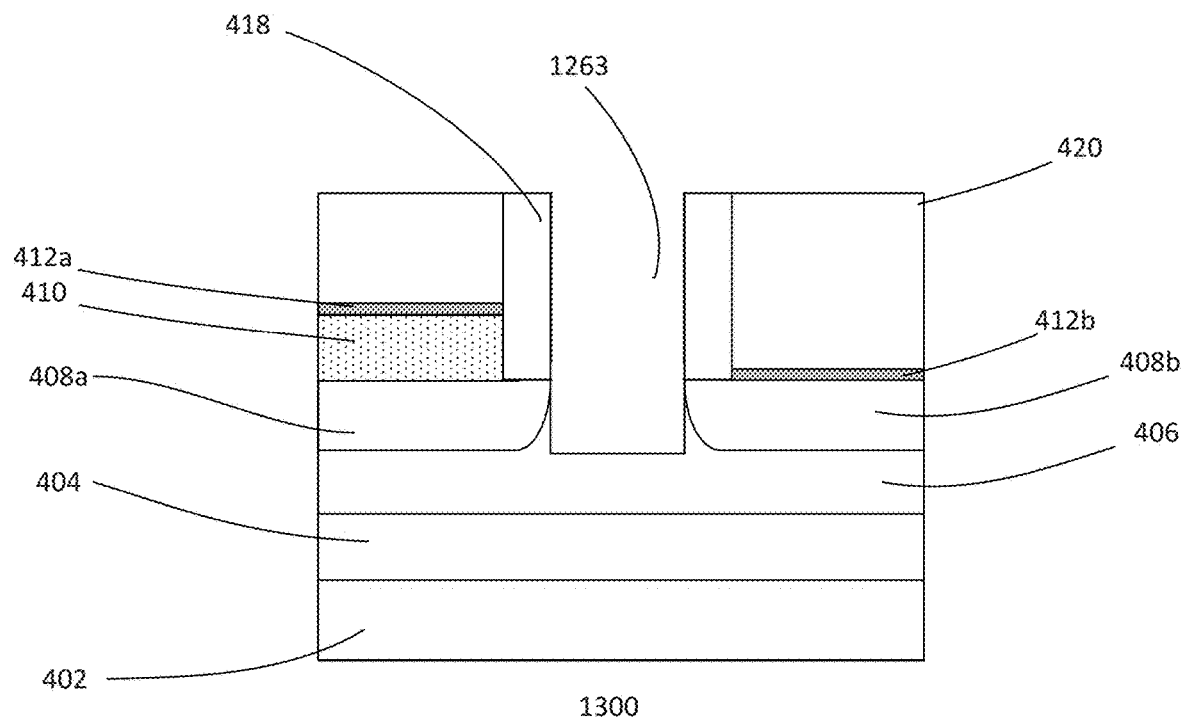

Referring to FIG. 13b, the dummy gate is removed using techniques as described in FIG. 5h. Other suitable techniques may also be employed to remove the dummy gate. The removal of the dummy gate exposes a portion of top surface of the body region of the second polarity type 406 under the dummy gate. The process continues to form a trench or recessed channel 1263 within a portion of the body region 406 in between the region of first polarity type 408a and the heavily doped region of first polarity type 408b. A mask and etch process is employed to remove portions of the body region 406 to form the trench 1263. For example, the trench is formed by RIE. The sides of the trench, for example, are self-aligned to the inner sides of the spacers 418. As shown, the depth of the trench is about equal to the depth of the regions of first polarity type 408a/408b. Providing other depths or configurations may also be useful.

Figure 13C:
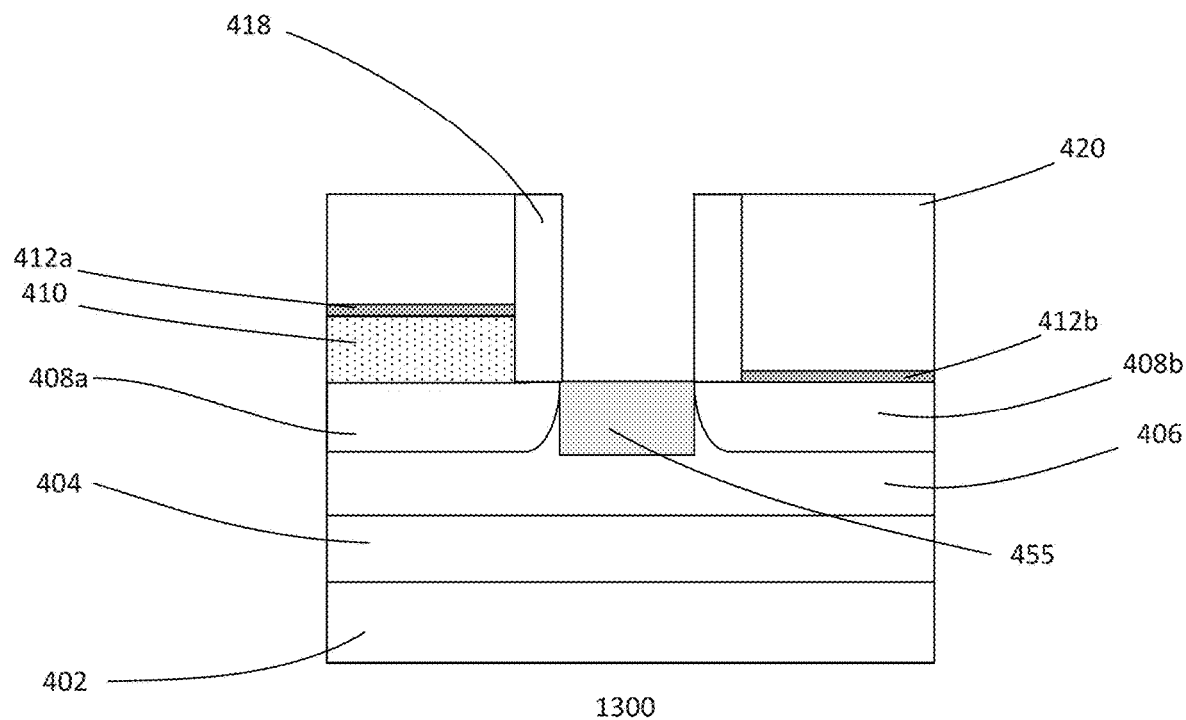

Referring to FIG. 13c, a band engineered (BE) portion 455 is formed within the trench 1263. The BE portion is formed by, for example, selective epitaxial growth (SEG) process, filling the spaces within the recessed channel. As shown, the top of the BE portion is about coplanar with the top of the substrate surface. For example, the top of BE portion is also substantially coplanar with the top surface of the regions of first polarity type 408a/408b. Forming the BE portion which is slightly recessed or over the substrate surface or the top surface of the regions of first polarity type may also be useful. The BE portion, in one embodiment, is a silicon germanium (SiGe) BE portion. Other suitable types of BE portion may also be useful.

Figure 13D:
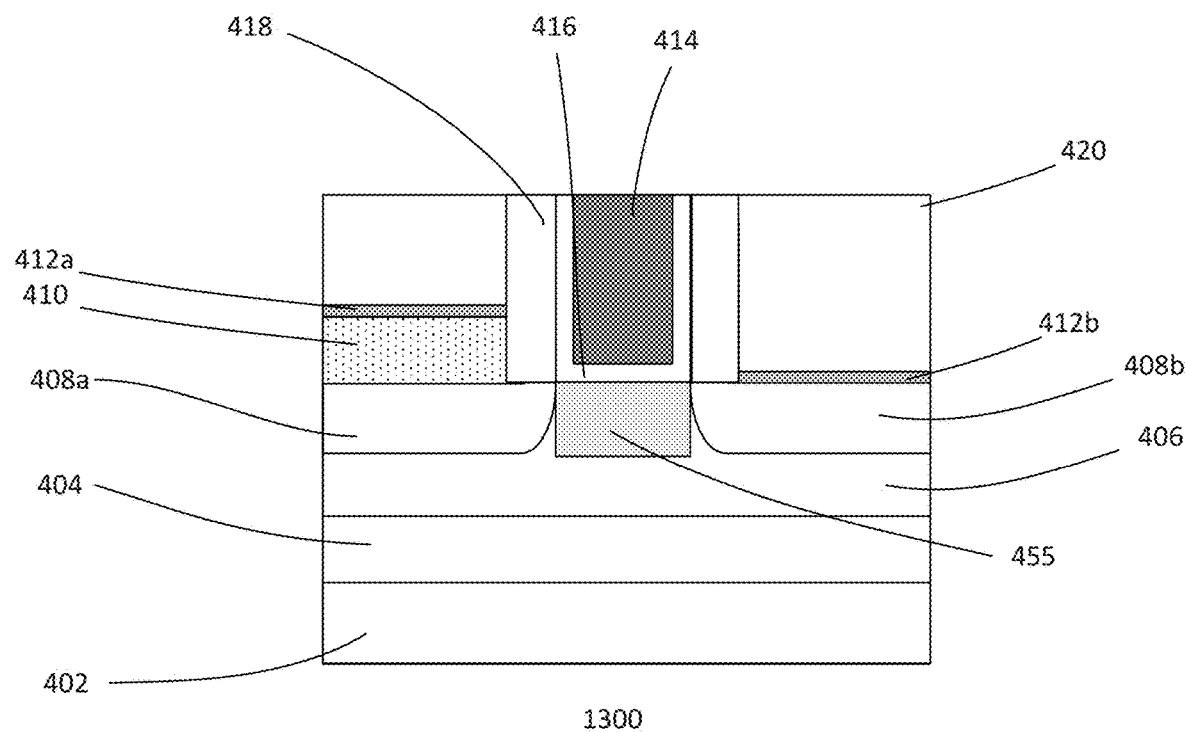
Figure 13E:
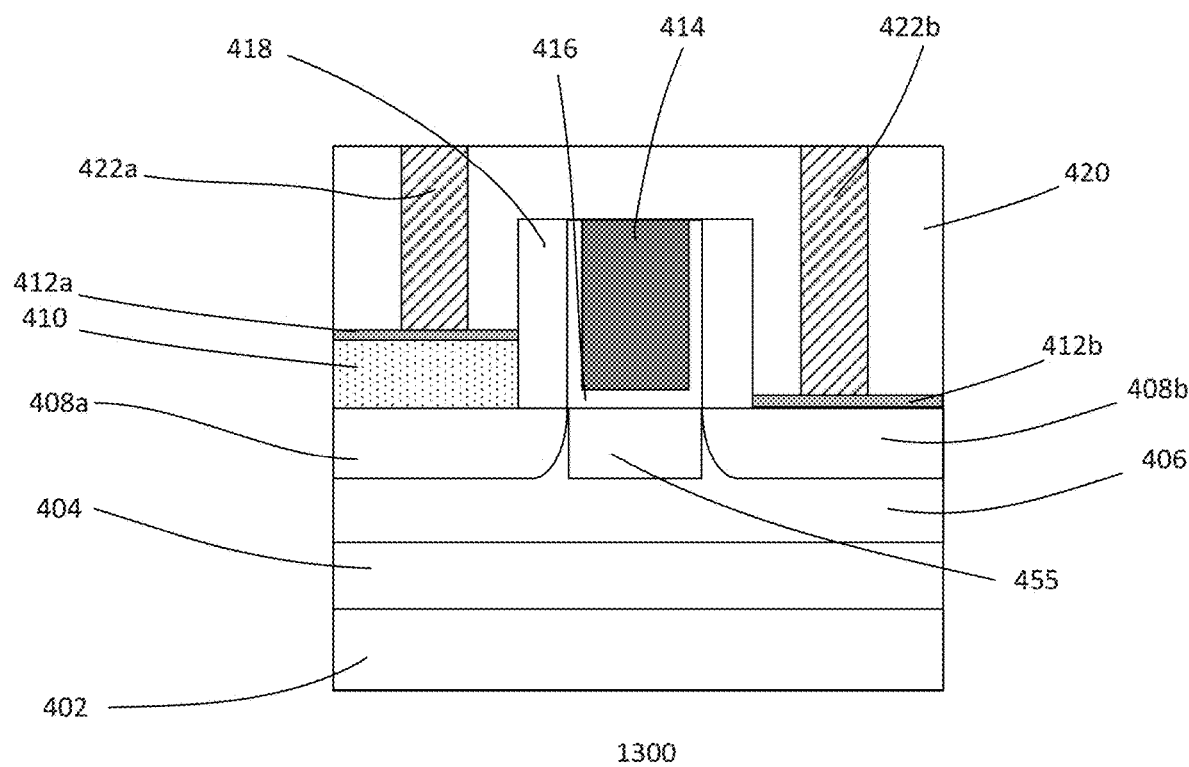

Referring to FIG. 13d, the process continues to form a high-k metal gate structure. The materials and techniques for forming the high-k metal gate structure is the same as that described in FIG. 5i. The process may continue to complete the memory cell. For example, the process continues to form PMD layer, contacts 422a/422b, etc., until a device shown in FIG. 13e is formed. Additional processes may be performed, including forming one or more interconnect levels, final passivation, dicing, assembly and packaging. Techniques and materials of these features are the same as that already described in FIG. 5j. As such, details of these steps will not be described.

Figure 14A:
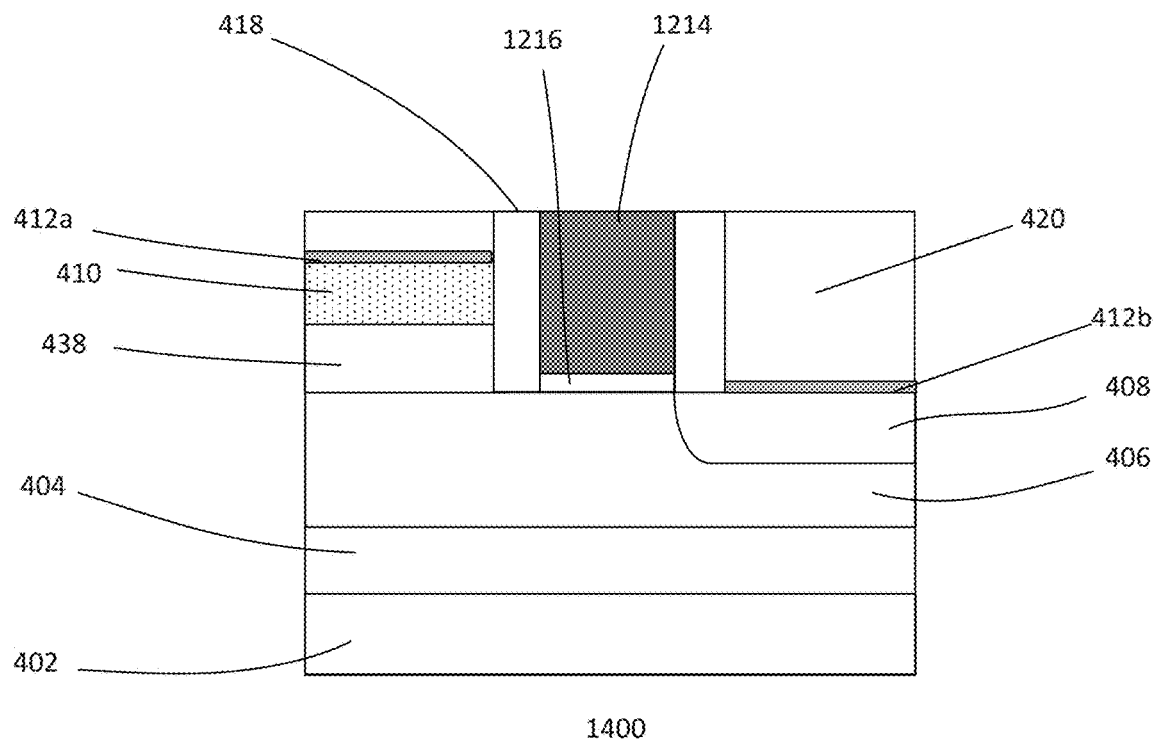
FIGS. 14a-14b show cross-sectional views of an embodiment of a process for forming a device in accordance with yet another embodiment of the present disclosure.
Figure 14B:
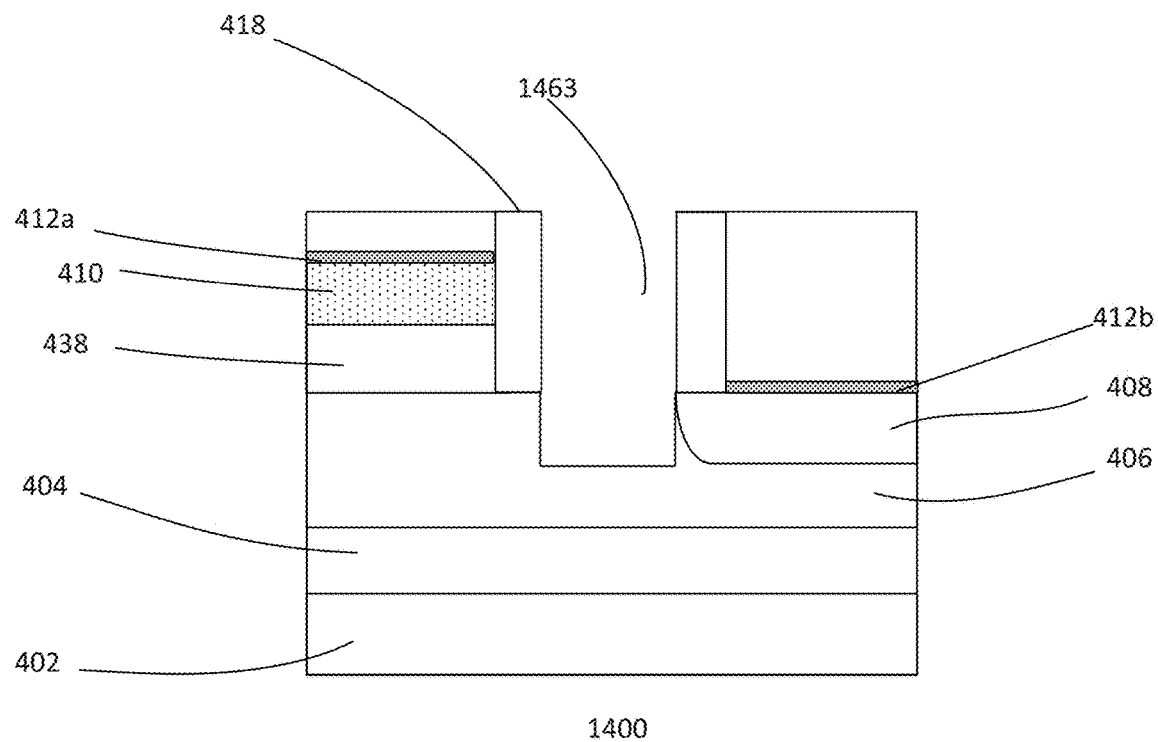

FIGS. 14a-14b show cross-sectional views of an embodiment of a process 1400 for forming a device in accordance with yet another embodiment of the present disclosure. In one embodiment, the process 1400 forms the device 470 of FIG. 4d. As the process of forming the device 470 is similar to that of forming the device 430, in the interest of brevity, the description below focuses on the differences between process 1400 and process 1200.

As shown in FIG. 14a, a partially processed substrate similar to that described in FIG. 12b is provided. For example, the partially processed substrate is processed up to forming an ILD layer 420 covering the dummy gate and silicide contacts 412a/412b and is processed such that a substantially coplanar surface between the top surface of the dummy gate, sidewall spacers 418 and ILD layer is achieved.

Referring to FIG. 14b, the dummy gate structure is removed using techniques as described in FIG. 5h. Other suitable techniques may also be employed to remove the dummy gate. The removal of the dummy gate exposes a portion of top surface of the body region of the second polarity type 406 under the dummy gate. The process continues to form a trench or recessed channel 1463 within a portion of the body region 406 adjacent to the heavily doped region of first polarity type 408 and below the dummy gate. A mask and etch process is employed to remove portions of the body region 406 to form the trench 1463. For example, the trench is formed by RIE. The sides of the trench, for example, are self-aligned to the inner sides of the spacers 418. As shown, the depth of the trench is about equal to the depth of the heavily doped region of first polarity type 408. Providing other depths or configurations may also be useful.

The process continues to form BE portion 455 within the trench 1463, a high-k metal gate structure and proceed to complete the memory cell. For example, the process steps include those described from FIG. 13c and onwards and continue until the device 470 shown in FIG. 4d is formed. Additional processes may be performed, including forming one or more interconnect levels, final passivation, dicing, assembly and packaging. Techniques and materials of these features are the same as that already described in FIG. 5j. As such, details of these steps will not be described.

The present disclosure may be embodied in other specific forms without departing from the spirit or essential characteristics thereof. The foregoing embodiments, therefore, are to be considered in all respects illustrative rather than limiting the present disclosure described herein. Scope of the present disclosure is thus indicated by the appended claims, rather than by the foregoing description, and all changes that come within the meaning and range of equivalency of the claims are intended to be embraced therein.

What is claimed is:

1. A method of forming a thyristor-based memory cell, the method comprising:
    forming a first fin structure and a second fin structure on a substrate;
    forming an isolation region in a gap between the first fin structure and the second fin structure;
    forming a well of a first polarity type in the substrate below the isolation region;
    after forming the isolation region, forming a first region of a second polarity type in the first fin structure and a second region of the second polarity type in the second fin structure;
    forming a first gate including a first gate dielectric and a first gate electrode layer in the gap over the isolation region;
    after forming the first gate, forming a first dielectric sidewall spacer on a first sidewall of the first gate and a second dielectric sidewall spacer on a second sidewall of the first gate;
    forming a first elevated layer of the first polarity type over the first region and adjacent to the first dielectric sidewall spacer and the first sidewall of the first gate;
    forming a second elevated layer of the first polarity type over the second region and adjacent to the second dielectric sidewall spacer and the second sidewall of the first gate;
    forming a third elevated layer of the second polarity type on the first elevated layer and adjacent to the first dielectric sidewall spacer and the first sidewall of the first gate; and
    forming a fourth elevated layer of the second polarity type on the second elevated layer and adjacent to the second dielectric sidewall spacer and the second sidewall of the first gate;
    wherein the well, the first region, the first elevated layer, and the third elevated layer form a first thyristor of the thyristor-based memory cell, and the well, the second region, the second elevated layer, and the fourth elevated layer form a second thyristor of the thyristor-based memory cell.

2. The method of claim 1 wherein the first region and the second region are concurrently formed by implanting dopants of the second polarity type into the substrate in the well.

3. The method of claim 1 wherein the first elevated layer and the second elevated layer are concurrently formed by selective epitaxial growth respectively over the first region and the second region.

4. The method of claim 3 wherein the third elevated layer and the fourth elevated layer are concurrently formed by selective epitaxial growth respectively over the first elevated layer and the second elevated layer.

5. The method of claim 1 wherein the third elevated layer and the fourth elevated layer are concurrently formed by selective epitaxial growth respectively over the first elevated layer and the second elevated layer.

6. The method of claim 1 further comprising:
    after the third elevated layer and the fourth elevated layer are formed, removing the first gate to form an opening between the first dielectric sidewall spacer and the second dielectric sidewall spacer; and
    forming a second gate in the opening.

7. The method of claim 6 wherein the second gate includes a second gate dielectric containing a high-k dielectric material and a second gate electrode containing a metal or a metal nitride.

8. The method of claim 1 wherein the first gate is formed after the first region and the second region are formed.

9. The method of claim 1 wherein the first gate is formed before the first elevated layer and the second elevated layer are formed.

10. The method of claim 9 wherein the first gate is formed after the first region and the second region are formed.

11. The method of claim 1 wherein the first gate is formed before the third elevated layer and the fourth elevated layer are formed.

* * * * *